(12) United States Patent
Takemura et al.

(10) Patent No.: US 8,116,128 B2
(45) Date of Patent: Feb. 14, 2012

(54) SEMICONDUCTOR DEVICE

(75) Inventors: Riichiro Takemura, Tokyo (JP); Kenzo Kurotsuchi, Kokubunji (JP); Takayuki Kawahara, Higashiyamato (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/774,476

(22) Filed: May 5, 2010

(65) Prior Publication Data

US 2010/0214833 A1    Aug. 26, 2010

Related U.S. Application Data

(63) Continuation of application No. 11/596,705, filed as application No. PCT/JP2005/009171 on May 19, 2005, now Pat. No. 7,742,330.

(30) Foreign Application Priority Data

May 25, 2004  (JP) ................................. 2004-154752

(51) Int. Cl.
*G11C 11/00*  (2006.01)
(52) U.S. Cl. ........ 365/163; 365/100; 365/148; 365/158; 365/185.23; 365/230.06
(58) Field of Classification Search .................. 365/46, 365/94, 100, 113, 129, 148, 163, 48, 66, 365/78, 80–93, 130, 131, 158, 171, 173, 365/225.5, 243.5, 185.23, 230.06; 257/2–5, 257/296, E31.047, E27.006, E21.35; 438/29, 438/95, 96, 166, 259, 365, 482, 486, 597; 977/933–935, 754
See application file for complete search history.

(56) References Cited

U.S. PATENT DOCUMENTS

| | | | |
|---|---|---|---|
| 6,815,705 | B2 | 11/2004 | Klersy et al. |
| 7,208,751 | B2 | 4/2007 | Ooishi |
| 2001/0044923 | A1 | 11/2001 | Kobayashi et al. |
| 2003/0095426 | A1 | 5/2003 | Hush et al. |
| 2003/0223283 | A1 | 12/2003 | Kunikiyo et al. |
| 2004/0027851 | A1 | 2/2004 | Lai |
| 2004/0037179 | A1 | 2/2004 | Lee |

(Continued)

FOREIGN PATENT DOCUMENTS

| | | |
|---|---|---|
| JP | 2002-540605 A | 11/2002 |
| JP | 2003-16776 A | 1/2003 |
| JP | 2003-297069 | 10/2003 |
| JP | 2004-100867 A | 4/2004 |

(Continued)

OTHER PUBLICATIONS

"Ovonic Unified Memory—A High-Performance Nonvolatile Memory Technology for Stand-Alone Memory and Embedded Applications" by Gill, et al. 2002 IEEE.

*Primary Examiner* — Richard Elms
*Assistant Examiner* — Harry W Byrne
(74) *Attorney, Agent, or Firm* — Mattingly & Malur, PC

(57) ABSTRACT

For example, one memory cell is configured using two memory cell transistors and one phase change element by disposing a plurality of diffusion layers in parallel to a bit-line, disposing gates between the diffusion layers so as to cross the bit-line, disposing bit-line contacts and source contacts alternately to the plurality of diffusion layers arranged in a bit-line direction for each diffusion layer, and providing a phase change element on the source contact. Also, the phase change element can be provided on the bit-line contact instead of the source contact. By this means, for example, increase in drivability of the memory cell transistors and reduction in area can be realized.

6 Claims, 43 Drawing Sheets

U.S. PATENT DOCUMENTS

| | | |
|---|---|---|
| 2004/0062074 A1 | 4/2004 | Ooishi et al. |
| 2004/0085809 A1 | 5/2004 | Fukuzumi |
| 2004/0100814 A1* | 5/2004 | Hsu ............................. 365/148 |
| 2005/0111247 A1* | 5/2005 | Takaura et al. ................. 365/2 |
| 2005/0270832 A1* | 12/2005 | Chu et al. ...................... 365/163 |
| 2007/0158634 A1 | 7/2007 | Ooishi |

FOREIGN PATENT DOCUMENTS

| | | |
|---|---|---|
| JP | 2004/127347 | 4/2004 |
| JP | 2005-071500 | 3/2005 |
| JP | 2005-510005 | 4/2005 |
| WO | 00/57498 A1 | 9/2000 |
| WO | 03/044802 A2 | 5/2003 |

* cited by examiner

SEMICONDUCTOR DEVICE

This is a continuation application of U.S. Application Ser. No. 11/596,705, filed Oct. 29, 2007, which is a U.S. National Phase application of PCT/JP2005/009171, filed May 19, 2005, which claims priority from JP 2004-154752, filed May 25, 2004, the contents of which are hereby incorporated by reference into this application.

TECHNICAL FIELD

The present invention relates to a semiconductor device. More particularly, it relates to a technology effectively applied to a semiconductor device having a high density integrated memory circuit, a logic embedded memory including a memory circuit and a logic circuit provided on the same semiconductor substrate, or an analog circuit which is formed of a phase change material.

BACKGROUND ART

In recent years, development of a memory (a phase change memory) using a resistance element made of a phase change material has been advanced for obtaining a fast and highly integrated non-volatile memory, and such a memory is described in, for example, Non-Patent Document 1. As shown in FIG. 58, the phase change memory is a non-volatile memory in which a difference in resistance value between an amorphous state (reset) of a phase change material and a polycrystalline state (set) thereof is stored as data. When the amorphous state (reset) or the polycrystalline state (set) is to be stored, an electric pulse is used to cause a temperature change with respect to time as shown in FIG. 57, thereby generating the phase transition between the amorphous state (reset) and the polycrystalline state (set).

Note that a high resistance value of the amorphous state and a low resistance value of the polycrystalline state of a phase change material do not require a complete amorphous state and a complete polycrystalline state, and it is important as a storage element that there is a sufficient difference between a high resistance state and a low resistance state. Accordingly, it is possible to take an arbitrary intermediate value between a high resistance state corresponding to the complete amorphous state and a low resistance state corresponding to the complete polycrystalline state.

As described above, a phase change element changes its phase state according to an electric pulse. As shown in FIG. 57, it is necessary for performing a reset operation to supply large current flow in a short period of time to perform rapid cooling. On the contrary, it is necessary for performing a set operation to supply the flow of a current less than that in the reset operation for a relatively long time to perform cooling.

In addition, in the read operation, '0' state and '1' state of a phase change memory corresponding to the reset and the set, respectively, are read by sensing a rate of a voltage drop of a bit-line by using a reading voltage.

Non-Patent Document 1: 2002 IEEE International Solid-State Circuits Conference Digest of Technical Papers, pp. 202-203

DISCLOSURE OF THE INVENTION

Problem to be Solved by the Invention

Incidentally, from the examination result about the technology for a phase change memory such as described above by the inventors of the present invention, the following matters have been found.

It is necessary to generate a predetermined heat quantity in order to cause phase change of a phase change element from a polycrystalline state to an amorphous state. As shown in FIG. 57, Joule heat generated when a predetermined amount of current is caused to flow for a predetermined time is utilized in order to electrically cause the phase change. Considering a stable memory operation, it is necessary to arrange selection switches in series with the phase change element. Also, it is important to reduce of a memory size in order to realize a large capacity.

However, there is a possibility that a drivability of the selection switch is lowered and a current for obtaining sufficient heat quantity cannot be obtained due to the reduction of the memory size. Therefore, when the memory cell size is increased, the following problem occurs in a memory cell structure in the conventional art such as shown in FIG. 59.

FIG. 59 is a sectional view of one example of a memory cell structure of a phase change memory in a semiconductor device of the conventional art examined as a background of the present invention. In FIG. 59, two memory cell transistors (selection switches) are formed in a portion sandwiched between two isolation regions STI on a p type well PWEL. One diffusion layer L in the two memory cell transistors is shared and connected to a bit-line BL via a bit-line contact BC. Further, the other diffusion layers L of the two memory cell transistors are connected to the ends of individual phase change elements PCR via respective source contacts SC, and the other ends of the phase change elements PCR are connected to a source wiring layer SL. In such a layout, one memory cell is composed of one memory cell transistor and one phase change element PCR.

In such a memory cell structure of the conventional art, however, when a width (a depth direction of FIG. 59) of a gate G of a memory cell transistor is expanded in order to obtain sufficient heat quantity, the isolation region STI disposed in parallel to the gate G (word line) is also expanded in a width direction of the gate G. Accordingly, an area of the memory cell is largely expanded.

In general, there is a concern about stability at a reading/writing operation time in the phase change memory. That is, when rewriting from a reset state (an amorphous state) with high resistance to a set state (a polycrystalline state) with low resistance is performed using an electric pulse, a small amount of current flows in a rewriting initial stage due to the high resistance but a low resistance state occurs after phase change and an amount of current increases rapidly. Accordingly, there is a fear that the phase change element is changed to a high resistance state due to heat generation caused by increased current again. Further, when integration density is increased in a phase change memory, a distance between memory cells is reduced, and due to heat generation in a memory cell where a reset/set operation is performed, data destruction may occur in memory cells adjacent thereto.

The above and other objects and novel characteristics of the present invention will be apparent from the description of this specification and the accompanying drawings.

Means for Solving the Problem

The typical ones of the inventions disclosed in this application will be briefly described as follows.

A semiconductor device according to the present invention comprises a bit-line; a first transistor and a second transistor disposed in an extending direction of the bit-line; and a memory element which retains data based on electric resistance, wherein a first node of the first transistor, a first node of the second transistor and one end of the memory element are mutually connected, and a second node of the first transistor and a second node of the second transistor are independently connected to the bit-line, respectively. That is, in this structure, two memory cell transistors are connected in parallel between the memory element and the bit-line. Note that the memory element includes the one containing chalcogenide material or the like, for example.

The semiconductor device according to the present invention comprises: a bit-line; a first transistor and a second transistor which are disposed in an extending direction of the bit-line; a memory element which retains data utilizing electric resistance; and a source electrode, wherein a second node of the first transistor, a second node of the second transistor, and one end of the memory element are mutually connected, the other end of the memory element is connected to the bit-line, and a first node of the first transistor and a first node of the second transistor are independently connected to source electrodes, respectively. More specifically, in this structure, two memory cell transistors are connected in parallel between the memory element connected to the bit-line and the source electrode.

By using two memory cell transistors like the above structure, a drivability of the memory cell transistor can be increased.

By using such two memory cell transistors, it becomes possible to change a driving current at a write operation and a read operation to and from a memory element according to necessity. More specifically, for example, a driving current can be adjusted by using two memory cell transistors to perform a read operation and a write operation or by using either one of the memory cell transistors to perform a read operation or a write operation.

As one example of such an operation, for example, when one memory cell transistor is driven at the time of a read operation and a set write operation and two memory cell transistors are driven at the time of a reset write operation in a phase change memory, stability of a set write operation, prevention of data destruction at the time of read operation, and the like can be realized.

Also, a semiconductor device according to the present invention comprises: a bit-line; a plurality of memory elements which retain data based on a resistance value; a plurality of transistors disposed in a direction parallel to the bit-line and including first diffusion layers and second diffusion layers, respectively; first contacts connecting the first diffusion layers and the plurality of memory elements; second contacts connecting the second diffusion layers and the bit-line; a plurality of word lines connected to gates of the plurality of transistors; and a plurality of memory cells disposed at predetermined crossing points between the bit-line and the plurality of word lines, wherein the first contacts and the second contacts are alternately disposed in a direction parallel to the bit-line, and each of the plurality of memory cells has one memory element and two transistors.

More specifically, one memory cell has two word lines connected to two transistors, a first diffusion layer and a first contact which are positioned between the two word lines and to which a memory element is connected, and a second diffusion layer and a second contact which are positioned on both sides of the two word lines and to which the bit-line is connected. Further, the second diffusion layer and the second contact are shared by memory cells adjacent in a bit-line direction.

In such a structure, since an isolation region is not used between the transistors adjacent in the bit-line direction and between the memory cells, it is possible to reduce a circuit area in addition to the improvement of drivability of the memory cell transistor as described above.

Incidentally, the first contact can be sectioned to a third contact in contact with the first diffusion layer and a fourth contact connected to the third contact and in contact with the memory element. In this case, it is desirable that a contact area between the fourth contact and the memory element is made smaller than a contact area between the third contact and the first diffusion layer. By this means, it becomes possible to reduce a write current.

Also, a semiconductor device according to the present invention comprises: a first memory cell array including a first bit-line; a second memory cell array including a second bit-line and a third bit-line; a sense amplifier block disposed between the first memory cell array and the second memory cell array; and a read bit-line and a reference bit-line included in the sense amplifier block, wherein, in a read operation, the first bit-line and the read bit-line are connected to each other and the second bit-line and the third bit-line are mutually connected to the reference bit-line. By this means, a circuit for setting a potential level at the time of read operation can be simplified, and the circuit area can be reduced.

Effect of the Invention

The effects obtained by typical aspects of the present invention will be briefly described below. That is, high speed operation or high integration of a semiconductor device can be realized.

BRIEF DESCRIPTIONS OF THE DRAWINGS

BEST MODE FOR CARRYING OUT THE INVENTION

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Also, circuit elements configuring respective blocks in an embodiment are formed on one semiconductor substrate such as single crystal silicon by an integrated circuit technology for a known CMOS transistor (complementary MOS transistor) or the like. Also, a circuit symbol of a MOSFET (metal oxide semiconductor field effect transistor) including no arrow denotes an n type MOSFET (NMOS transistor), and a circuit symbol of a MOSFET including arrow denotes a p type MOSFET (PMOS transistor), so as to distinguish both the MOSFETs from each other. In this specification, the description will be made using the MOSFET, and any insulating film can be used for a gate oxide film of the MOSFET, and especially, a FET using a high dielectric constant insulating film can be used. These FETs are collectively called "MISFET (metal insulator semiconductor field effect transistor)". Hereinafter, the MOSFET is called "MOS transistor".

First Embodiment

Figure 1:
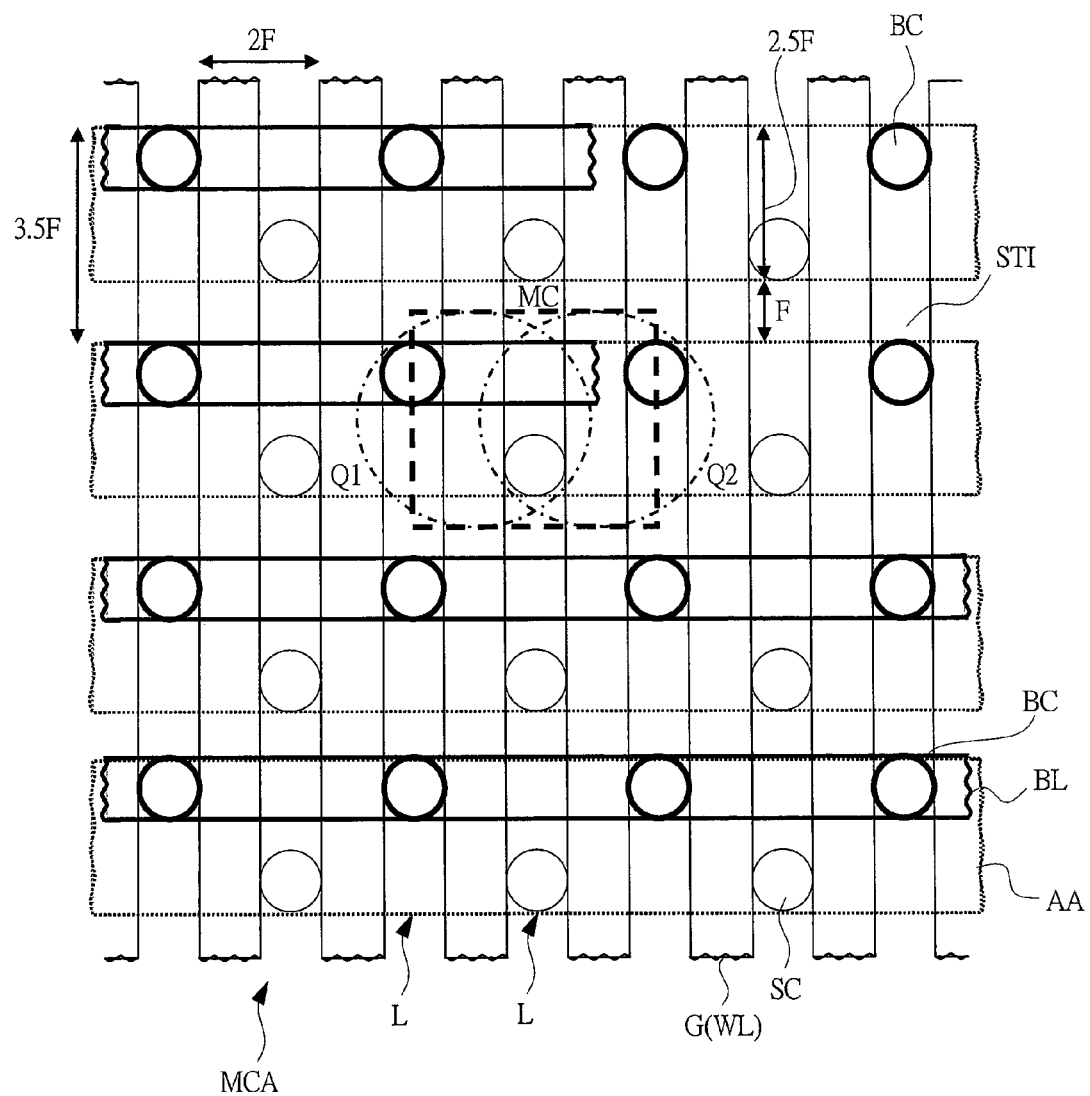
FIG. 1 is a layout diagram showing one example of a configuration of a memory cell array in a phase change memory in a semiconductor device according to a first embodiment of the present invention.

FIG. 1 is a layout diagram showing one example of a configuration of a memory cell array in a phase change memory in a semiconductor device according to a first embodiment of the present invention. The feature of a layout of a memory cell array MCA shown in FIG. 1 lies in that one memory cell MC is composed of two memory cell transistors Q1 and Q2 and one phase change element PCR (not shown).

The memory cell transistors Q1 and Q2 in the memory cell MC in FIG. 1 include gates G connected to word lines WL and share one diffusion layer L (first node) having a source contact SC, and the other diffusion layers L (second nodes) are connected to bit-lines BL via different bit-line contacts BC. The source contact SC is connected to one end of the phase change element PCR (not shown), and the other end of the phase change element PCR is connected to a source wiring layer (source electrode) SL (not shown). Also, the diffusion layer L connected to the bit-line BL is shared by memory cells MC adjacent on the same bit-line BL.

Incidentally, a region of the memory cell transistor including such a diffusion layer L, provided so as to correspond to each bit-line BL and extending in a direction parallel to the bit-line BL is called "active area (region) AA". An isolation region STI which is an insulating film is formed between the active regions AA adjacent in an extending direction of the word line WL.

Figure 60:
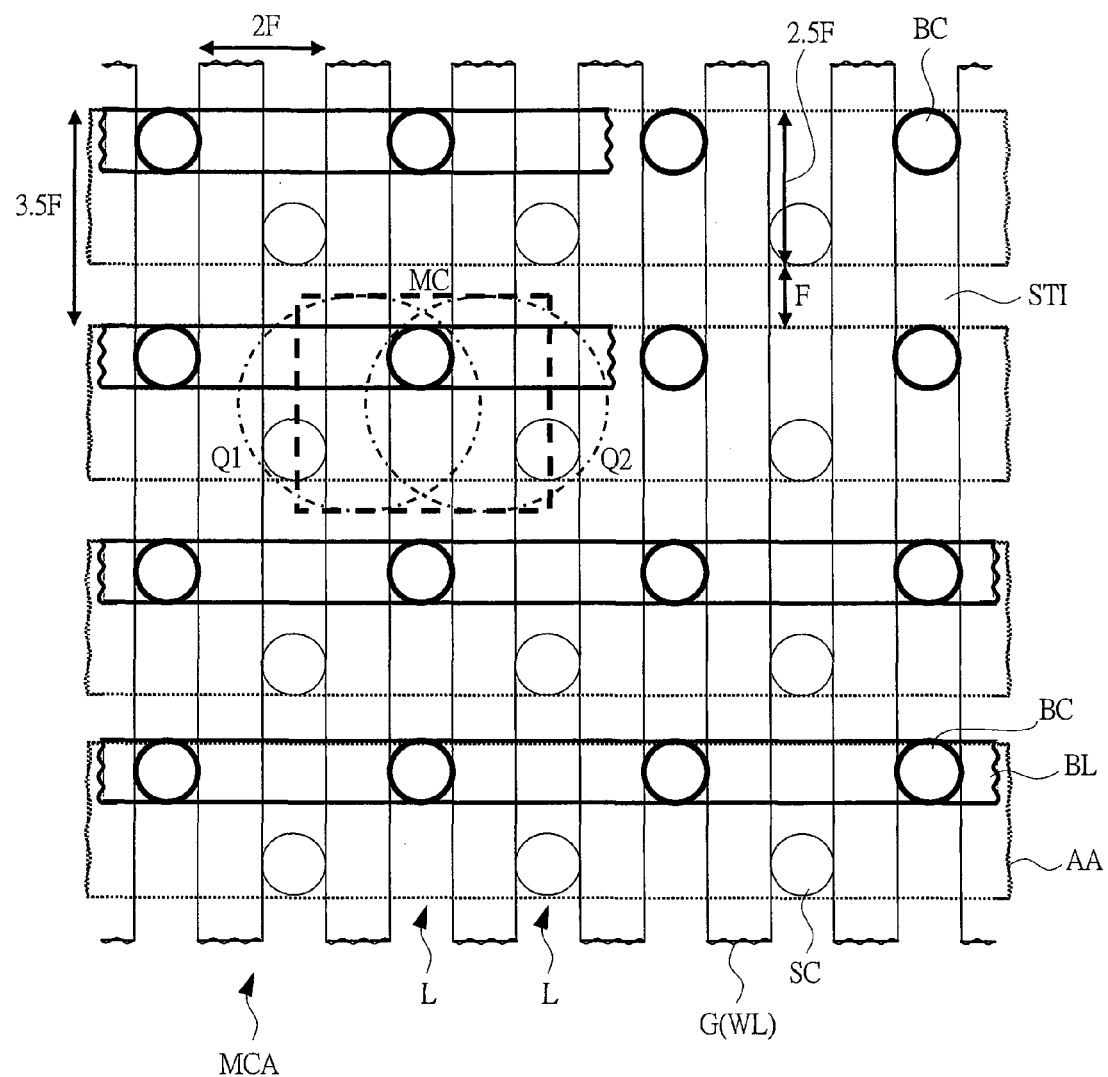
FIG. 60 is a layout diagram showing the same layout as that in FIG. 1 where the memory cell is seen from a different viewpoint.

Further, FIG. 60 is a layout diagram showing the same layout as that in FIG. 1 where the memory cell MC is seen from a different viewpoint. Different from FIG. 1, in the memory cell MC shown in FIG. 60, the phase change element PCR is connected to the bit-line contact BC side.

The memory cell transistors Q1 and Q2 in the memory cell MC shown in FIG. 60 include gates G connected to word lines WL and share one diffusion layer L (second node) having a bit-line contact BC, and the other diffusion layers L (first nodes) are connected to source wiring layers (source electrodes) SL (not shown) via different source contacts SC. One end of a phase change element PCR (not shown) is connected to the bit-line contact BC, and the bit-line BL is connected to the other end thereof. Further, the diffusion layer L connected to the source electrode SL is shared by the memory cells MC adjacent on the same bit-line BL.

As described above, there are two types of viewpoints for the same layout, where the viewpoint to the memory cell MC shown in FIG. 1 corresponds to a circuit diagram shown in FIG. 3 described later, and the viewpoint to the memory cell MC shown in FIG. 60 corresponds to a circuit diagram shown in FIG. 4 described later. However, since both the layout diagrams are the same, the layout diagram shown in FIG. 1 will be described below as it corresponds to both the viewpoints.

In FIG. 1, a width (=gate width) of the active region AA (diffusion layer L) is set to 2.5F, a width of the isolation region STI is set to F, a wiring pitch of the gate G is set to 2F, and arrangement pitches of the active region AA and the bit-line BL are set to 3.5F. In this case, the minimum processing dimension F is set to ½ of the smaller one of the wiring pitch of the gate G and the wiring pitch of the bit-line BL. In this configuration, the minimum processing dimension F corresponds to ½ of the wiring pitch of the gate G.

Accordingly, the gate width of the memory cell transistor to one phase change element PCR reaches 5F=(2.5F+2.5F) and an area of the memory cell MC becomes $14F^2$ because two memory cell transistors Q1 and Q2 are provided. By expanding the gate width using two memory cell transistors in this manner, the drivability of the memory cell transistor to one phase change element PCR can be improved.

The gates G of the memory cell transistors are connected to word lines WL provided across a bit-line. In this case, the description will be made based on the assumption that the memory cell transistor is the NMOS transistor, but it may be a PMOS transistor. However, the use of the NMOS transistor is superior in current drivability and it has the advantage that a memory cell area required for realizing the same current drivability can be reduced. Bit-line contacts BC (second contact) and source contacts SC (first contact) are alternately disposed for each diffusion layer L in the active region AA, namely, source and drain regions of a plurality of memory cell transistors disposed in series. Active regions AA adjacent in an extending direction of the gate G have a similar contact arrangement.

In this case, all contacts disposed between two gates G adjacent in the memory cell array MCA are bit-line contacts BC or source contacts SC. Further, considering one word line WL (gate G), bit-line contacts BC are aligned on one side (first side) thereof, and source contacts (memory cell contacts) SC are aligned on the other side (second side). A center line of the bit-line contacts BC and a center line of the source contacts SC on the same bit-line BL are positioned so that their centers are deviated in a word line WL direction by 1.5F. A bit-line BL is disposed on the bit-line contact BC in parallel to the active region AA.

This layout can be applied to both the cases where the source wiring layer SL disposed on the source contact SC is disposed above the bit-line BL and the case where the source wiring layer SL is disposed below the bit-line BL. When the source wiring layer SL is disposed above the bit-line BL in this layout, a margin is formed between the source contact SC and the bit-line BL. Therefore, the short-circuit between the bit-line BL and the source contact SC can be suppressed.

Figure 2:
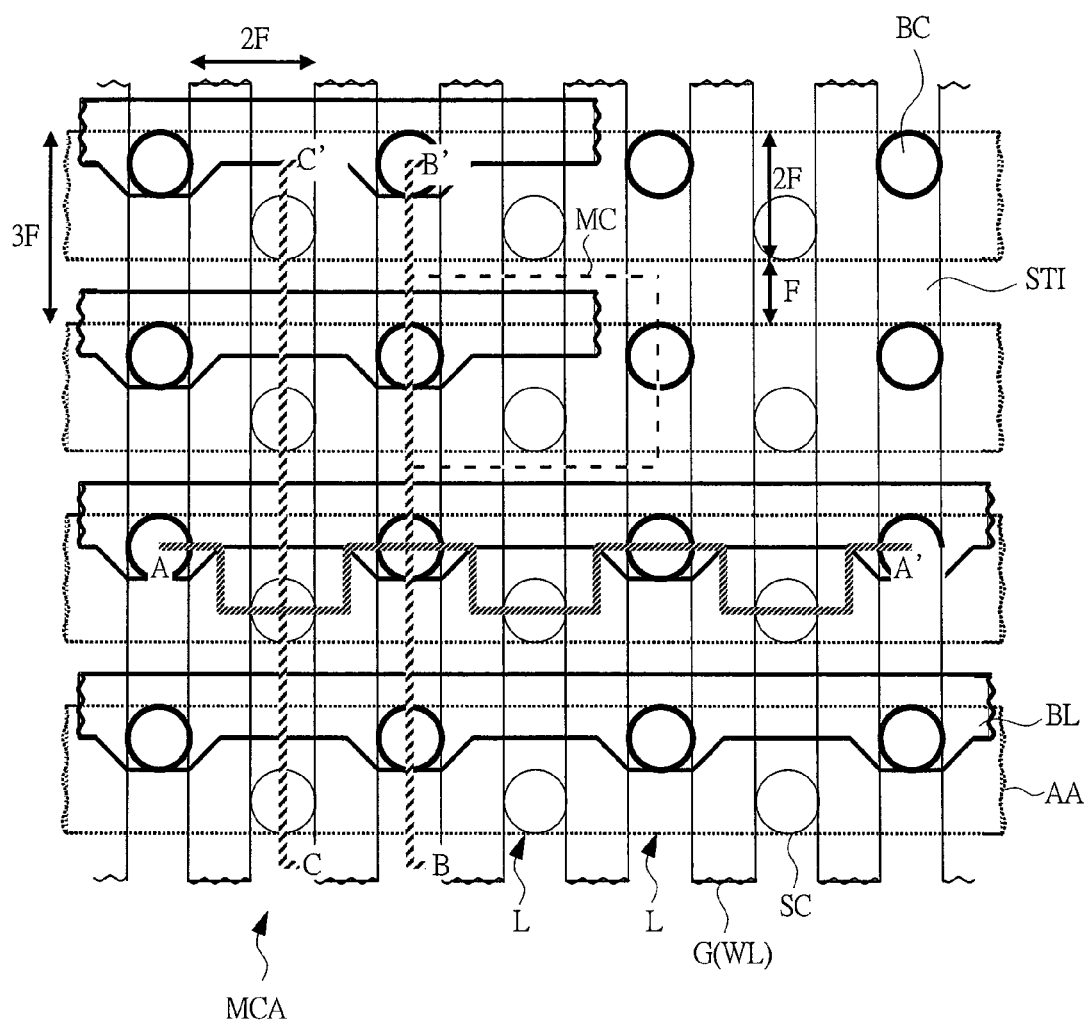
FIG. 2 is a layout diagram showing a modified example of FIG. 1.

FIG. 2 is a layout diagram showing a modified example of FIG. 1. In this layout, the gate width of the memory cell transistor to one phase change element PCR is 4F, and the memory cell area is $12F^2$. Similar to FIG. 1, a circuit diagram corresponding to FIG. 2 is represented by FIG. 3 and FIG. 4 shown later.

This configuration is different from the configuration shown in FIG. 1 in that the arrangement pitches of the bit-line BL and the active region AA are 3F, a width of the active region AA is 2F, and a width of the isolation region STI is F. Therefore, a center line of the bit-line contacts BC and a center line of the source contacts SC on the same bit-line BL are positioned so that their centers are deviated in a word line WL direction by F. In this layout, of the two sides of the bit-line BL in a longitudinal direction, a shape of one side where the source contact SC is positioned is set to be rectangular. Therefore, a space of 0.5F or more is always secured between the source contact SC and the bit-line BL.

This layout is suitable for the case where the source wiring layer SL is disposed above the bit-line BL. In this case, since a capacitance between the bit-line BL and the source contact SC can be reduced, high-speed operation and reduction in power consumption can be realized. Also, since a space of 0.5F or more is present between the source contact SC and the bit-line BL, an advantage can be obtained that the short-circuit can be suppressed. Further, it is possible to apply the configuration where the source wiring layer SL is disposed below the bit-line BL. The other configuration is similar to that in FIG. 1.

Figure 33:
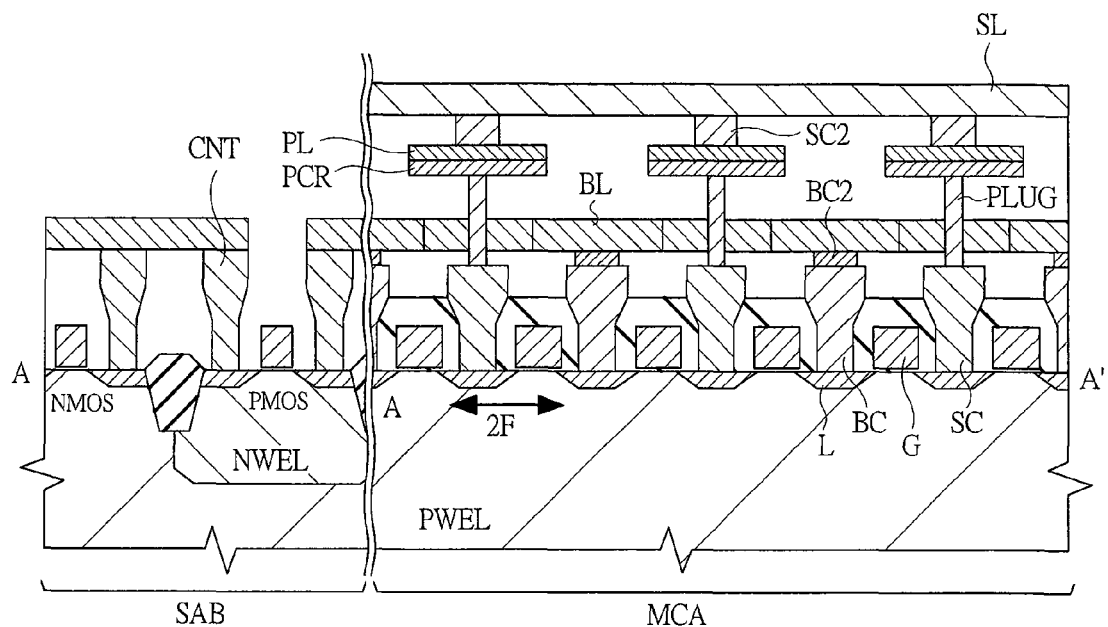
FIG. 33 is a sectional view showing the principal parts of one example of a sectional configuration taken along the line A-A' in FIG. 2.
Figure 34:
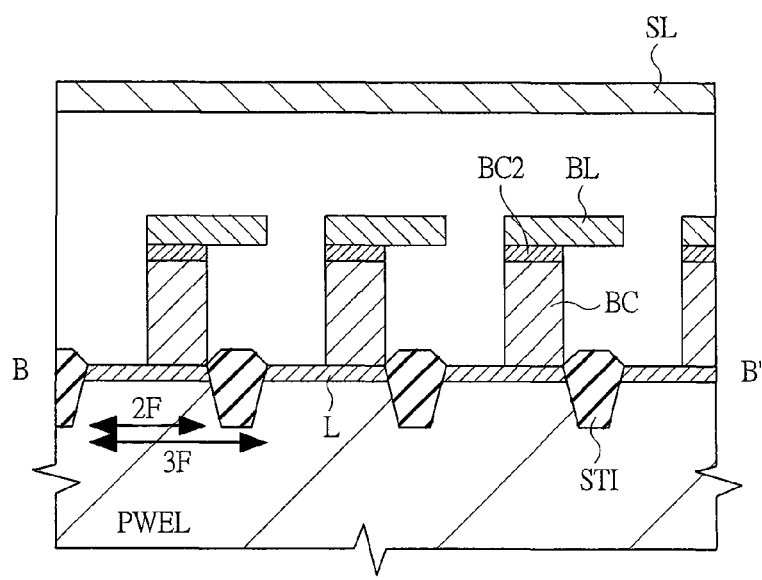
FIG. 34 is a sectional view showing the principal parts of one example of a sectional configuration taken along the line B-B' in FIG. 2.
Figure 35:
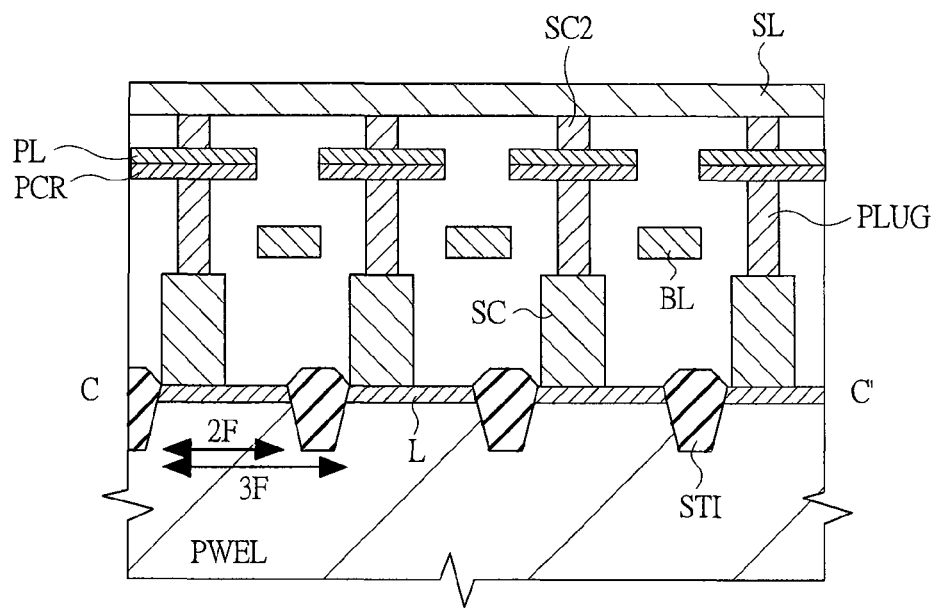
FIG. 35 is a sectional view showing the principal parts of one example of a sectional configuration taken along the line C-C' in FIG. 2.

FIG. 33, FIG. 34, and FIG. 35 are sectional views showing the principal parts of an example of a sectional configuration taken along the lines A-A', B-B' and C-C' in FIG. 2, respectively. FIG. 33 includes not only a sectional view taken along the line A-A' but also a sectional view showing a part (PMOS transistor and NMOS transistor) of a sense-amplifier block SAB of a peripheral circuit region adjacent to the memory cell array MCA. Also, FIG. 33 shows a section between A-A' of FIG. 2 connected by a line formed of rectangles so that a section of contacts on the diffusion layer L can be seen for a convenience of explanation. For simplification, interlayer dielectrics are not shown in respective figures.

In FIG. 33, the memory cell array MCA is disposed in a p type well PWEL common to NMOS transistors in a peripheral circuit. Also, the PMOS transistors in the peripheral circuit are disposed in an n type well NWEL. This configuration corresponds to a structure example where the phase change element PCR is disposed between the source contact SC and the source wiring layer SL and the phase change elements PCR are separated for each memory element.

This configuration also corresponds to a structure example where the bit-line contact BC and the source contact SC which are contacts to the diffusion layer L of the memory cell transistor are formed to the gate G in a self aligned manner. These contacts may be formed through the contact formation according to a conventional CMOS process. In the case of the contact formation according to the CMOS process, since it is unnecessary to add a special process, such an advantage can be obtained that a process cost can be reduced. On the other hand, when the contacts are formed through the self aligned process, even if distances between the gate G and the contact BC and between the gate G and the source contact SC are reduced, the short-circuit between the gate G and the contact BC and between the gate G and the source contact SC can be prevented, and the advantage can be obtained that a fine memory cell can be formed.

As shown in FIG. 33 and FIG. 34, a second bit-line contact BC2 is disposed on the bit-line contact BC, and the bit-line BL is disposed on the second bit-line contact BC2. The bit-line contact BC and the second bit-line contact BC2 can be formed simultaneously. In this case, such an advantage can be obtained that a process cost can be reduced. With respect to the shape of a contact portion between the bit-line contact BC and the diffusion layer L, it is narrowed in a direction perpendicular to the gate G (in a width direction in FIG. 33) and is widened in a direction parallel to the gate G (in a width direction in FIG. 34). By this means, a contact area can be enlarged and low resistance can be achieved. As shown in FIG. 34, the bit-line contact BC is disposed on the diffusion layer L on a B' side in FIG. 2.

On the other hand, as shown in FIG. 33 and FIG. 35, with respect to the shape of a contact portion of the source contact SC with the diffusion layer L, it is narrowed in a direction perpendicular to the gate G and is widened in a direction parallel to the gate G like the bit-line contact BC. As shown in FIG. 35, the source contact SC is disposed on the diffusion layer L on a C side in FIG. 2.

Also, a lower electrode PLUG which is made of tungsten (W), formed from a stacked structure of W/titanium nitride (TiN), or made of polysilicon to a phase change element PCR is disposed on the source contact SC. It is desirable that the lower electrode PLUG (fourth contact) is formed to be smaller in sectional area than the source contact SC (third contact) because of the necessity to reduce a contact area to the phase change element PCR.

A phase change element PCR and an upper electrode PL are disposed on the lower electrode PLUG. The phase change element PCR and the upper electrode PL are separated from an adjacent memory cell MC by an interlayer dielectric. Further, a second source contact SC2 is disposed on the upper electrode PL, and the source wiring layer SL is connected to the second source contact SC2. The source wiring layer SL is mutually connected on the memory cell array MCA. Beside this configuration, such a configuration is also possible that the source wiring layer SL is mutually connected by the memory cells MC arranged in the bit-line BL direction or the gate G (word line WL) direction.

Figure 59:
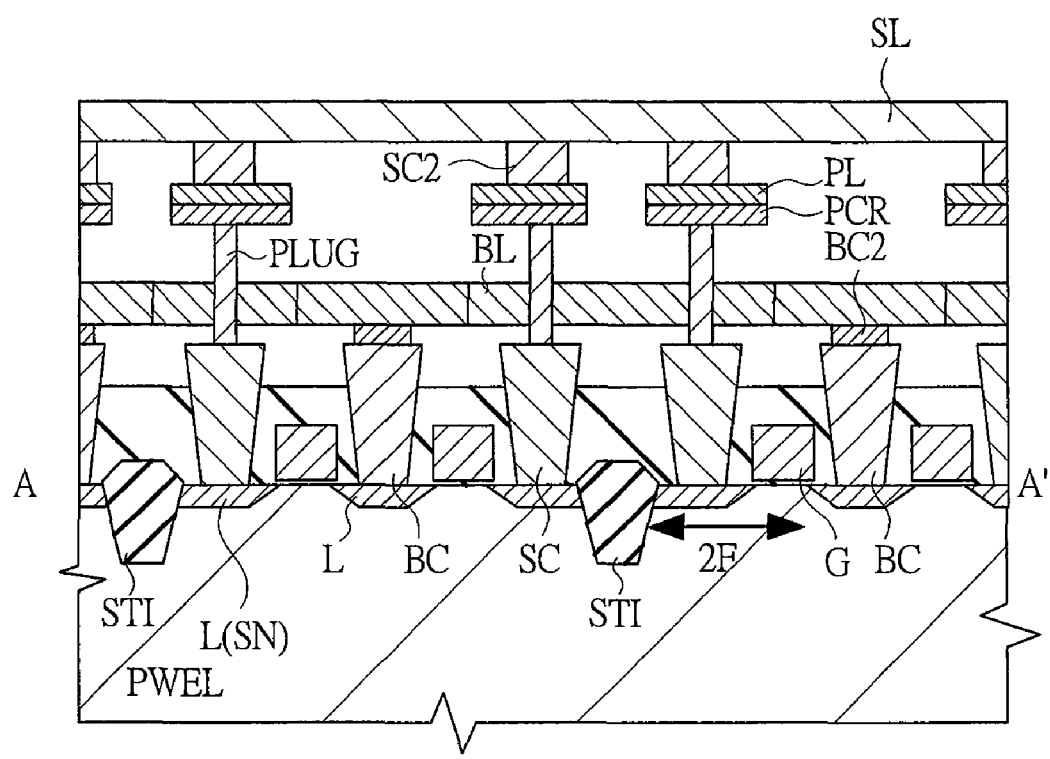
FIG. 59 is a sectional view showing one example of a memory cell structure of a phase change memory in a semiconductor device of a conventional art that has been examined as a background of the present invention.

In the memory cell array MCA shown in FIG. 33, both the bit-line contact BC and the diffusion layer L to which the bit-line contact BC is connected are shared by adjacent memory transistors and adjacent memory cells MC. Therefore, when compared with the configuration described in FIG. 59 as the conventional art, it is unnecessary to use isolation regions STI at respective portions in the memory cell array MCA and a circuit area can be reduced.

According to the configuration shown in FIG. 33 to FIG. 35 above, not only the securing of drivability by the two memory cell transistors as described above but also the reduction in the circuit area can be achieved. Further, since phase change elements PCR of the memory cells MC are electrically and thermally isolated from each other by the interlayer dielectric, such an advantage can be obtained that disturbance to an adjacent memory cell can be reduced. By connecting the memory cell transistor to the bit-line BL side and connecting the phase change element PCR to the source electrode SL side, application of disturbance voltage to a non-selected memory cell when a bit-line BL is driven can be suppressed.

Figure 37:
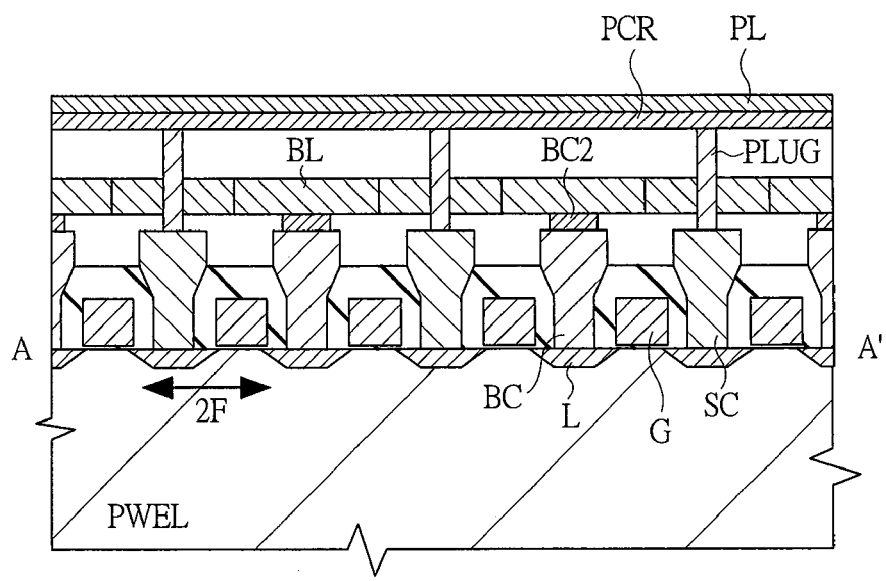
FIG. 37 is a sectional view showing the principal parts of another example of a sectional configuration taken along the line A-A' in FIG. 2.
Figure 38:
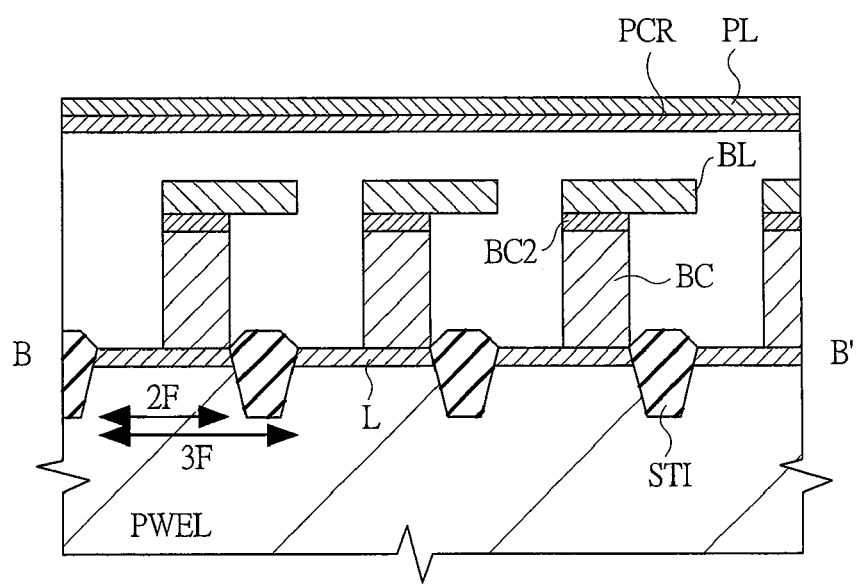
FIG. 38 is a sectional view showing the principal parts of another example of a sectional configuration taken along the line B-B' in FIG. 2.
Figure 39:
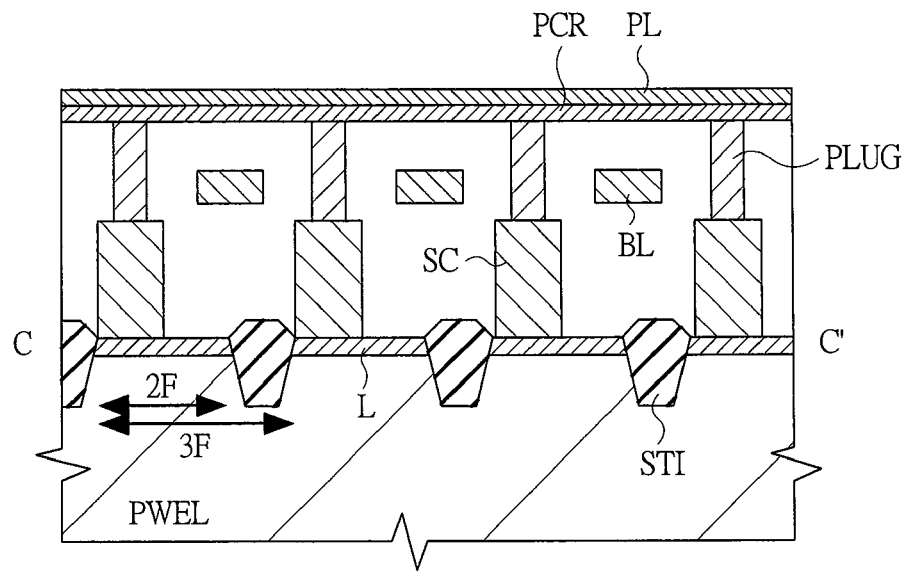
FIG. 39 is a sectional view showing the principal parts of another example of a sectional configuration taken along the line C-C' in FIG. 2.

FIG. 37, FIG. 38, and FIG. 39 are sectional views showing the principal parts of another example of a sectional configuration taken along the lines A-A', B-B' and C-C' in FIG. 2, respectively. The feature of this structure lies in that a phase change element PCR and an upper electrode PL are disposed above a bit-line BL, and the phase change element PCR is mutually connected on the memory cell array MCA and the upper electrode PL is utilized as a source wiring layer SL (source electrode), when compared with the structure shown in FIG. 33 to FIG. 35.

Even when the phase change elements PCR are mutually connected on the memory cell array MCA, writing is performed only on the local portions corresponding to respective memory cells MC in a region of the phase change element PCR in practical use. Therefore, the remaining portions are always in high resistance of amorphous state, and the phase change elements PCR can be assumed to be substantially separated for respective memory cells MC.

By connecting the phase change elements PCR mutually on the memory cell array MCA in this manner, fine processing to the phase change elements PCR and the upper electrodes PL for each memory cell MC on the memory cell array MCA is not required and the process can be advantageously facilitated. Since the source electrode SL is also used as the upper electrode PL in this configuration, it is desirable that the upper electrode PL is used mutually on the memory cell array MCA. The remaining configuration is similar to that shown in FIG. 33 to FIG. 35.

Figure 41:
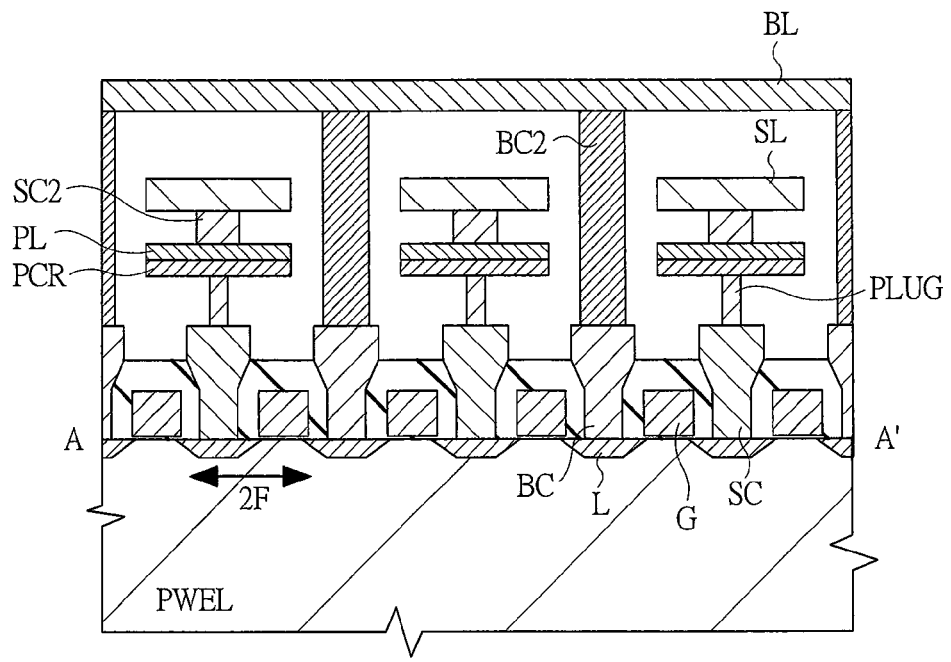
FIG. 41 is a sectional view showing the principal parts of still another example of a sectional configuration taken along the line A-A' in FIG. 2.
Figure 42:
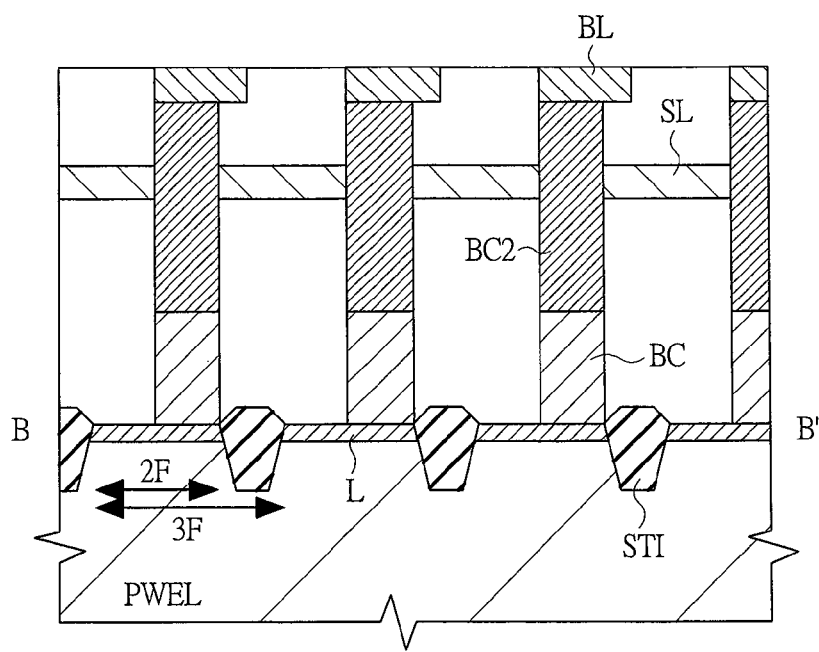
FIG. 42 is a sectional view showing the principal parts of still another example of a sectional configuration taken along the line B-B' in FIG. 2.
Figure 43:
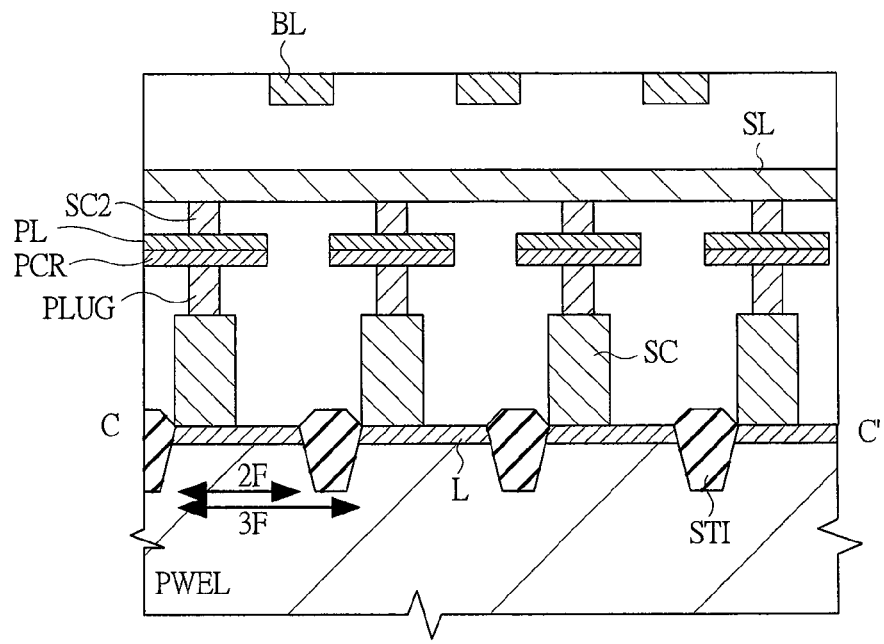
FIG. 43 is a sectional view showing the principal parts of still another example of a sectional configuration taken along the line C-C' in FIG. 2.

FIG. 41, FIG. 42, and FIG. 43 are sectional views showing the principal parts of still another example of a sectional configuration taken along the lines A-A', B-B' and C-C' in FIG. 2, respectively. When compared with the configuration shown in FIG. 33 to FIG. 35, this configuration shows the case where the phase change element PCR, the upper electrode PL, and the source wiring layer SL are disposed below the bit-line BL.

In this configuration, since the phase change elements PCR of the memory cells MC are electrically and thermally isolated from each other by the interlayer dielectric like the configuration shown in FIG. 33 to FIG. 35, such an advantage can be obtained that disturbance to an adjacent memory cell can be reduced. Also, by disposing the bit-line BL above the source wiring layer SL, a bit-line BL capacitance can be reduced because any adjacent contact is not present like the bit-line BL shown in FIG. 35. Accordingly, such an advantage can be obtained that the high-speed operation and reduction in power consumption can be realized.

Note that FIG. 41 to FIG. 43 show a system where the source wiring layer SL is mutually connected on the memory cell array MCA by the memory cells arranged in the gate G (word line) direction, but application to the system where the source wiring layer SL is mutually connected by the memory cells arranged in the bit-line BL direction and the system where they are mutually connected on the memory cell array MCA is also possible. Also, the bit line contact BC and the second bit-line contact BC2 can be formed simultaneously. In this case, simplification of a process step can be achieved. The remaining configuration is similar to that in FIG. 33 to FIG. 35 described above.

Figure 45:
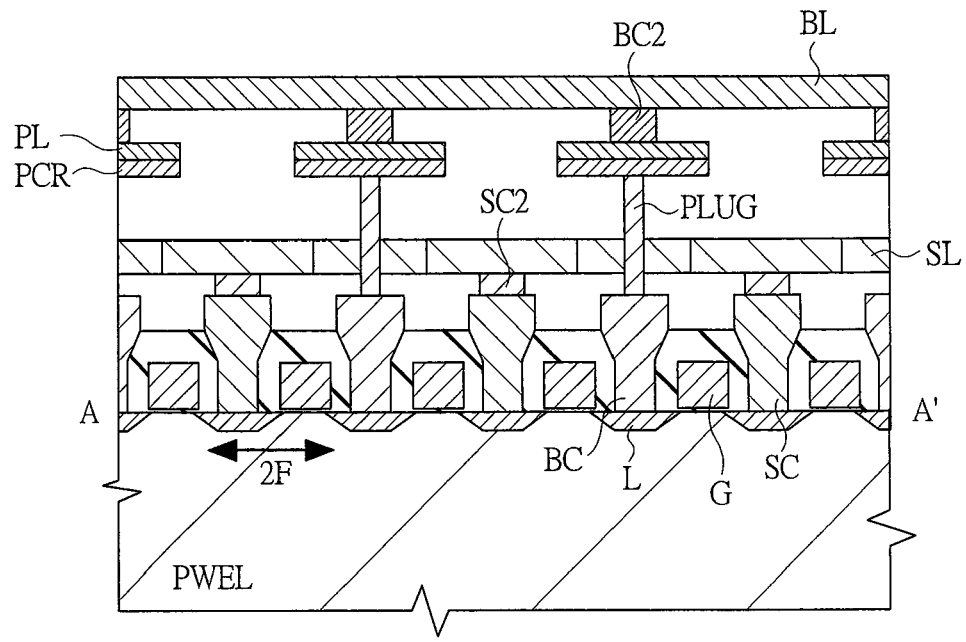
FIG. 45 is a sectional view showing the principal parts of still another example of a sectional configuration taken along the line A-A' in FIG. 2.
Figure 46:
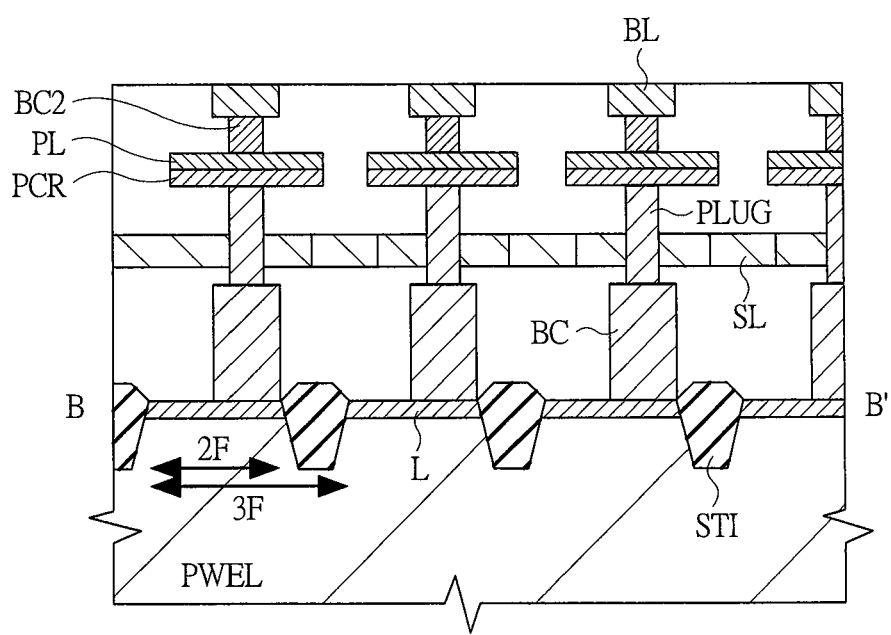
FIG. 46 is a sectional view showing the principal parts of still another example of a sectional configuration taken along the line B-B' in FIG. 2.
Figure 47:
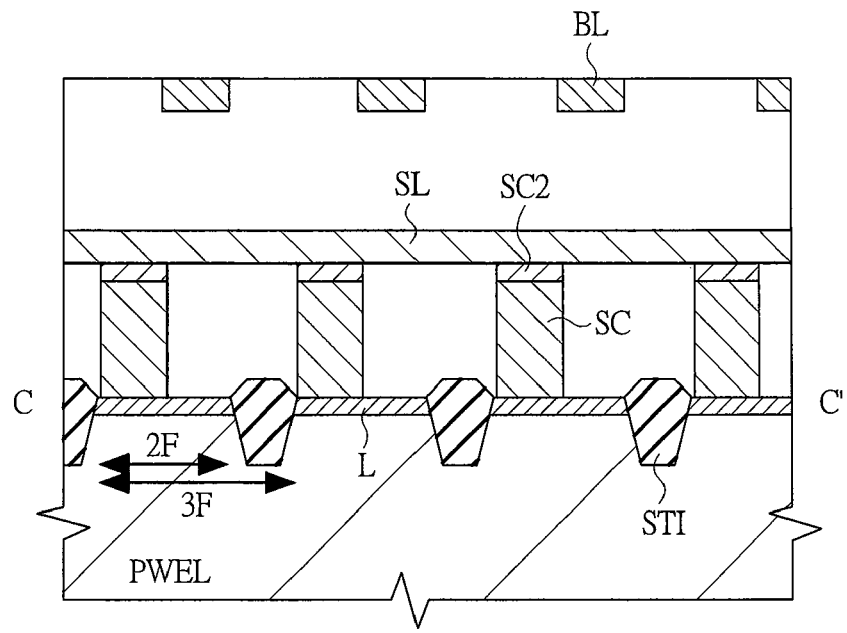
FIG. 47 is a sectional view showing the principal parts of still another example of a sectional configuration taken along the line C-C' in FIG. 2.

FIG. 45, FIG. 46, and FIG. 47 are sectional views showing the principal parts of still another example of a sectional configuration taken along the lines A-A', B-B' and C-C' in FIG. 2, respectively. The feature of this configuration lies in that the phase change element PCR is connected between the bit-line contact BC and the bit-line BL and the source wiring layer SL is disposed below the bit-line BL.

As shown in these figures, a lower electrode PLUG to the phase change element PCR is disposed on the bit-line contact BC. It is desirable that the lower electrode PLUG (fourth contact) is formed to be smaller in sectional area than the bit-line contact BC (third contact) because of the necessity to reduce a contact area to the phase change element PCR. Further, the phase change elements PCR and the upper electrodes PL separated for respective memory cells MC are disposed on the lower electrode PLUG. Also, the second bit-line contact BC2 is disposed on the upper electrode PL and the bit-line BL is connected to the second bit contact BC2. On the other hand, the second source contact SC2 is disposed on the source contact SC, and the source wiring layer SL is connected to the second source contact SC2.

In this configuration, since the phase change elements PCR of the memory cells MC are electrically and thermally isolated from each other by the interlayer dielectric, such an advantage can be obtained that disturbance to an adjacent memory cell can be reduced. Also, by disposing the bit-line BL above the source wiring layer SL, a bit-line BL capacitance can be reduced because any adjacent contact is not present like the bit-line BL shown in FIG. 35. Accordingly, such an advantage can be obtained that the high-speed operation and reduction in power consumption can be realized.

Note that FIG. 45 to FIG. 47 show the system where the source wiring layer SL is mutually connected on the memory cell array MCA, but application to the system where the source wiring layer SL is mutually connected by the memory cells arranged in the word line WL direction and the system where it is mutually connected by the memory cells arranged in the bit-line BL direction is also possible. The remaining configuration is similar to that shown in FIG. 33 to FIG. 35 described above.

Figure 49:
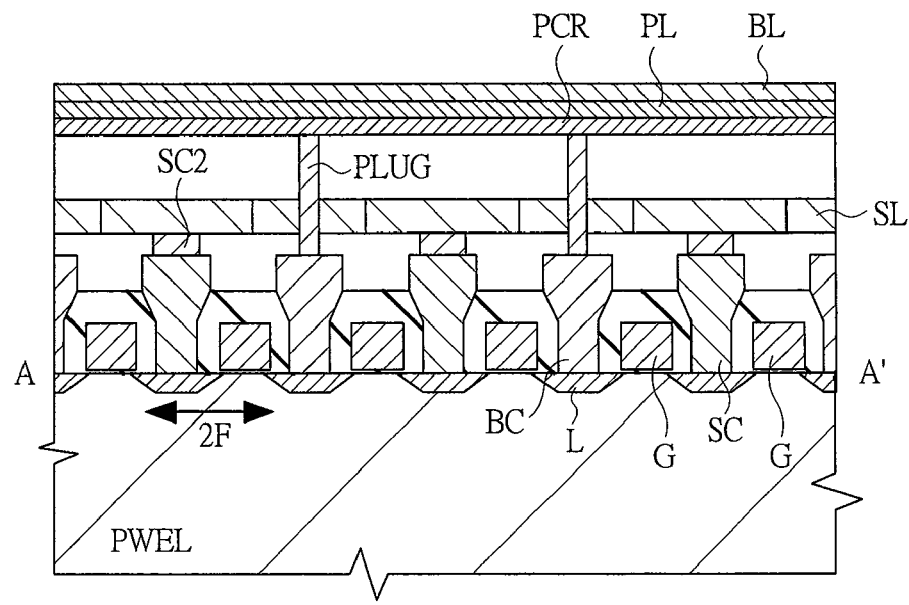
FIG. 49 is a sectional view showing the principal parts of still another example of a sectional configuration taken along the line A-A' in FIG. 2.
Figure 50:
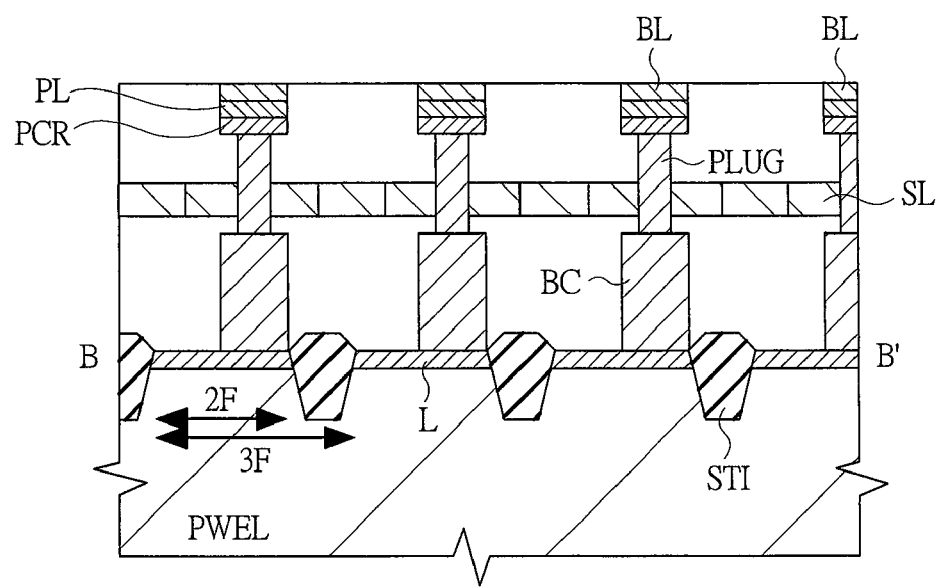
FIG. 50 is a sectional view showing the principal parts of still another example of a sectional configuration taken along the line B-B' in FIG. 2.
Figure 51:
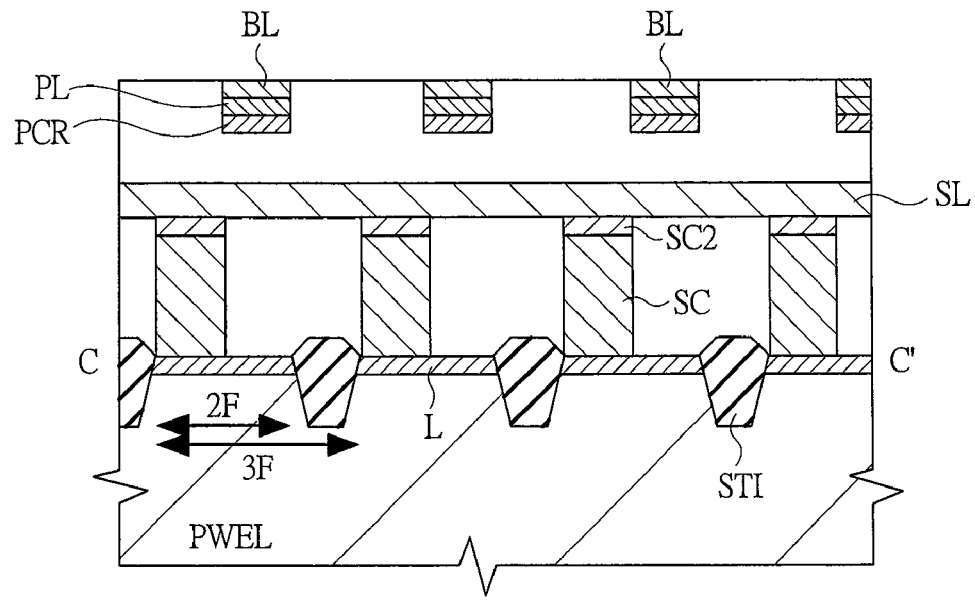
FIG. 51 is a sectional view showing the principal parts of still another example of a sectional configuration taken along the line C-C' in FIG. 2.

FIG. 49, FIG. 50, and FIG. 51 are sectional views showing the principal parts of still another example of a sectional configuration taken along the lines A-A', B-B' and C-C' in FIG. 2, respectively. The feature of this configuration lies in that that the phase change element PCR is connected between the bit-line contact BC and the bit-line, the phase change element PCR is disposed so as to be continuous to a lower layer below the bit-line BL, and the source wiring layer SL is disposed below the bit-line BL.

As shown in these figures, a lower electrode PLUG to the phase change element PCR is disposed on the bit-line contact BC. It is desirable that the lower electrode PLUG is formed to be smaller in sectional area than the bit-line contact BC because of the necessity to reduce a contact area to the phase change element PCR. Further, the phase change element PCR, the upper electrode PL, and the bit-line BL are stacked on the lower electrode PLUG, and these stacked films are processed to a shape similar to the bit line BL. On the other hand, the second source contact SC2 is disposed on the source contact SC and the source wiring layer SL is disposed on the second source contact SC2.

In this configuration, since an arrangement pattern of the phase change elements PCR becomes the same as the bit-line BL, a process step can be simplified. Also, since the phase change elements PCR are electrically and thermally isolated between adjacent bit-lines BL by the interlayer dielectric, such an advantage can be obtained that disturbance to adjacent memory cells on the same word line WL can be reduced. Also, by disposing the bit-line BL above the source wiring layer SL, a bit-line BL capacitance can be reduced because any adjacent contact is not present like the bit-line BL shown in FIG. 35.

Note that FIG. 49 to FIG. 51 show the system where the source wiring layer SL is mutually connected on the memory cell array MCA, but application to the system where the source wiring layer SL is mutually connected by the memory cells MC arranged in the word line WL direction and the system where it is mutually connected by the memory cells arranged in the bit-line BL direction is also possible. Furthermore, in these figures, the source contact SC and the second source contact SC2 are formed between the diffusion layer L and the source wiring layer SL, and layers of the source wiring layer SL to the diffusion L may be formed by one step. In this case, such an advantage can be obtained that the process step can be simplified. The remaining configuration is similar to that in FIG. 33 to FIG. 35 described above.

Figure 53:
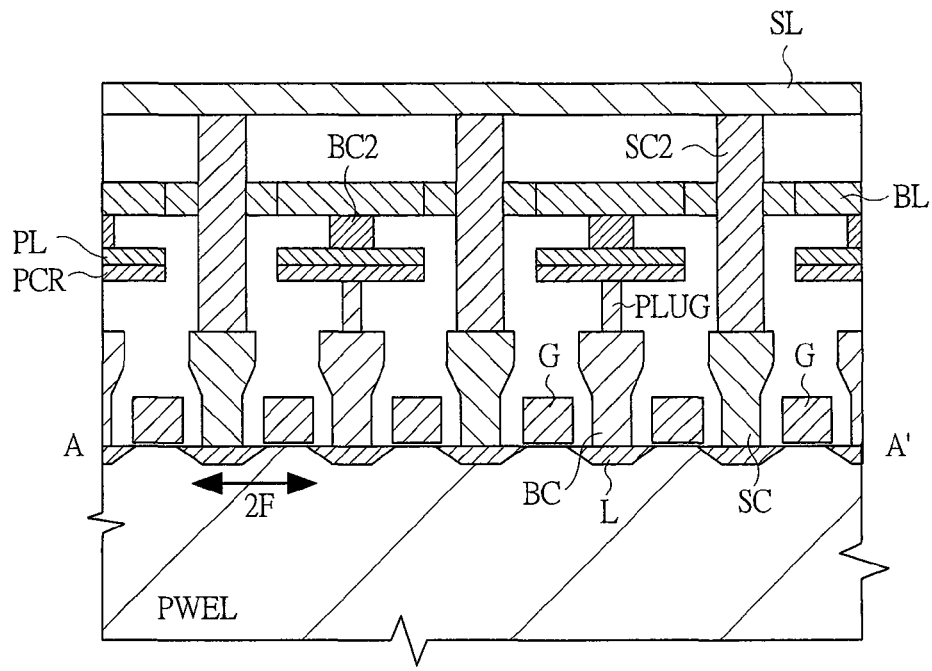
FIG. 53 is a sectional view showing the principal parts of still another example of a sectional configuration taken along the line A-A' in FIG. 2.
Figure 54:
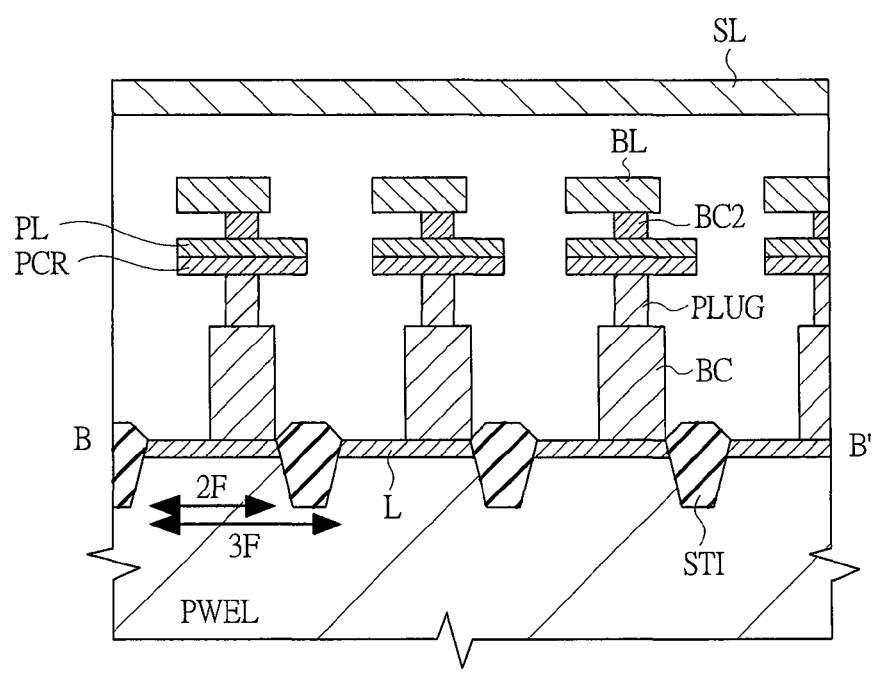
FIG. 54 is a sectional view showing the principal parts of still another example of a sectional configuration taken along the line B-B' in FIG. 2.
Figure 55:
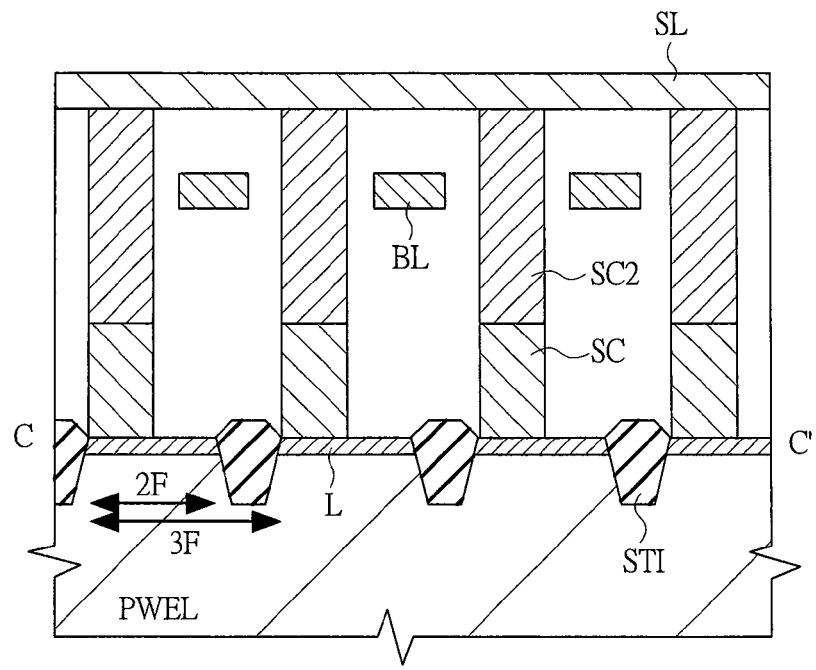
FIG. 55 is a sectional view showing the principal parts of still another example of a sectional configuration taken along the line C-C' in FIG. 2.

FIG. 53, FIG. 54, and FIG. 55 are sectional views showing the principal parts of still another example of a sectional configuration taken along the lines A-A', B-B' and C-C' in FIG. 2, respectively. The feature of this configuration lies in that the phase change element PCR is connected between the bit-line contact BC and the bit-line BL and the source wiring layer SL is disposed above the bit-line BL.

As shown in these figures, a lower electrode PLUG to the phase change element PCR is disposed on the bit-line contact BC. It is desirable that the lower electrode PLUG is formed to be smaller in sectional area than the bit-line contact BC because of the necessity to reduce a contact area to the phase change element PCR. Further, the phase change element PCR and the upper electrode PL are disposed on the lower electrode PLUG. The upper electrode PL is connected to the bit-line BL via the second bit-line contact BC2. On the other hand, one end of the second source contact SC2 is connected to the source contact SC. Also, the other end of the second source contact SC2 is positioned above the bit-line BL and the source wiring layer SL mutually formed on the memory cell array MCA is connected to the other end.

In this configuration, since the phase change element PCR of the memory cell MC is electrically and thermally isolated by the interlayer dielectric, the second source contact SC2, and the like, such an advantage can be obtained that disturbance to an adjacent memory cell MC can be reduced.

Note that FIG. 53 to FIG. 55 show the system where the source wiring layer SL is mutually connected on the memory cell array MCA, but application to the system where the source wiring layer SL is mutually connected by the memory cells arranged in the word line WL direction and the system where it is mutually connected by the memory cells arranged in the bit-line BL direction is also possible. Especially, when the source wiring layer SL is mutually connected by the memory cells on the same word line WL or on the same bit-line BL, a capacitance of the source wiring layer SL can be reduced. Therefore, application to an operation system for driving the source wiring layer SL is facilitated. The remaining configuration is similar to that in FIG. 33 to FIG. 35 described above.

Next, one example of a manufacturing method of the memory cell array MCA described above will be described. Note that the case of the layout structure shown in FIG. 2 having a sectional structure shown in FIG. 33 to FIG. 35 will be described as an example with reference to FIG. 28 to FIG. 32. FIG. 28 to FIG. 32 are plan views for describing the steps in the example of a manufacturing method of a semiconductor device according to the first embodiment of the present invention, respectively.

Figure 28:
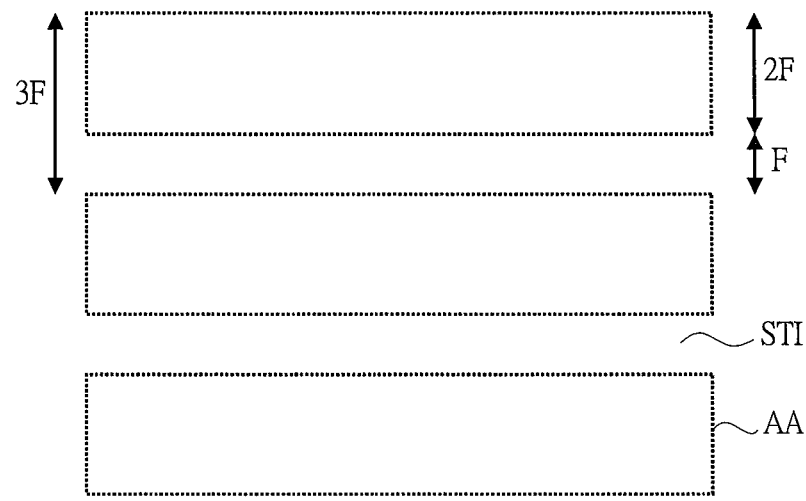
FIG. 28 is a plan view for describing a step in one example of a manufacturing method of the semiconductor device according to the first embodiment of the present invention.

First, shallow trench isolation regions STI as shown in FIG. 28 are formed in a semiconductor substrate. A region sandwiched between the isolation regions STI forms an active region AA. Subsequently, impurity ions are implanted in the active regions AA in order to form a well. Next, after a gate oxide film is formed, polysilicon (poly-Si) is deposited as a gate electrode through a conventional CVD (chemical vapor deposition). Impurities with a desired polarity are implanted in the polysilicon of the gate electrode, and TiN and W is sputtered so as to reduce the word line resistance. TiN is sputtered for suppressing silicide reaction between polysilicon and W, and tungsten nitride (WN) can be used instead of TiN.

Figure 29:
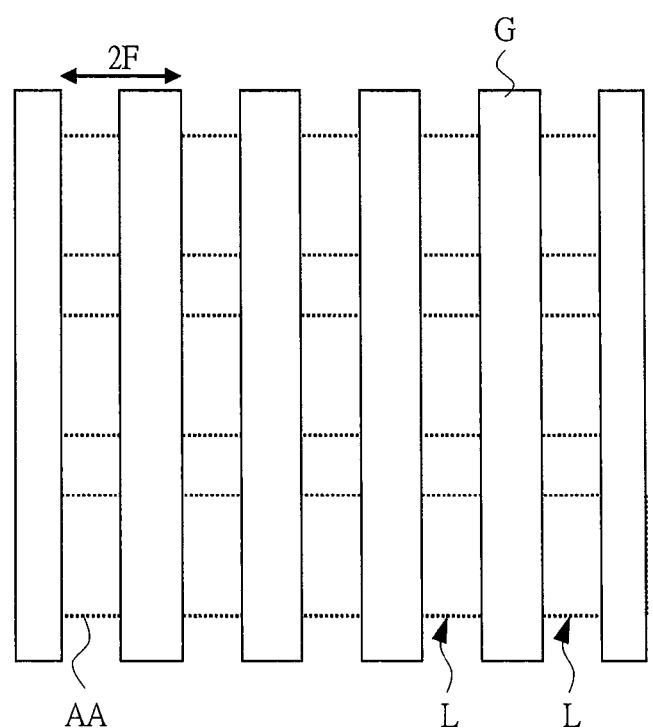
FIG. 29 is a plan view for describing a step subsequent to FIG. 28 in one example of a manufacturing method of the semiconductor device according to the first embodiment of the present invention.

Next, silicon nitride (SiN) is deposited on the gate electrode through the CVD for self-aligning contact. Next, a gate G is formed by processing the stacked layers of SiN/W/TiN/poly-Si through a conventional dry etching. In this manner, a plan view such as shown in FIG. 29 is obtained. Note that a wiring pitch of the gate G is set to 2F.

Figure 30:
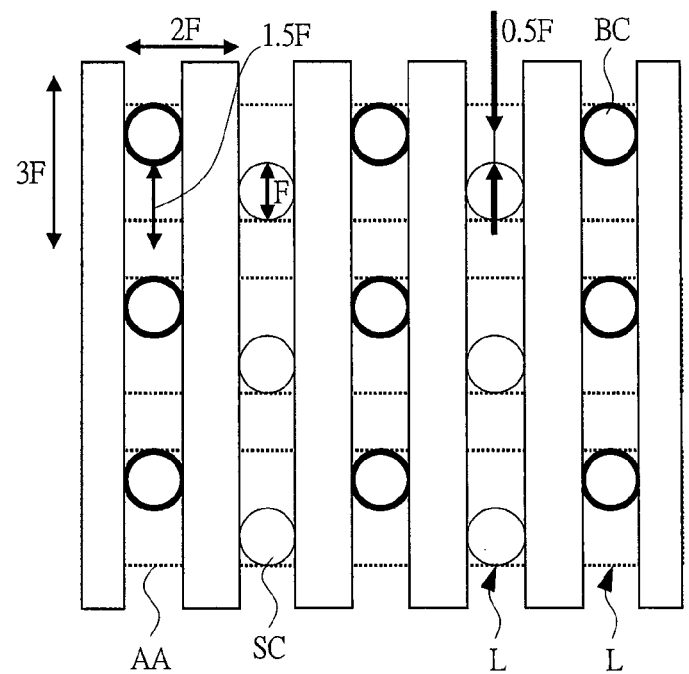
FIG. 30 is a plan view for describing a step subsequent to FIG. 29 in one example of a manufacturing method of the semiconductor device according to the first embodiment of the present invention.

Next, n type impurities are implanted on the active region AA with using a resist mask so as to form a diffusion layer L of a memory cell transistor. Next, an insulating film is deposited through the CVD and the surface thereof is planarized. Then, plug holes with a diameter of about the minimum processing dimension for the bit-line contact BC and the source contact SC are opened with using the resist as a mask, thereby exposing a surface of the diffusion layer L formed on the semiconductor substrate. Subsequently, plugs for the bit-line contact BC and the source contact SC are formed. Any materials such as poly-Si, W, TiN, and the like can be used for the plug. After the plug material is deposited and the planarization is performed through CMP, a plan view such as shown in FIG. 30 can be obtained.

Figure 31:
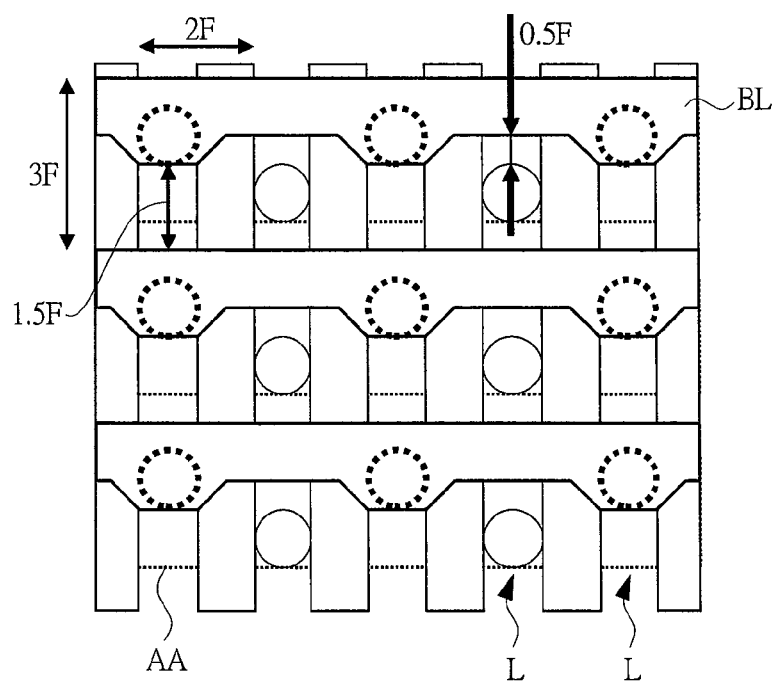
FIG. 31 is a plan view for describing a step subsequent to FIG. 30 in one example of a manufacturing method of the semiconductor device according to the first embodiment of the present invention.

Next, after a silicon oxide film is deposited through the CVD, an opening for the second bit-line contact BC2 is formed on the bit-line contact BC. Subsequently, an electrode material is embedded in the second bit-line contact BC2 to form a plug. A stacked film of W/TiN can be used for the plug material besides the TiN plug. Next, W used for the bit-line BL is sputtered and a bit-line BL is formed through lithography and dry-etching. At this time, in order to prevent the short-circuit with the bit-line BL when a contact of a lower electrode PLUG formed on the source contact SC is opened later, the bit-line BL may be thinned to have a size equal to or less than the minimum processing dimension. Then, a plan view such as shown in FIG. 31 can be obtained. In FIG. 31, the bit-line contact BC which is positioned below the bit-line BL is shown by a broken line for the convenience of explanation.

Figure 32:
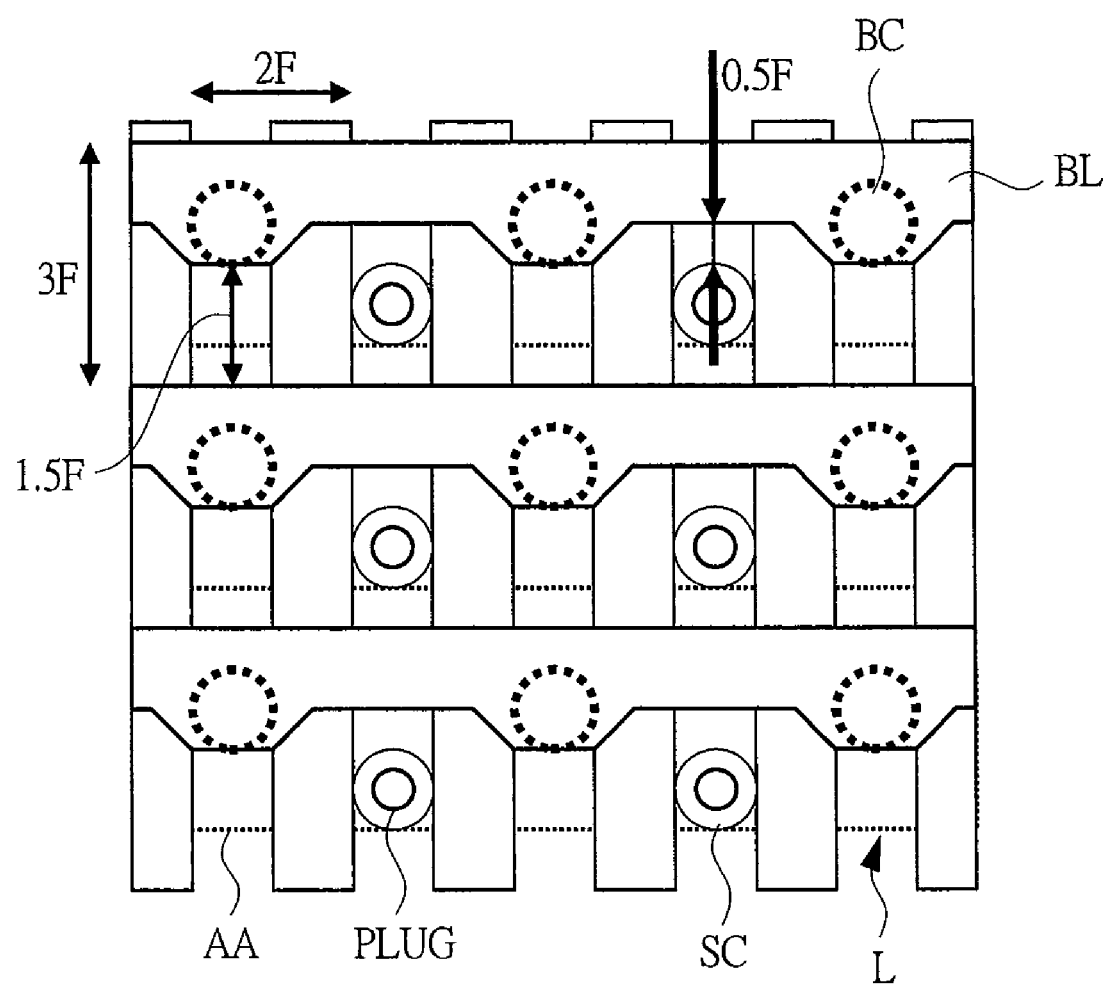
FIG. 32 is a plan view for describing a step subsequent to FIG. 31 in one example of a manufacturing method of the semiconductor device according to the first embodiment of the present invention.

Next, the lower electrode PLUG of the phase change element PCR is formed. First, an oxide film as an interlayer dielectric is deposited, planarization is performed through CMP process, and a plug hole for a lower electrode PLUG is formed through the conventional lithography. Thereafter, W or W/TiN stacked film, or the like is deposited in the opening to form the lower electrode PLUG. FIG. 32 shows an example where the lower electrode PLUG is formed on the source contact SC. The lower electrode PLUG (fourth contact) is designed to have a contact diameter smaller than a source contact SC (third contact) in order to reduce a contact area to a phase change element PCR formed later for the purpose of reducing the rewrite current.

Thereafter, chalcogenide material is deposited as a material for the phase change element PCR. In this case, as the chalcogenide material, a material containing Te such as germanium antimony tellurium (GeSbTe) is used. Further, an upper electrode PL is formed and device isolation is performed for each memory cell MC. Then, a second source contact SC2 is opened to the upper electrode PL and a plug is formed. Further, by disposing a source wiring layer SL in a plate shape on an upper portion of the memory cell array MCA above the plug, a desired structure can be obtained.

As described above, contact formation may be performed through a conventional CMOS process without using a self-aligned contact to the bit-line contact BC and the source contact SC described above. Also, silicidation effective in resistance reduction may be performed to the gate G. Further, the silicidation can be applied to the diffusion layer L for resistance reduction of the diffusion layer and resistance reduction of the contact.

Next, one example of the circuit diagram corresponding to the layout shown in FIG. 1 and FIG. 2 described above is shown in FIG. 3 and FIG. 4. FIG. 3 is a circuit diagram showing one example of a circuit of a memory cell array in a phase change memory in the semiconductor device of the first embodiment of the present invention. FIG. 4 is a circuit diagram showing one example of a circuit of a memory cell array different from FIG. 3 in a phase change memory in the semiconductor device of the first embodiment of the present invention.

Figure 3:
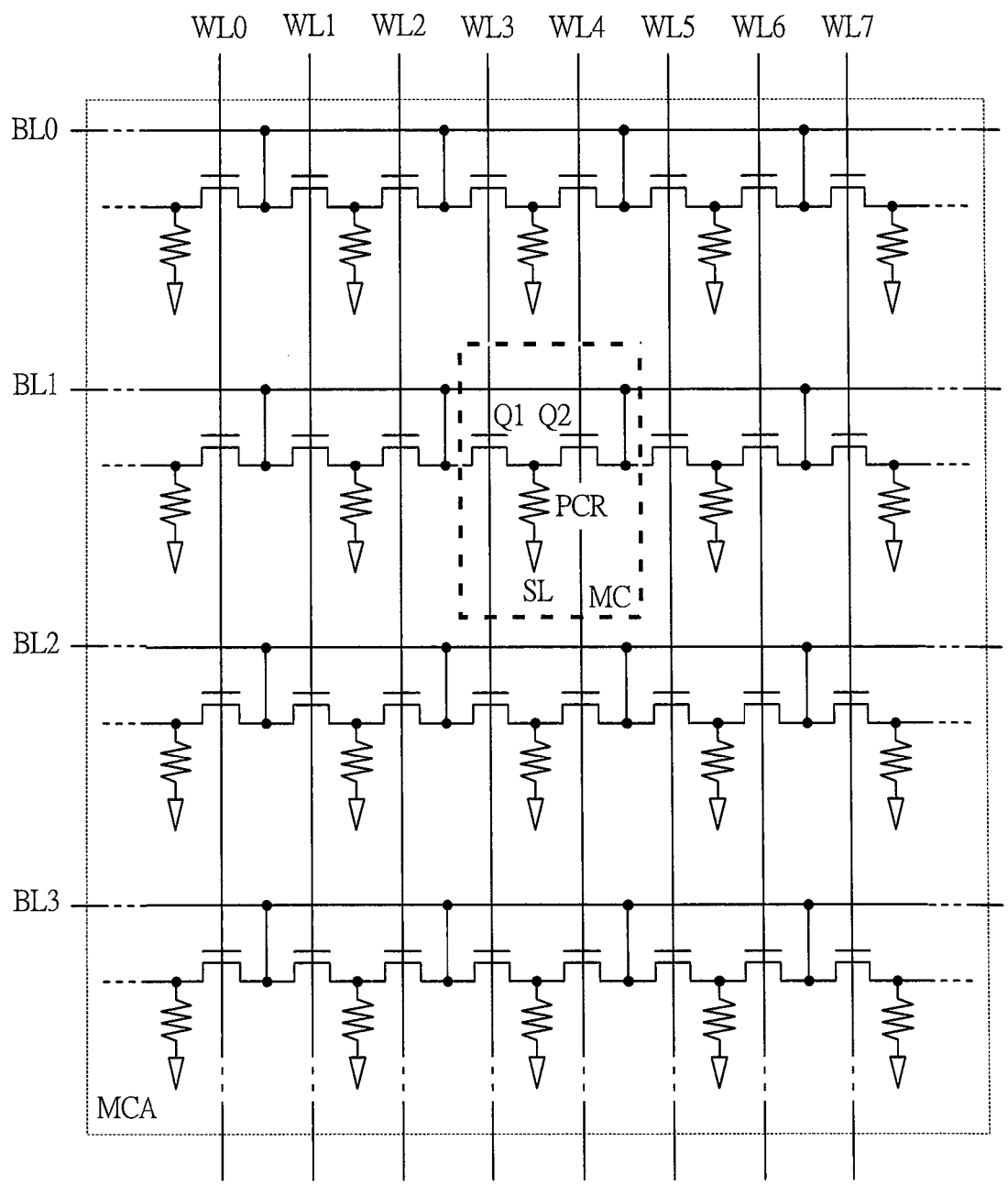
FIG. 3 is a circuit diagram showing one example of a configuration of a memory cell array in a phase change memory in the semiconductor device according to the first embodiment of the present invention.

As show in FIG. 3, the memory cell MC has memory cell transistors Q1 and Q2 connected in series and a phase change element PCR whose one end is connected to an intermediate node between the memory cell transistors Q1 and Q2. The memory cell transistors Q1 and Q2 may be NMOS transistors or PMOS transistors. In this configuration, the phase change element PCR is disposed on the source contact SC in FIG. 1 and FIG. 2 as described above. Sectional configurations thereof are shown in FIGS. 33 to 35, FIGS. 37 to 39, FIGS. 41 to 43, or the like as described above.

The gates of the memory cell transistors Q1 and Q2 are connected to word lines WL3 and WL4 adjacent thereto, respectively. The source or the drain of the memory cell transistor Q1 to which the phase change element PCR is not connected is connected to a bit-line BL1 via a bit-line contact BC. As understood from FIG. 1, FIG. 2, and FIG. 3, the bit-line contact BC is shared by the adjacent memory cell transistors.

Similarly, the source or the drain of the memory cell transistor Q2 to which the phase change element PCR is not connected is connected to the bit-line BL1 via a bit-line contact BC different from that of the memory cell transistor Q1, and the bit-line contact BC is shared by the adjacent memory cell transistors. A side of the phase change element PCR to which the memory cell transistors Q1 and Q2 are not connected is connected to the source electrode SL.

The wiring structure of the source electrode SL may be configured using a plate disposed on the memory cell array MCA as shown in FIG. 33 to FIG. 35 and FIG. 37 to FIG. 39 described above or may be configured as a shared line to which the memory cells MC arranged in the bit-line BL direction or in the word line WL direction are connected as shown in FIG. 41 to FIG. 43. When the source electrode SL is configured on the memory cell array MCA using a common plate, since it is unnecessary to perform fine processing on the memory cell array MCA, the process is facilitated. Also, since parasitic capacitance is large, such an advantage can be obtained that power source fluctuation of the source electrode can be suppressed and power source nose which causes a problem at the time of operation can be reduced.

On the other hand, when the source electrode SL is configured using a wire to which the memory cells MC arranged in the bit-line BL direction or the word line WL direction are mutually connected, a wire capacitance of each source electrode SL is reduced compared with that in the plate configuration. Therefore, when the source electrodes SL are driven, high-speed driving can be facilitated, and high-speed operation and reduction in power consumption can be realized. Especially, since the source electrodes SL are mutually connected for each bit-line BL, such an advantage can be obtained that only specific memory cells MC can be selected in a read or write operation and unnecessary consumption of operation current in non-selected memory cell MS can be reduced. Also, the configuration where the source electrodes SL are mutually connected in parallel to the word line WL is suitable for an operation for rewriting many memory cells MC simultaneously.

Figure 4:
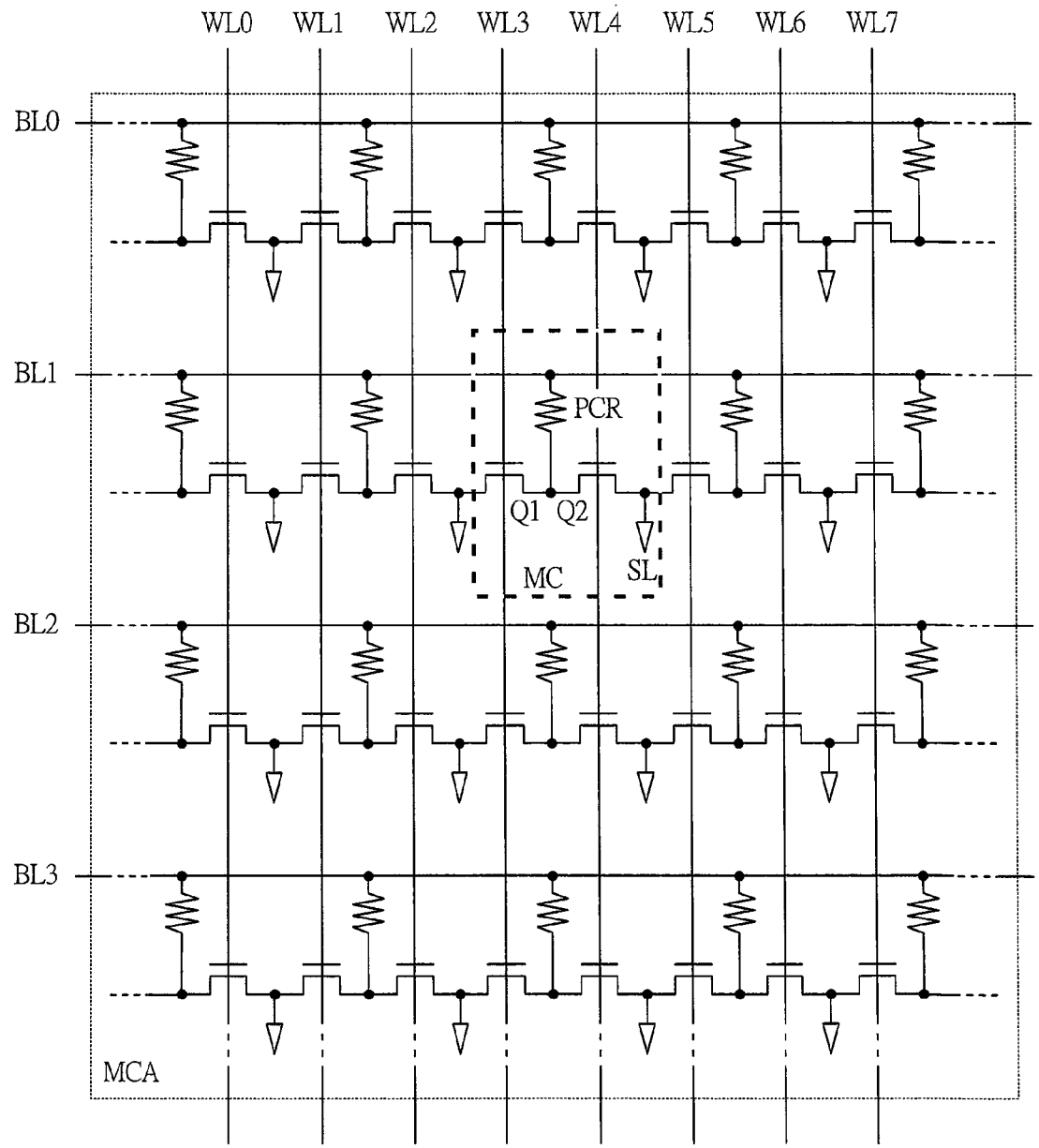
FIG. 4 is a circuit diagram showing one example of a configuration of a memory cell array different from that in FIG. 3 in the phase change memory in the semiconductor device according to the first embodiment of the present invention.

FIG. 4 shows a configuration where the phase change element PCR is disposed on the bit line contact BC and the source electrode SL is disposed on the source contact SC of FIG. 1 and FIG. 2 as described above. The sectional structure thereof is shown in FIG. 45 to FIG. 47, FIG. 49 to FIG. 52, and FIG. 53 to FIG. 55.

Also in this configuration, the memory cell MC is composed of two memory cell transistors Q1 and Q2 and a phase change element PCR. Similar to the case shown in FIG. 3, the transistors Q1 and Q2 may be NMOS transistors or PMOS transistors. In FIG. 4, one end of the phase change element PCR is connected between the memory cell transistors Q1 and Q2 connected in series, and the other end of the phase change element PCR is connected to the bit-line BL1. The sources or the drains of the memory cell transistors Q1 and Q2 to which the phase change element PCR is not connected are connected to the source electrodes SL via different contacts. The configuration of the source electrode SL is similar to that shown in FIG. 3 described above.

Figure 5:
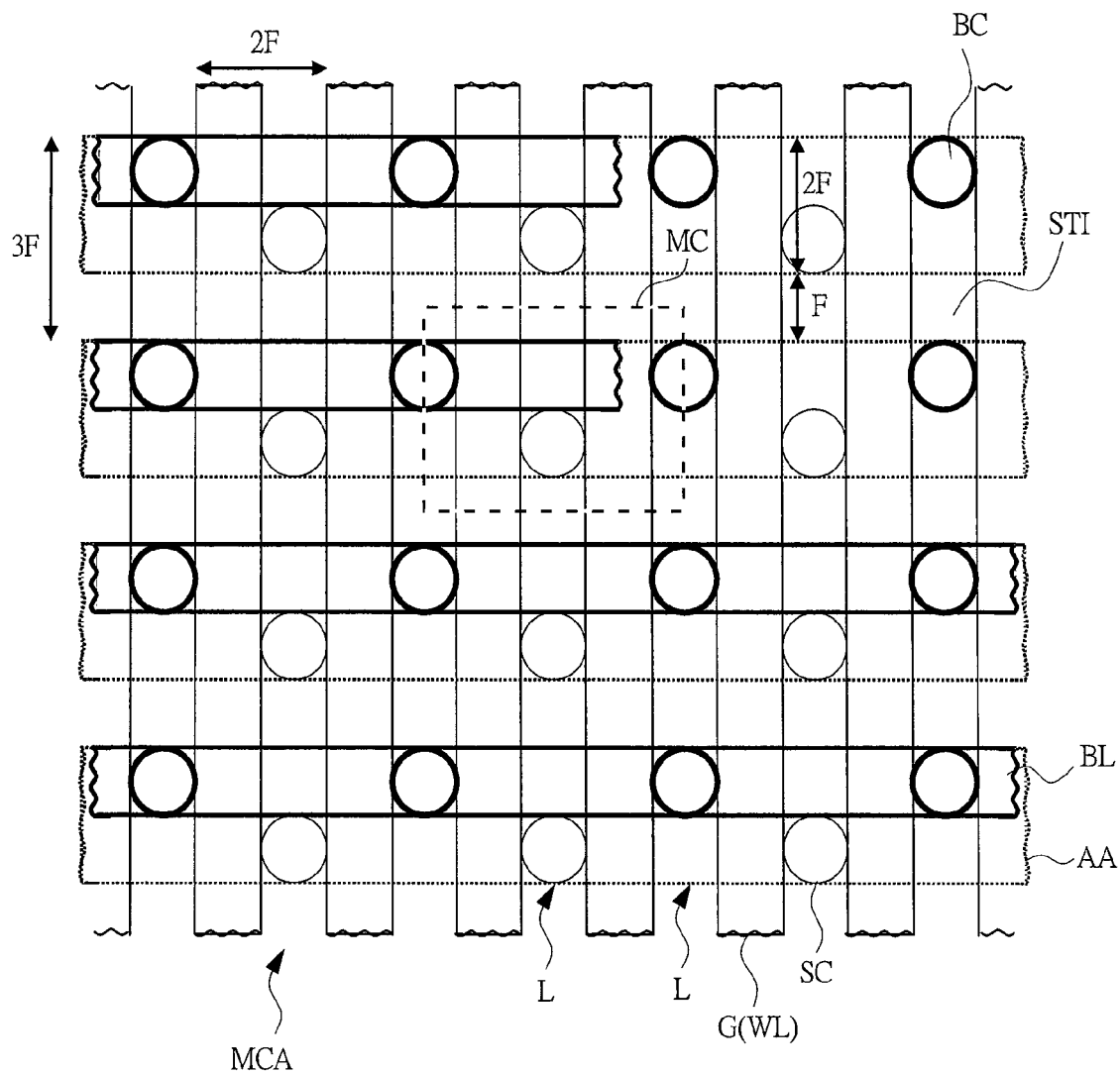
FIG. 5 is a layout diagram showing another modified example of FIG. 1.
Figure 6:
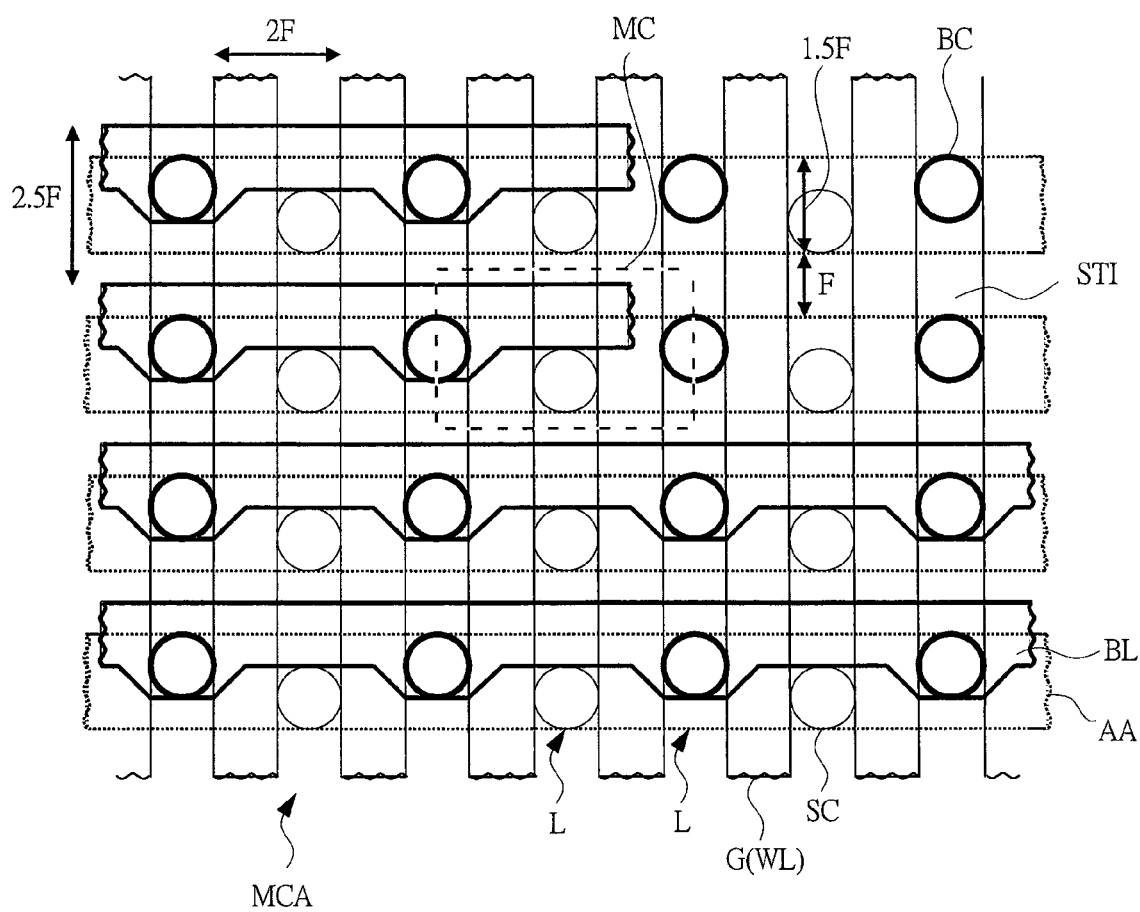
FIG. 6 is a layout diagram showing another modified example of FIG. 1.
Figure 7:
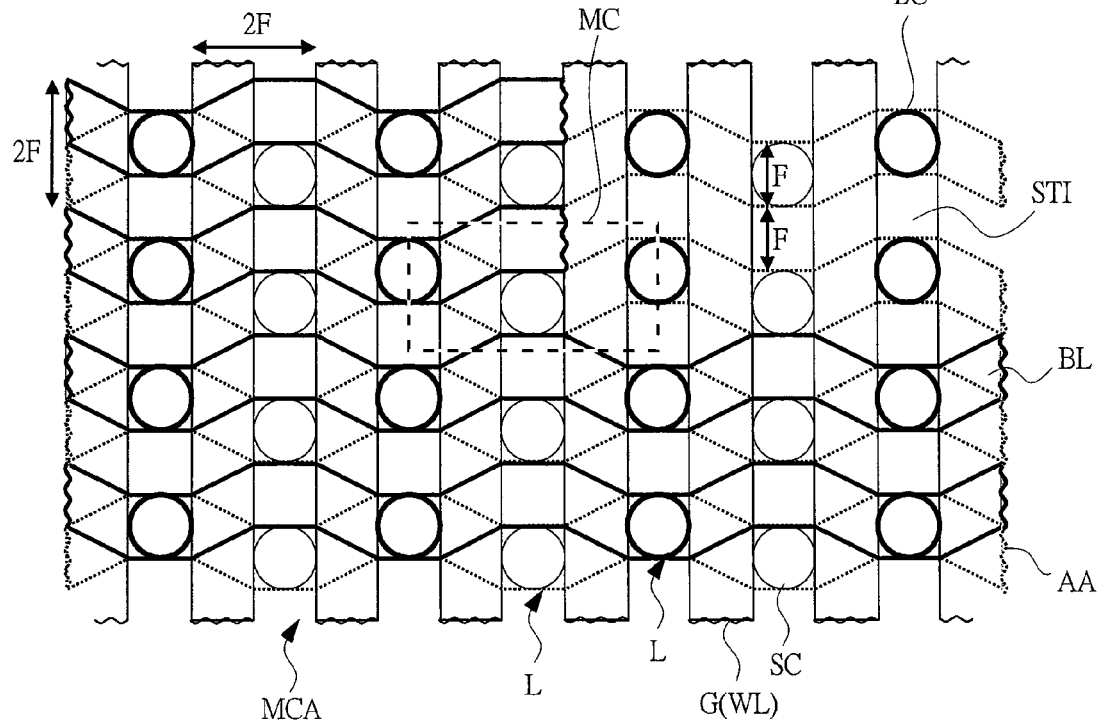
FIG. 7 is a layout diagram showing another modified example of FIG. 1.

Next, modified examples of the layout shown in FIG. 1 and FIG. 2 described above will be described. FIG. 5, FIG. 6, and FIG. 7 are layout diagrams showing modified examples of the layout shown in FIG. 1.

In the layout shown in FIG. 5, a gate width of a memory cell transistor to one phase change element PCR is 4F, and a memory cell area is $12F^2$. A circuit diagram thereof is shown in FIG. 3 or FIG. 4 like that shown in FIG. 1. In this configuration, similar to that shown in FIG. 4, an arrangement pitch of the active region AA is 3F, a width of the active region AA is 2F, and a width of the isolation region STI is F. Therefore, a center line of the bit-line contacts BC and a center line of the source contacts SC on the same bit-line BL are positioned so that their centers are deviated in a word line WL direction by F.

When compared with the layout in FIG. 2, since the bit-line BL is formed in a straight line in this layout, such an advantage can be obtained that resolution and patterning utilizing lithography is facilitated. Also, in this layout, when the source wiring layer SL is disposed above the bit-line BL, it is desirable to form a contact connecting from the source contact SC to the source wiring layer SL by using a contact which is self-aligned to the bit-line BL. Also, application to a configuration where the source wiring layer SL is disposed below the bit-line BL is also possible. The remaining configuration is similar to that shown in FIG. 1.

In the layout shown in FIG. 6, a gate width of a memory cell transistor to one phase change element PCR is 3F, and a memory cell area is $10F^2$. A circuit diagram thereof is shown in FIG. 3 or FIG. 4 like that shown in FIG. 1. In this configuration, arrangement pitches of the bit-line BL and the active region AA are 2.5F, a width of the active region AA is 1.5F, and a width of the isolation region STI is F. Therefore, a center line of the bit-line contacts BC and a center line of the source contacts SC on the same bit-line BL are positioned so that their centers are deviated in a word line WL direction by 0.5F. By forming a shape of one side of the bit-line BL in a rectangular shape, it is possible to bypass the source contacts SC while being connected to the bit-line contacts BC.

In this layout, similar to that in FIG. 5, when the source wiring layer SL is disposed above the bit-line BL, it is desirable to form a contact connecting from the source contact SC to the source wiring layer SL by using a contact which is self-aligned to the bit-line BL. Also, application to a configuration where the source wiring layer SL is disposed below the bit-line BL is also possible. The remaining configuration is similar to that shown in FIG. 1.

In the layout shown in FIG. 7, a gate width of a memory cell transistor to one phase change element PCR is 2F, and a memory cell area is $8F^2$. A circuit diagram thereof is shown in FIG. 3 or FIG. 4 like that shown in FIG. 1. In this configuration, arrangement pitches of the bit-line BL and the active region AA are 2F, a width of the active region AA is F, and a width of the isolation region STI is F. The active region AA is deviated upward and downward by 0.5F at a crossing region with the word line WL and it is formed in a wave shape with a cycle of 4F. Therefore, a center line of the bit-line contacts BC and a center line of the source contacts SC on the same bit-line BL are positioned so that their centers are deviated in the word line direction by 0.5F.

The bit-line BL is also arranged so as to be deviated upward and downward by 0.5F at the crossing region with the word line WL like the active region AA and it is formed in a wave shape with a cycle of 4F. Here, by disposing the bit-line BL in an opposite phase to the active region AA, it becomes possible to bypass the source contacts SC while being connected to the bit-line contacts BC.

In this layout, similar to those shown in FIG. 5 and FIG. 6, when the source wiring layer SL is disposed above the bit-line BL, it is desirable to form a contact connecting from the source contact SC to the source wiring layer SL by using a contact which is self-aligned to the bit-line BL. Also, application to a configuration where the source wiring layer SL is disposed below the bit-line BL is also possible. The remaining configuration is similar to that shown in FIG. 1.

Figure 8:
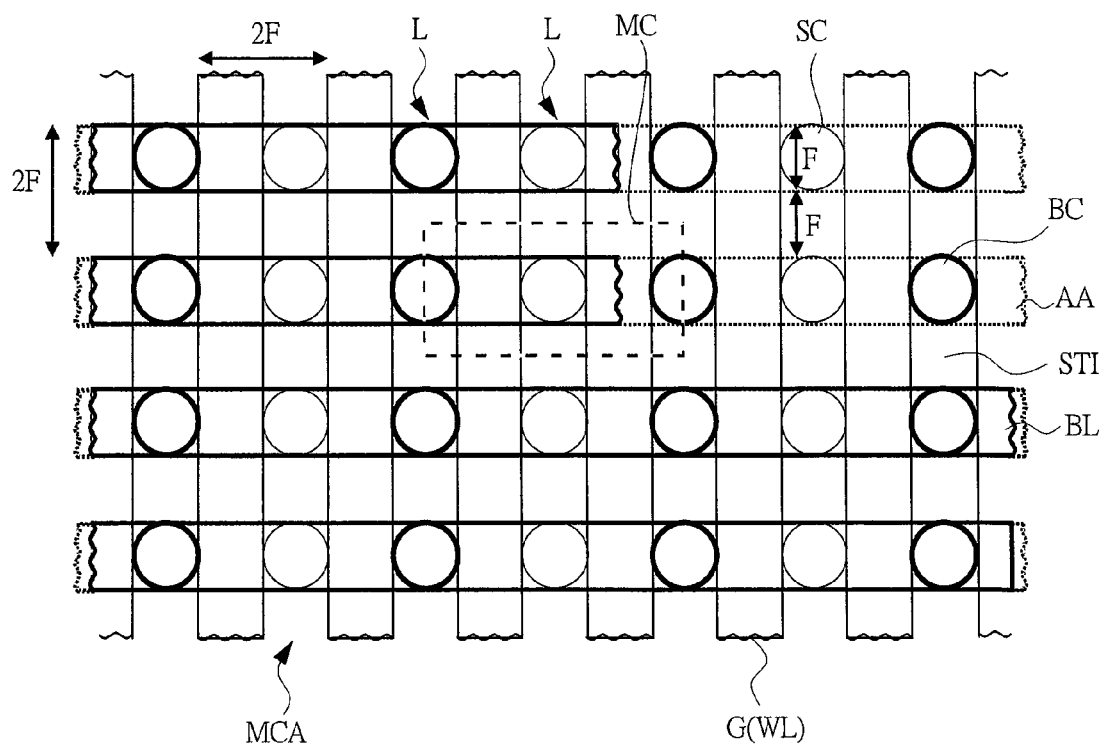
FIG. 8 is a layout diagram showing another modified example of FIG. 1.

In the layout shown in FIG. 8, a gate width of a memory cell transistor to one phase change element PCR is 2F, and a memory cell area is $8F^2$. A circuit diagram thereof is shown in FIG. 3 or FIG. 4 like that shown in FIG. 1. In this configuration, similar to that in FIG. 7, an arrangement pitch of the active region AA is 2F, a width of the active region AA is F, and a width of the isolation region STI is F. When compared with FIG. 7, both the active region AA and the bit-line BL are disposed in a straight line, and the bit-line BL is formed on the active region AA. A center line of the bit-line contacts BC and a center line of the source contacts SC on the same bit-line BL are disposed so that the centers thereof coincide with each other in the word line WL direction. This layout is suitable for the case where the source wiring layer SL is disposed below the bit-line BL. The remaining configuration is similar to that shown in FIG. 1.

Second Embodiment

Figure 9:
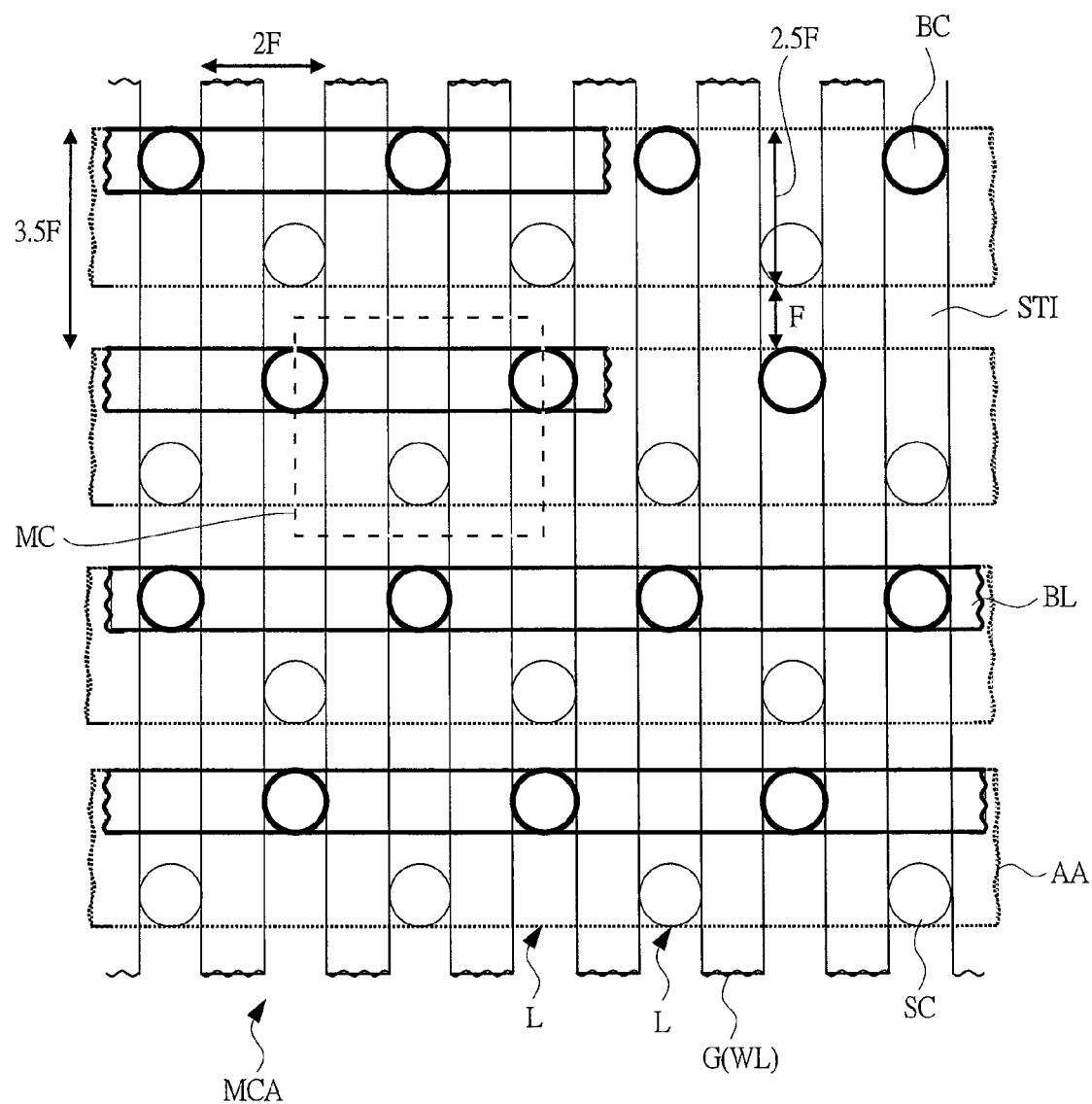
FIG. 9 is a layout diagram showing one example of a configuration of a memory cell array in a phase change memory in the semiconductor device according to a second embodiment of the present invention.

FIG. 9 is a layout diagram showing one example of a memory cell array in a phase change memory in a semiconductor device according to a second embodiment of the present invention. Also in the layout of a memory cell array MCA shown in FIG. 9, similar to the case shown in FIG. 1, one memory cell MC is composed of two memory cell transistors and one phase change element PCR (not shown). Further, similar to FIG. 1, a gate width of the memory cell transistor to one phase change element PCR is 5F and a memory cell area is $14F^2$.

Figure 11:
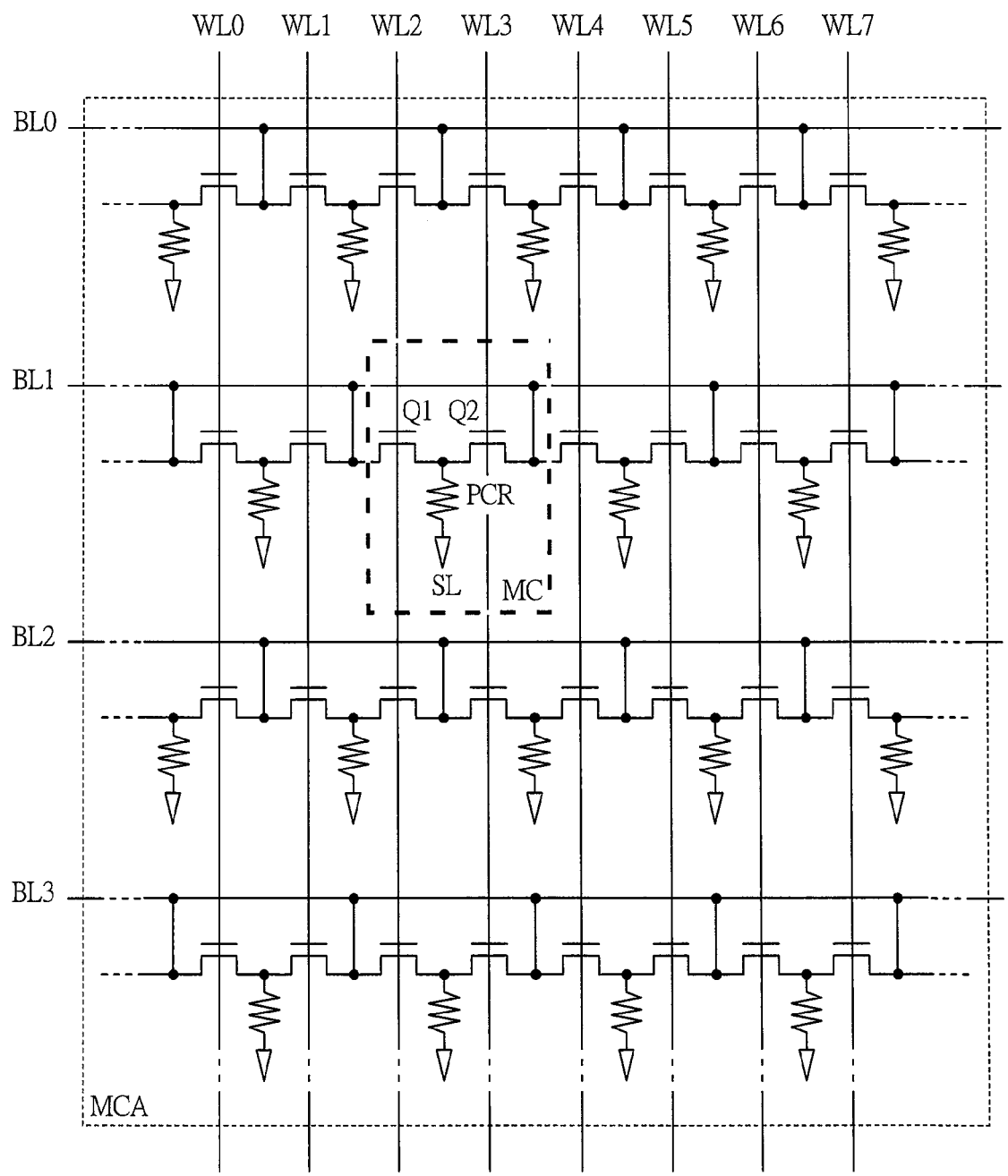
FIG. 11 is a circuit diagram showing one example of a configuration of a memory cell array in the phase change memory in the semiconductor device according to the second embodiment of the present invention.
Figure 12:
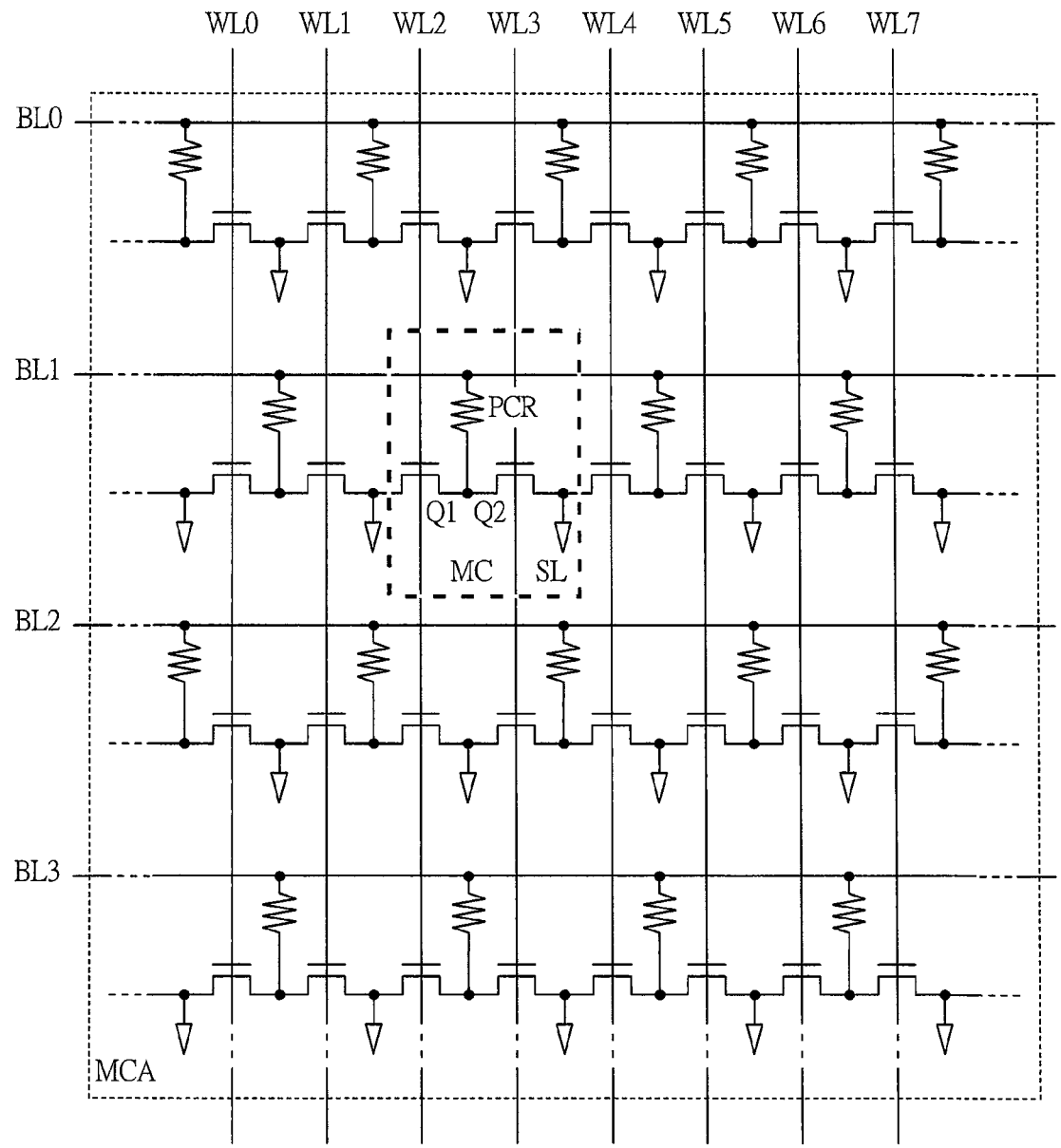
FIG. 12 is a circuit diagram showing one example of a configuration of a memory cell array different from that in FIG. 11 in the phase change memory in the semiconductor device according to the second embodiment of the present invention.

In this configuration, however, arrangement of the bit-line contacts BC and the source contacts SC is shifted in the bit line BL direction by a length corresponding to one diffusion layer L between the active regions AA adjacent to each other in the word line WL direction. Therefore, since a distance from the nearest memory cell MC in the word line WL direction becomes longer than that in FIG. 1, such an advantage can be obtained that the disturbance of a memory cell MC adjacent to a selected memory cell MC by the heat generated by the selected memory cell MC can be reduced. As a circuit diagram corresponding to this layout, the case where the phase change element PCR is positioned on the side of the source contact SC and the case where it is positioned on the side of the bit-line contact BC are shown in FIG. 11 and FIG. 12 described later, respectively.

In FIG. 9, a width (=gate width) of an active region AA (diffusion layer L) is set to 2.5F, a width of an isolation region STI is set to F, a wiring pitch of a gate G is set to 2F, and a wiring pitch of a bit-line BL is set to 3.5F. A memory cell MC includes two memory cell transistors composed of two adjacent gates G, a diffusion layer L positioned between the two gates G, and two diffusion layers L positioned on both sides of the two gates G.

Also, a source contact SC or a bit-line contact BC is provided on the diffusion layer L positioned between the two gates G, and a phase change element PCR is connected through either contact. On the other hand, when the diffusion layer L positioned between the gates G is the source contact, the bit-line contact BC is provided on the two diffusion layers L positioned on both sides of the two gates G, and when the diffusion layer L is the bit-line contact BC, the source contact SC is provided thereon. The two gates G are connected to word lines, respectively.

Note that the arrangement of the memory cell MC shown in FIG. 9 corresponds to the case where the phase change element PCR is connected on the source contact. When the phase charge element is connected on the bit-line contact BC, the arrangement of the memory cell MC similar to the case shown in FIG. 60 described above is adopted. Although the description will be made based on the assumption that the two memory cell transistors are NMOS transistors, it is also possible to use PMOS transistors. However, the use of the NMOS transistors is superior in current drivability and has an advantage that the memory cell area can be reduced.

In the active region AA, bit-line contacts BC and source contacts (memory cell contacts) SC are alternately disposed on the diffusion layer L partitioned by the gate G in the bit-line BL direction. Also, regarding the contacts disposed between the two gates G, the bit-line contacts BC and the source contacts (memory cell contacts) SC are alternately disposed in the word line WL direction. A center line of the bit-line contacts BC and a center line of the source contacts SC on the same bit-line BL are positioned so that their centers are deviated in a word line WL direction by 1.5F. Further, a bit-line BL is disposed on the bit-line contact BC in parallel to the active region AA.

This layout can be applied to both the case where the source wiring layer SL is disposed above the bit-line BL and the case where it is disposed below the bit-line BL. When the source wiring layer SL is disposed above the bit-line BL in this layout, since a margin is formed between the source contact SC and the bit-line BL, the short-circuit between the bit-line BL and the source contact SC can be suppressed. In this layout, the phase change element PCR is disposed in a layer on the bit contact BC between the bit contact BC and the bit-line BL or it is disposed in a layer on the source contact SC between the source contact SC and the source wiring layer SL.

Figure 10:
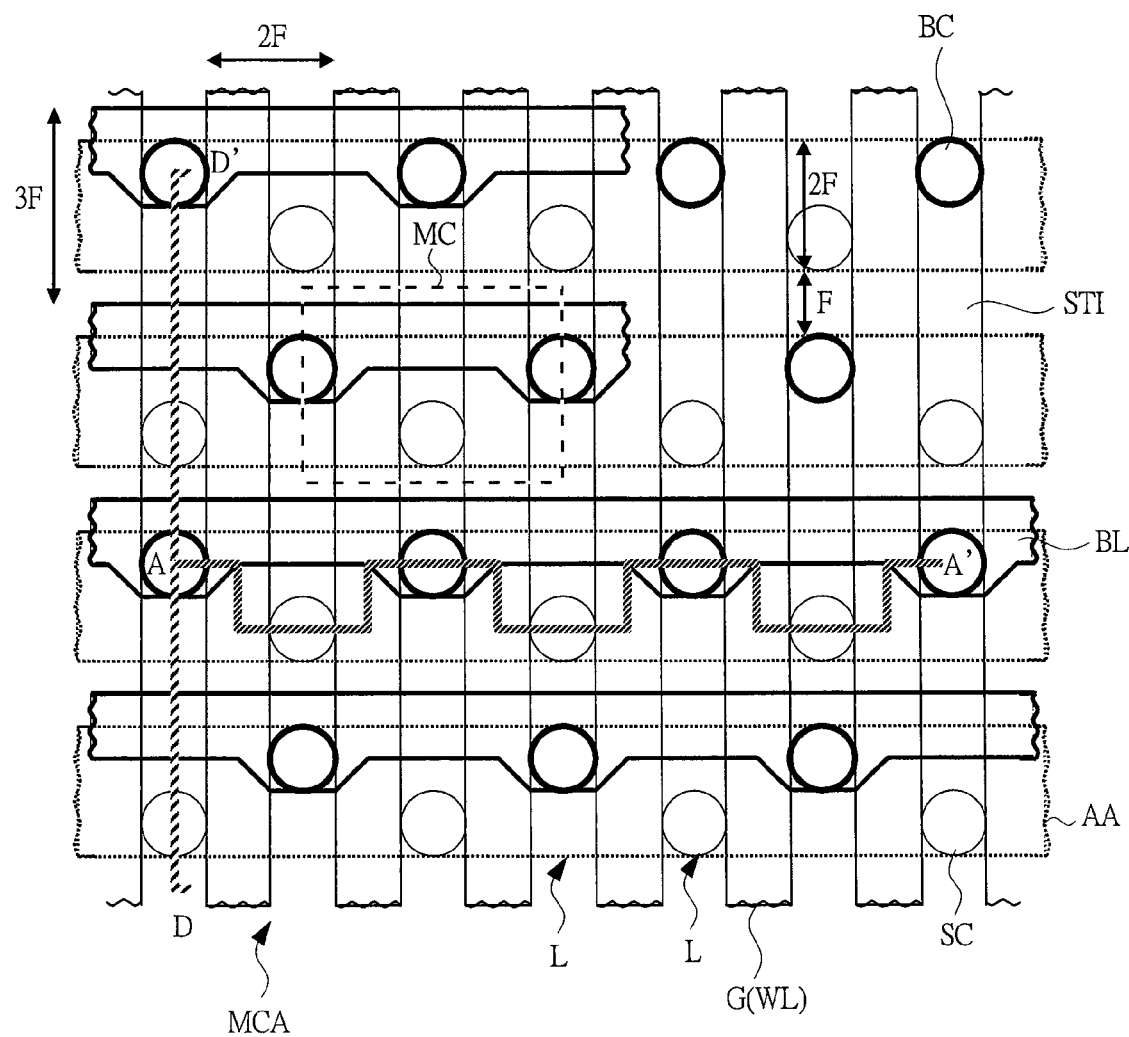
FIG. 10 is a layout diagram showing a modified example of FIG. 9.

FIG. 10 is a layout diagram showing a modified example of FIG. 9. In this configuration, arrangement pitches of the bit-line BL and the active region AA are 3F, a width of the active region AA is 2F, and a width of the isolation region STI is F, similar to the case shown in FIG. 2. Also, similar to the case shown in FIG. 2, the feature of this modified example lies in that one side of the bit-line BL is formed in a rectangular shape so as to be able to secure a space of 0.5F to the source contact SC.

This layout can be applied to both the case where the source wiring layer SL is disposed above the bit-line BL and the case where it is disposed below the bit-line BL. When the source wiring layer SL is disposed above the bit-line BL, since a margin is formed between the source contact SC and the bit-line BL, short-circuit between the bit-line BL and the source contact SC can be suppressed. In this layout, the gate width of the memory cell transistor to one phase change element PCR is 4F, and a memory cell area is $12F^2$. The remaining configuration is similar to that shown in FIG. 9 and a circuit diagram thereof is shown in FIG. 11 or FIG. 12 described later.

Next, one example of a sectional configuration of the layout shown in FIG. 10 will be described.

Figure 36:
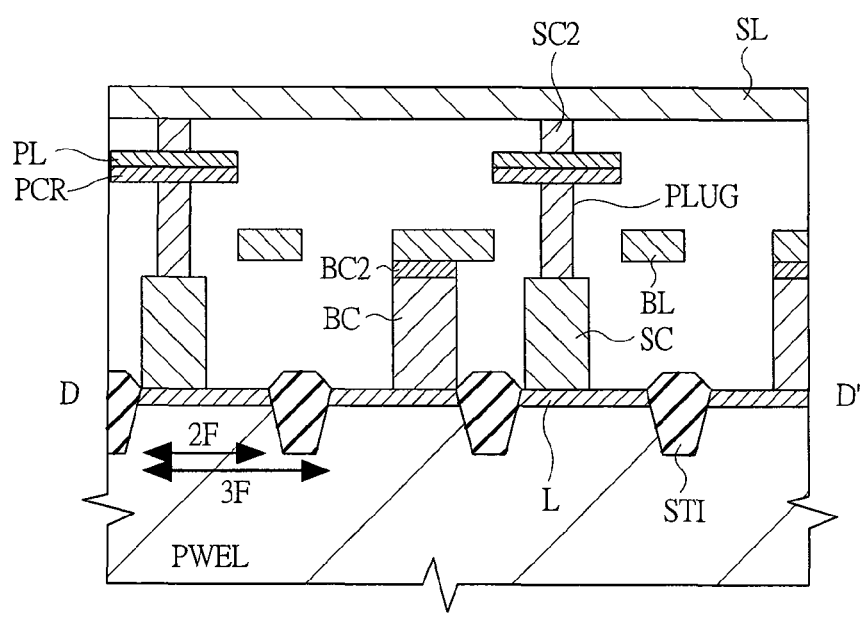
FIG. 36 is a sectional view showing the principal parts of one example of a sectional configuration taken along the line D-D' in FIG. 10.

FIG. 36 is a sectional view showing the principal parts of one example of a sectional configuration taken along the line D-D' in FIG. 10. In this case, a sectional configuration taken along the line A-A' in FIG. 10 is as shown in FIG. 33 described in the first embodiment. In FIG. 36, bit-line contacts BC and source contacts SC are alternately arranged in a row in a section D-D' extending in a direction crossing to a section A-A'. This configuration is a structure example where the phase change element PCR is disposed between the source contact SC and the source wiring layer SL and the phase change elements PCR are separated for each memory element.

This configuration corresponds to an example where the bit-line contact BC and the source contact SC that are contacts to the source/drain region (diffusion layer L) of the memory cell transistor are formed in a self-aligned manner to the gate G. These contacts may be formed through the contact formation utilizing a conventional CMOS process or a contact formation utilizing a self-aligned process to a gate G. Especially, when the contacts are formed through the self-aligned process, even if a distance between the gates G is shortened, the short-circuit between the contact and the gate G can be prevented. For simplification, no interlayer dielectric is shown in respective figures.

As shown in FIG. 36, a second bit-line contact BC2 is disposed on the bit-line contact BC and a bit-line BL is disposed above the second bit-line contact BC2. With respect to the shape of a contact portion between the bit-line contact BC and the diffusion layer L, it is narrowed in a direction perpendicular to the gate G and is widened in a direction parallel to the gate G. By this means, a contact area can be enlarged and low resistance can be achieved. As shown in FIG. 36, the bit-line contact BC is disposed on the diffusion layer L on a D' side.

On the other hand, a lower electrode PLUG which is made of tungsten (W), formed from a stacked structure of W/titanium nitride (TiN), or made of polysilicon to a phase change element PCR is disposed on the source contact SC. The phase change element PCR and the upper electrode PL are disposed on the lower electrode PLUG. The phase change element PCR and the upper electrode PL are separated from an adjacent memory cell MC by an interlayer dielectric, and the upper electrode PL is connected to the source wiring layer SL via the second source contact SC2.

In this manner, since the phase change element PCR in the memory cell MC is electrically and thermally isolated, such an advantage can be obtained that disturbance to an adjacent memory cell MC can be reduced. Also, by connecting the memory cell transistor to the bit-line BL side and connecting the phase change element PCR to the source electrode SL side, such an advantage can be obtained that application of disturbance voltage to a non-selected memory cell MC when the bit-line BL is driven can be suppressed.

Figure 40:
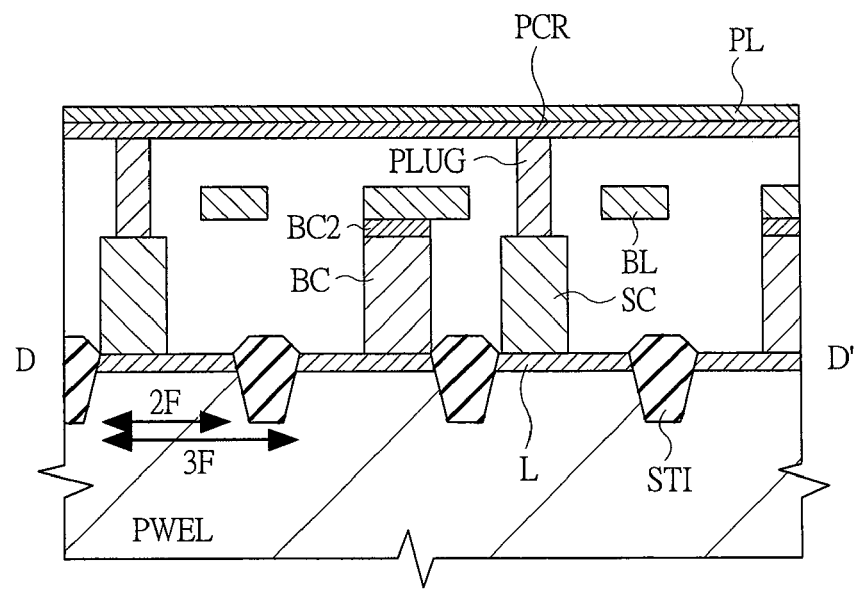
FIG. 40 is a sectional view showing the principal parts of another example of a sectional configuration taken along the line D-D' in FIG. 10.

FIG. 40 is a sectional view showing the principal parts of another example of a sectional configuration taken along the line D-D' in FIG. 10. In this case, a sectional configuration taken along the line A-A' in FIG. 10 is as shown in FIG. 37 described in the first embodiment. The feature of this configuration lies in that the phase change element PCR and the upper electrode PL are disposed above the bit-line BL and are mutually connected on the memory cell array MCA, and the upper electrode PL is utilized as the source electrode SL.

By this means, fine processing to the phase change elements PCR and the upper electrodes PL for each memory cell MC on the memory cell array MCA is not required and the process can be advantageously facilitated. Also, since the source electrode SL is also used as the upper electrode PL in this configuration, it is desirable that the upper electrode PL is used mutually on the memory cell array MCA. The remaining configuration is similar to that shown in FIG. 36 and FIG. 37.

Figure 44:
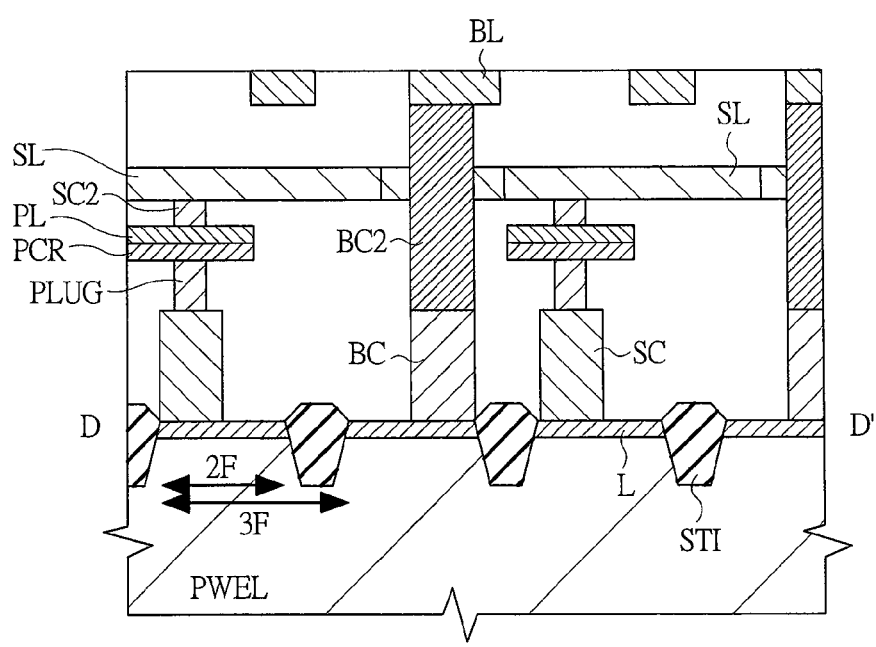
FIG. 44 is a sectional view showing the principal parts of still another example of a sectional configuration taken along the line D-D' in FIG. 10.

FIG. 44 is a sectional view showing the principal parts of still another example of a sectional configuration taken along the line D-D' in FIG. 10. In this case, the sectional configuration taken along the line A-A' in FIG. 10 is as shown in FIG. 41 described in the first embodiment. When compared with the case shown in FIG. 36 and FIG. 40 described above, this configuration shows the case where the phase change element PCR and the upper electrode PL, the second source contact SC2, and the source wiring layer SL are disposed below the bit-line BL.

In this configuration, similar to the configuration in FIG. 36, since the phase change element PCR in the memory cell MC is electrically and thermally isolated by the interlayer dielectric, such an advantage can be obtained that disturbance to an adjacent memory cell MC can be reduced. Also, by disposing the bit-line BL above the source wiring layer SL, a bit-line BL capacitance can be reduced because any adjacent contact is not present like the bit-line BL shown in FIG. 36. Accordingly, such an advantage can be obtained that the high-speed operation and reduction in power consumption can be realized.

FIG. 36 shows a system where the source wiring layers SL are mutually connected on the memory cell array MCA by the memory cells MC arranged in the gate G (word line WL) direction, but application to a system where the source wiring layers SL are mutually connected by the memory cells MC arranged in the bit-line BL direction or a system where the source wiring layers SL are mutually connected on the memory cell array MCA is also possible. Further, the bit-line contacts BC and the second bit-line contacts BC2 can be formed simultaneously. In this case, the process step can be simplified. The remaining configuration is similar to that shown in FIG. 36 and FIG. 41 described above.

Figure 48:
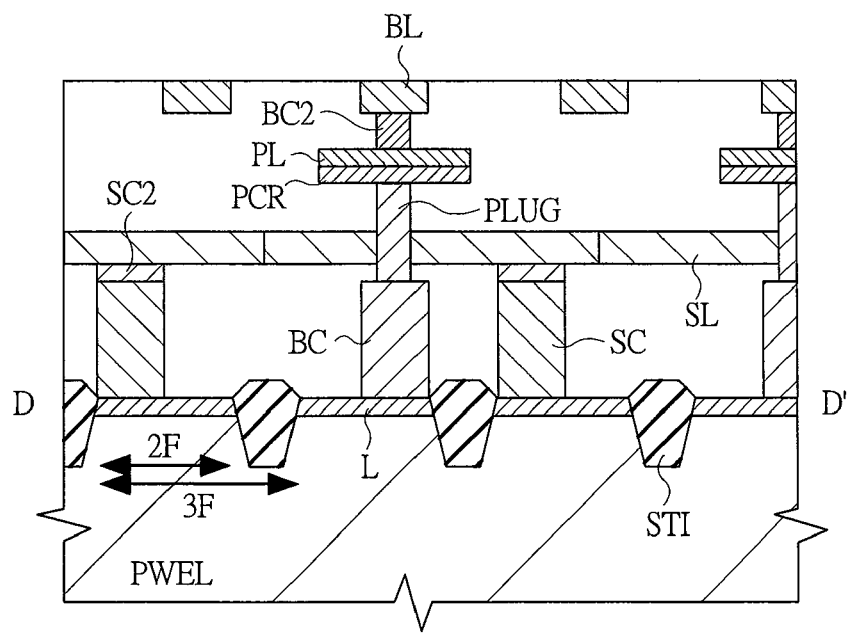
FIG. 48 is a sectional view showing the principal parts of still another example of a sectional configuration taken along the line D-D' in FIG. 10.

FIG. 48 is a sectional view showing the principal parts of still another example of a sectional configuration taken along the line D-D' in FIG. 10. In this case, the sectional configuration taken along the line A-A' in FIG. 10 is as shown in FIG. 45 described in the first embodiment. The feature of this configuration lies in that the phase change element PCR is connected between the bit-line contact BC and the bit-line BL and the source wiring layer SL is disposed below the bit-line BL.

A lower electrode PLUG to the phase change element PCR is disposed on the bit-line contact BC. It is desirable that the lower electrode PLUG is formed to be smaller in sectional area than the bit-line contact BC because of the necessity to reduce a contact area to the phase change element PCR. Further, the phase change element PCR and the upper electrode PL are disposed on the lower electrode PLUG. The second bit-line contact BC2 is disposed on the upper electrode PL and the bit-line BL is connected to the second bit-line contact BC2. On the other hand, the second source contact SC2 is disposed on the source contact SC and the source wiring layer SL is connected to the second source contact SC2.

In this configuration, since the phase change element PCR in the memory cell MC is electrically and thermally isolated by the interlayer dielectric, such an advantage can be obtained that disturbance to an adjacent memory cell MC can be reduced. Also, by disposing the bit-line BL above the source wiring layer SL, a bit-line BL capacitance can be reduced because any adjacent contact is not present like the bit-line BL shown in FIG. 36. Accordingly, such an advantage can be obtained that the high-speed operation and reduction in power consumption can be realized. FIG. 48 shows a system where the source wiring layers SL are mutually connected on the memory cell array MCA, but application to both a system where the source wiring layers SL are mutually connected by the memory cells MC arranged in the word line WL direction or a system where they are mutually connected by the memory cells MC arranged in the bit-line BL direction is also possible. The remaining configuration is similar to that shown in FIG. 36.

Figure 52:
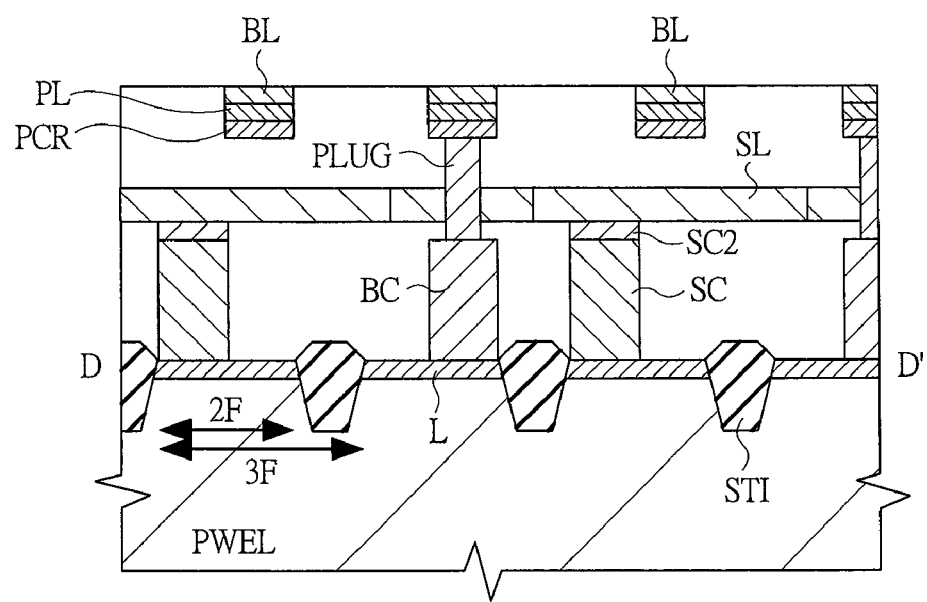
FIG. 52 is a sectional view showing the principal parts of still another example of a sectional configuration taken along the line D-D' in FIG. 10.

FIG. 52 is a sectional view showing the principal parts of still another example of a sectional configuration taken along the line D-D' in FIG. 10. In this case, the sectional configuration taken along the line A-A' in FIG. 10 is as shown in FIG. 49 described in the first embodiment. In this configuration, the phase change element PCR is connected between the bit-line contact BC and the bit-line BL and the phase change elements PCR are continuously disposed in the bit-line BL direction. The feature of this example lies in that the source wiring layer SL is disposed below the wiring layer of the bit-line BL.

A lower electrode PLUG to the phase change element PCR is disposed on the bit-line contact BC. It is desirable that the lower electrode PLUG is formed to be smaller in sectional area than the bit-line contact BC because of the necessity to reduce a contact area to the phase change element PCR. Further, the phase change element PCR, the upper electrode PL, and the bit-line BL are disposed on the lower electrode PLUG. On the other hand, the second source contact SC2 is disposed on the source contact SC. The source wiring layer SL is disposed on the second source contact SC2.

In this configuration, since an arrangement pattern of the phase change element PCR and the upper electrode PL is equal to that of the bit-line BL, a process step can be simplified. Also, since the phase change element PCR is electrically and thermally isolated between the adjacent bit-lines BL by the interlayer dielectric, such an advantage can be obtained that disturbance to an adjacent memory cell MC on the same word line can be reduced. Further, by disposing the bit-line BL above the source wiring layer SL, a bit-line BL capacitance can be reduced because any adjacent contact is not present like the bit-line BL shown in FIG. 36. Accordingly, such an advantage can be obtained that the high-speed operation and reduction in power consumption can be realized.

FIG. 52 shows a system where the source wiring layers SL are mutually connected on the memory cell array MCA, but application to a system where the source wiring layers SL are mutually connected by the memory cells MC arranged in the word line WL direction or a system where they are mutually connected by the memory cells MC arranged in the bit-line BL direction is also possible. Also, in FIG. 52, the source contact SC and the second source contact SC2 are used for the connection of the diffusion layer L and the source wiring layer SL. However, layers of the source wiring layer SL to the diffusion layer L can be formed in one step. In this case, such an advantage can be obtained that a process step is simplified. The remaining configuration is similar to that shown in FIG. 36, FIG. 49, and the like.

Figure 56:
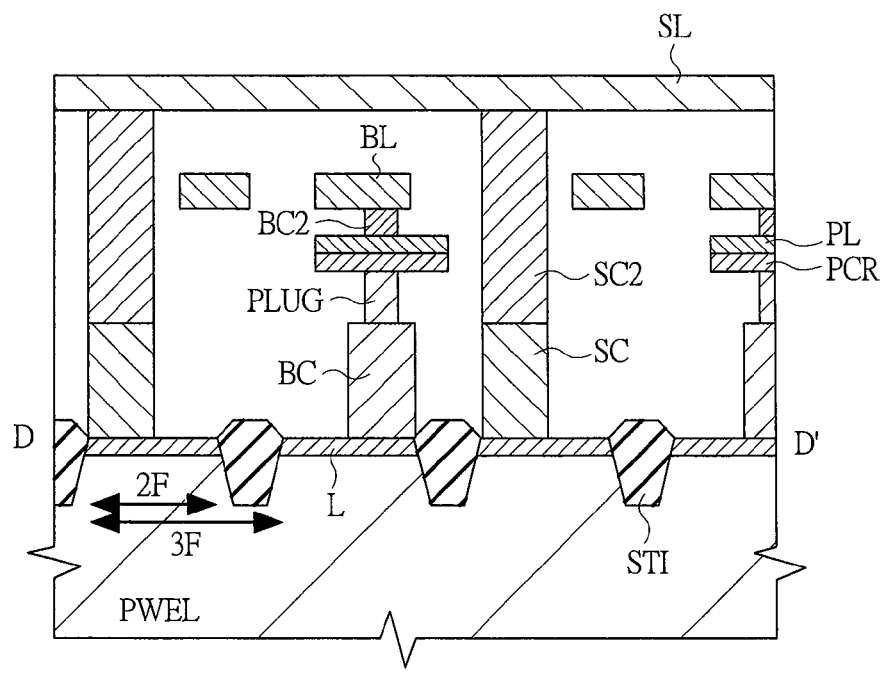
FIG. 56 is a sectional view showing the principal parts of still another example of a sectional configuration taken along the line D-D' in FIG. 10.
Figure 57:
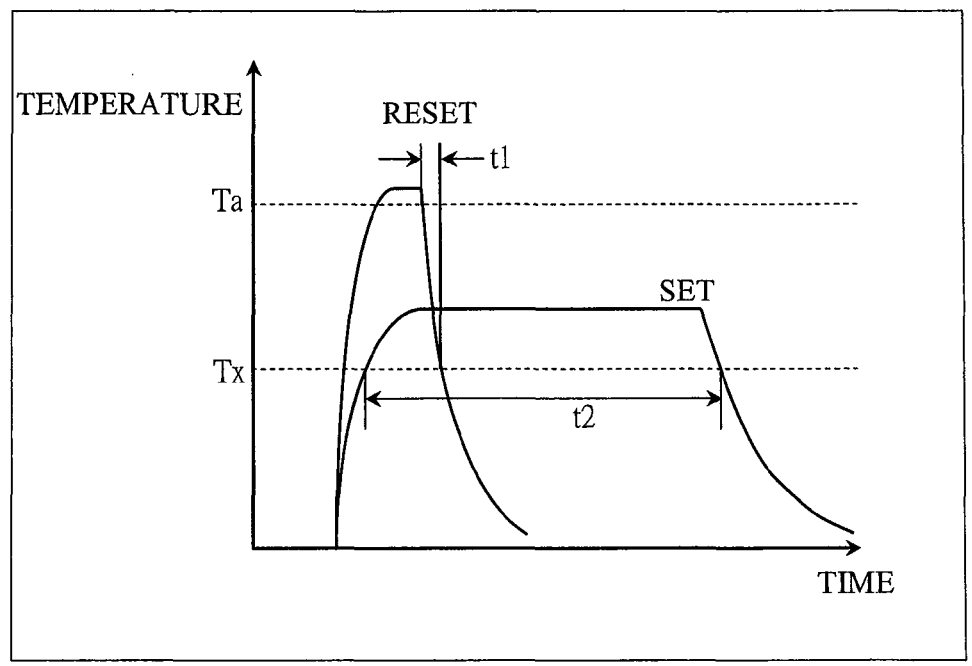
FIG. 57 is an explanatory diagram of a rewrite operation pulse of a phase change element.
Figure 58:
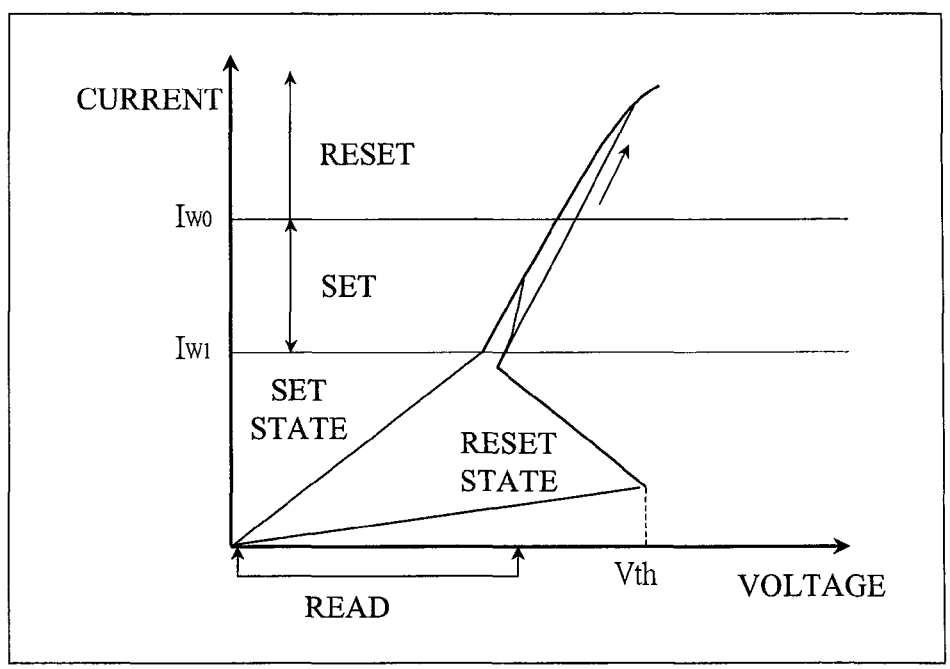
FIG. 58 is a diagram showing a current-voltage characteristic of a phase change element.

FIG. 56 is a sectional view showing the principal parts of still another example of a sectional configuration taken along the line D-D' in FIG. 10. In this case, the sectional configuration taken along the line A-A' in FIG. 10 is as shown in FIG. 53 described in the first embodiment. The feature of this configuration lies in that the phase change element PCR is connected between the bit-line contact BC and the bit-line BL and the source wiring layer SL is disposed above the bit-line BL.

A lower electrode PLUG to the phase change element PCR is disposed on the bit-line contact BC. It is desirable that the lower electrode PLUG is formed to be smaller in sectional area than the bit-line contact BC because of the necessity to reduce a contact area to the phase change element PCR. Further, the phase change element PCR and the upper electrode PL are disposed on the lower electrode PLUG. The bit-line BL and the upper electrode PL are connected by the second bit-line contact BC2. In this configuration, since the phase change element PCR in the memory cell MC is electrically and thermally isolated by the interlayer dielectric, the second source contact SC2, and the like, such an advantage can be obtained that disturbance to an adjacent memory cell MC can be reduced.

FIG. 56 shows a system where the source wiring layers SL are mutually connected on the memory cell array MCA, but application to a system where the source wiring layers SL are mutually connected by the memory cells MC arranged in the word line WL direction or a system where they are mutually connected by the memory cells MC arranged in the bit-line BL direction is also possible. Especially, when the source wiring layer SL is mutually connected by the memory cells on the same word line WL or on the same bit-line BL, a capacitance of the source wiring layer SL can be reduced. Therefore, application to an operation system for driving the source wiring layer SL is facilitated. The remaining configuration is similar to that in FIG. 36 described above.

Next, examples of circuit diagrams corresponding to the layouts shown in FIG. 9 and FIG. 10 described above will be described with reference to FIG. 11 and FIG. 12. FIG. 11 is a circuit diagram showing one example of a circuit of a memory cell array in a phase change memory in a semiconductor device according to the second embodiment of the present invention. FIG. 12 is a circuit diagram showing one example of a circuit of a memory cell array different from that shown in FIG. 11 in the phase change memory in the semiconductor device according to the second embodiment of the present invention.

First, in FIG. 11, a configuration of one memory cell MC is similar to that shown in FIG. 3 described above. That is, each memory cell MC in the memory cell array MCA includes: two memory cell transistors Q1 and Q2 in which two adjacent word lines are used as respective gates thereof, one ends of sources/drains thereof are mutually connected, and other ends of the sources/drains thereof are individually connected to the same bit-line BL; and a phase change element PCR which is connected between the mutually-connected one ends of the memory cell transistors and a source electrode SL. Also, the memory cell MC has a configuration where the other ends connected to the bit-line BL are shared with the other ends of memory cell transistors in an adjacent memory cell MC on the same bit-line.

However, when compared with the circuit shown in FIG. 11, arrangement of a memory cell MC positioned between adjacent bit-lines BL is shifted by a length corresponding to one word line WL in the circuit shown in FIG. 11. That is, in the bit-line BL1, word lines WL2 and WL3 are connected to one memory cell MC, but word lines WL3 and WL4 are connected to the same memory cell MC in the bit-line BL2.

Note that this configuration is obtained by disposing the phase change element PCR on the source contact SC in FIG. 9 and FIG. 10. Also, similar to FIG. 3, a wiring arrangement of the source electrode SL is not shown, but the source electrode SL may be configured utilizing a plate disposed on the memory cell array MCA or it may be configured as a common line to which the memory cells MC disposed in the word line WL direction are connected. An advantage of each configuration is similar to that in the case shown in FIG. 3 described above.

Next, in FIG. 12, a configuration of one memory cell MC is similar to that shown in FIG. 4 described above. That is, each memory cell MC in the memory cell array MCA includes: two memory cell transistors Q1 and Q2 in which two adjacent word lines are used as respective gates thereof, one ends of sources/drains thereof are mutually connected, and other ends of the sources/drains thereof are individually connected to the source electrode SL; and a phase change element PCR which is connected between the mutually-connected one ends of the memory cell transistors and a bit-line BL. Also, the memory cell MC has a configuration where the other ends connected to the source electrode SL are shared with the other ends of memory cell transistors in an adjacent memory cell MC on the same bit-line.

Also in this configuration, similar to that in FIG. 11, arrangement of the memory cells MC between adjacent bit-lines BL is shifted by a length corresponding to one word line WL. Also, the configuration of the source electrode SL is similar to that shown in FIG. 11 described above.

Note that this configuration is obtained by disposing the phase change element PCR on the bit-line contact BC in FIG. 9 and FIG. 10. Further, in FIG. 11 and FIG. 12, the memory cell transistors Q1 and Q2 are composed of NMOS transistors, but they may be composed of PMOS transistors.

Figure 13:
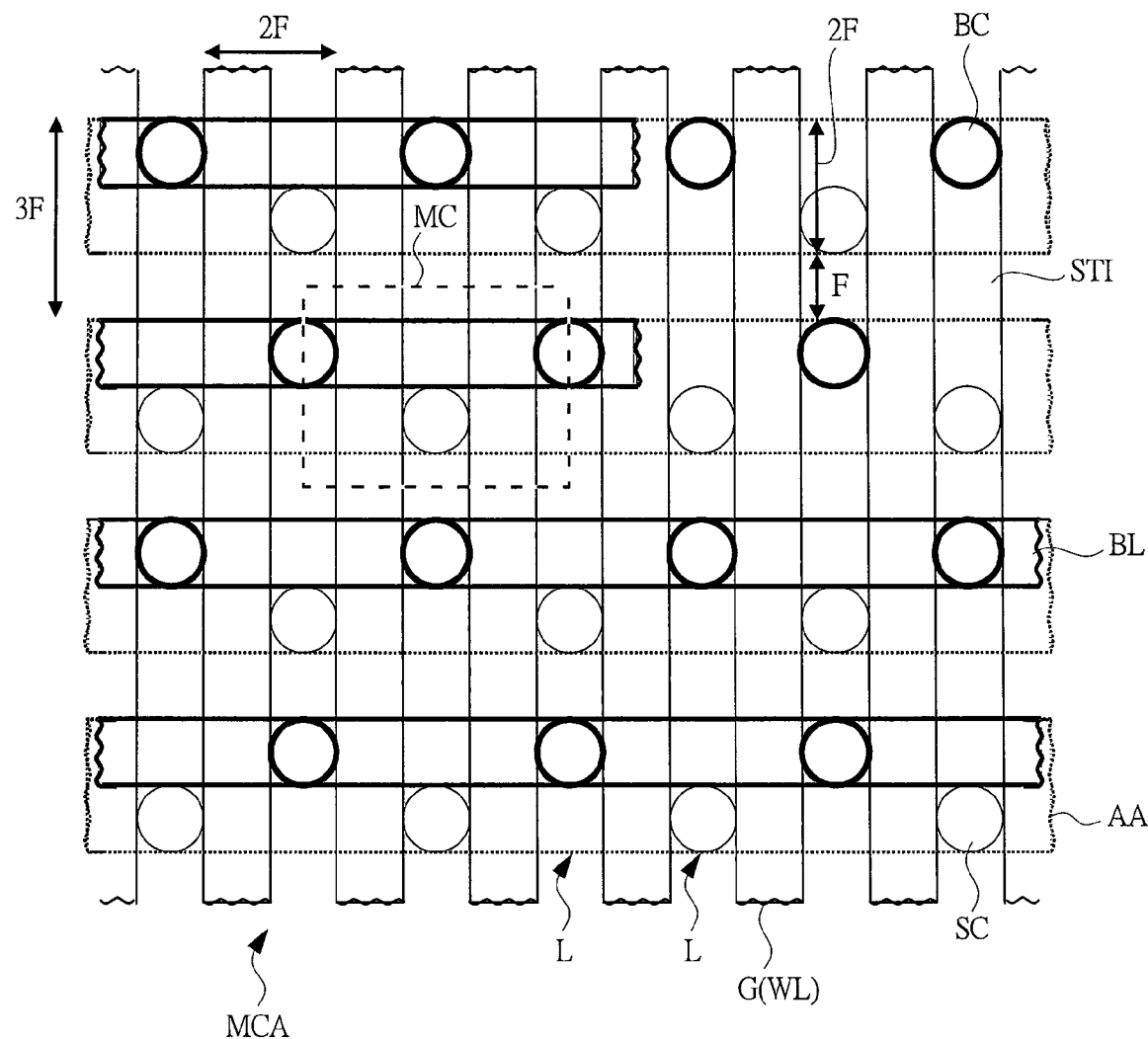
FIG. 13 is a layout diagram showing another modified example of FIG. 9.
Figure 14:
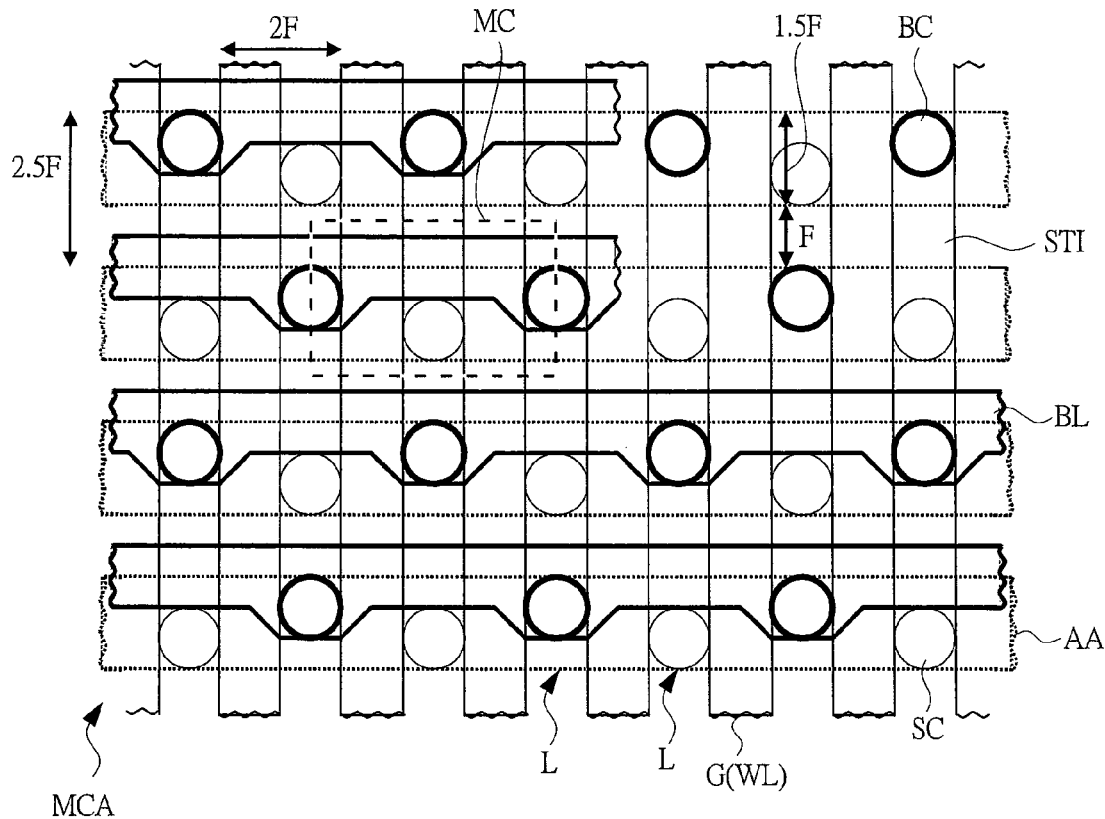
FIG. 14 is a layout diagram showing another modified example of FIG. 9.
Figure 15:
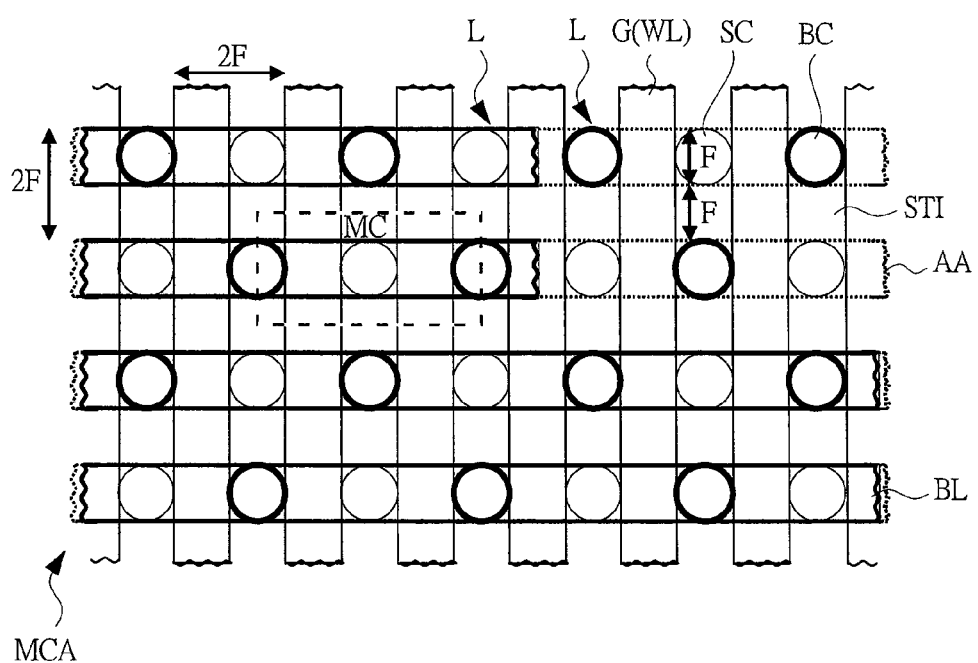
FIG. 15 is a layout diagram showing another modified example of FIG. 9.

Next, examples obtained by further modifying the layouts shown in FIG. 9 and FIG. 10 will be described. FIG. 13, FIG. 14, and FIG. 15 are layout diagrams showing other modified examples of FIG. 9.

In the layout shown in FIG. 13, similar to that in FIG. 10 described above, arrangement pitches of the bit-line BL and the active region AA are 3F, a width of the active region AA is 2F, and a width of the isolation region STI is F. However, different form that in FIG. 10, this layout has a feature that a shape of a side of the bit-line BL is formed in a straight line.

This layout can be also applied to both the case where the source wiring layer SL is disposed above the bit-line and the case where it is disposed below the bit-line. When the source wiring layer SL is disposed above the bit-line, it is desirable to form a contact connecting from the source contact SC to the source wiring layer SL by using a contact self-aligned to the bit-line BL. This is not always true of the case where the source wiring layer SL is disposed below the bit-line BL. Also in this configuration, similar to the case shown in FIG. 10 described above, a gate width of the memory cell transistors to one phase change element PCR is 4F and a memory cell area is $12F^2$. The remaining configuration is similar to that shown in FIG. 9 and a circuit diagram thereof is shown in FIG. 11 or FIG. 12.

In the layout shown in FIG. 14, arrangement pitches of the bit-line BL and the active region AA are 2.5F, a width of the active region AA is 1.5F, and a width of the isolation region STI is F. The feature of this layout lies in that a side on one side of the bit-line BL is formed in a rectangular shape so that the bit-line BL bypasses the source contact SC.

This layout can be applied to both the case where the source wiring layer SL is disposed above the bit-line BL and the case where it is disposed below the bit-line BL. When the source wiring layer SL is disposed above the bit-line, it is desirable to form a contact connecting from the source contact SC to the source wiring layer SL by using a contact self-aligned to the bit-line BL. This is not true of the case where the source wiring layer SL is disposed below the bit-line BL. In this configuration, a gate width of the memory cell transistors to one phase change element PCR is 3F and a memory cell area is $10F^2$. The remaining configuration is similar to that shown in FIG. 9 and a circuit diagram thereof is shown in FIG. 11 or FIG. 12.

In the layout shown in FIG. 15, arrangement pitches of the bit-line BL and the active region AA are 2F, a width of the active region AA is F, and a width of the isolation region STI is F. In this layout, since both the active region AA and the bit-line BL are arranged in a straight line, a process such as lithography can be advantageously facilitated. Also, since either of the source contact SC and the bit-line contact BC is disposed in all of the diffusion regions L having an area $F^2$ surrounded by the gate G and the isolation region STI, a mask pattern used when the contacts are formed and a mask pattern used when the diffusion layers L are formed can be shared in a memory cell MC portion.

This configuration can be applied to the case where the source wiring layer SL is disposed below the bit-line BL. Further, in this configuration, the gate width of the memory cell transistors to one phase change element PCR is 2F and a memory cell area is $8F^2$. The remaining configuration is similar to that shown in FIG. 9 and a circuit diagram thereof is shown in FIG. 11 or FIG. 12.

Third Embodiment

In a third embodiment, a whole configuration and an operation of a semiconductor device including the memory cell array described in the first and second embodiments will be described. Note that the description will be made using the phase change memory as an example.

Figure 16:
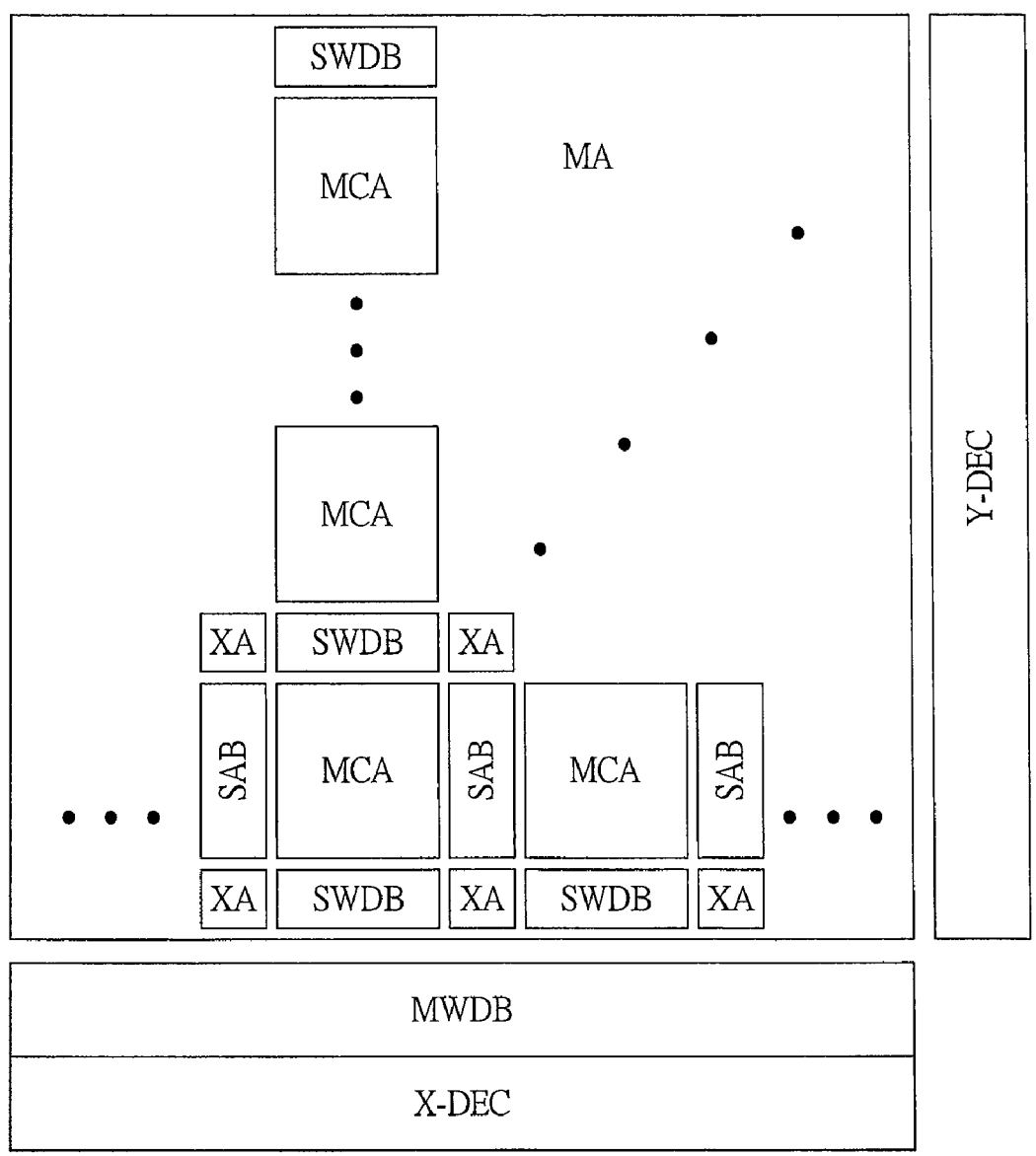
FIG. 16 is a diagram showing a configuration example of a part of blocks of a whole block configuration of a phase change memory including the memory cell array according to the first or second embodiment in a semiconductor device according to a third embodiment of the present invention.

FIG. 16 is a diagram showing a configuration example of a part of blocks in a whole block configuration of a phase change memory including the memory cell array of the first or second embodiment in a semiconductor device according to the third embodiment of the present invention. For example, the semiconductor device shown in FIG. 16 is composed of a memory unit MA, a main word driver block MWDB, a row decoder X-DEC, a column decoder Y-DEC, and others.

The memory unit MA is divided into a plurality of memory cell arrays MCA mainly by sense amplifier blocks SAB and sub-word driver blocks SWDB. The memory cell array MCA includes the configuration as descried in the first and second embodiments.

The sense amplifier block SAB is a circuit block including a plurality of sense amplifier circuits which senses and amplifies data read from a memory cell MC in a memory cell array MCA to a bit-line BL, outputs the same to the outside, and performs a desired write operation to a memory cell MC according to data inputted from the outside. The sub-word driver block SWDB is a circuit block which selects and drives word lines WL connected to respective gates G of the memory cell transistors included in the memory cell MC. Control circuits for the sub-word driver block SWDB and the sense amplifier block SAB, a data input/output circuit, and others are disposed in a crossing region XA between the sub-word driver block SWDB and the sense amplifier block SAB.

The main word driver block MWDB and the row decoder X-DEC are disposed on a side adjacent to the memory unit MA, and the column decoder Y-DEC is disposed on the other side. A main word driver MWD for driving a main word line in a so-called hierarchical word line configuration according to an inputted address is disposed in the main word driver block MWDB. Also, in a non-hierarchical word line configuration, the main word driver block MWDB can be considered as a word driver and the sub-word driver block SWDB can be considered as a contact region with a backing wire of the word line WL.

A driver for outputting a select signal YS for performing input/output to the sense amplifier block SA according to an inputted address and outputting a write enable signal WR/WS at the time of a write operation and the like are disposed on the column decoder Y-DEC.

Figure 17A:
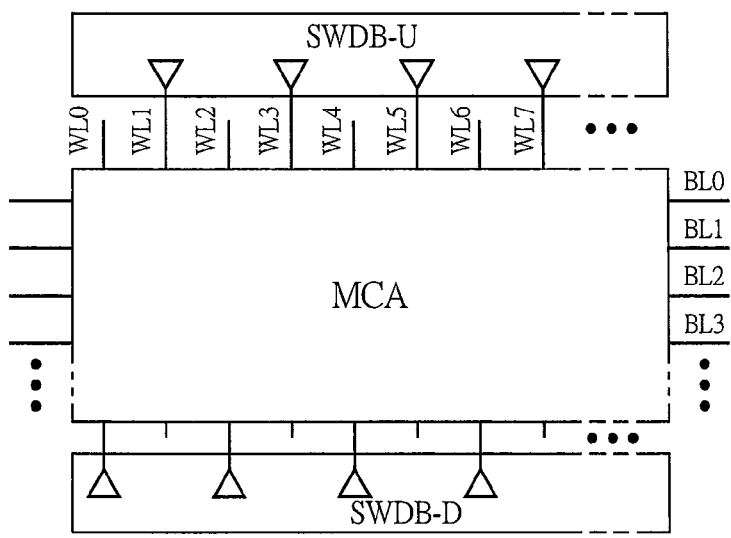
FIG. 17A is a schematic diagram showing one example of a connecting method of a memory cell array and a sub-word driver block in the phase change memory shown in FIG. 16.
Figure 17B:
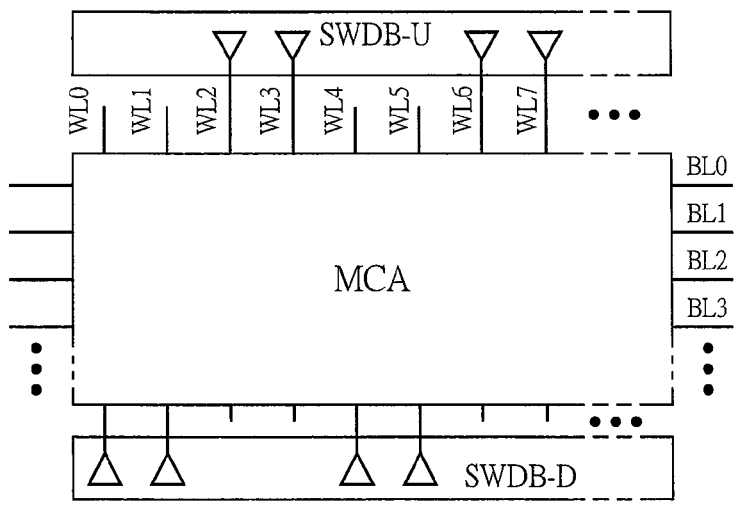
FIG. 17B is a schematic diagram showing another example of a connecting method of a memory cell array and a sub-word driver block in the phase change memory shown in FIG. 16.
Figure 17C:
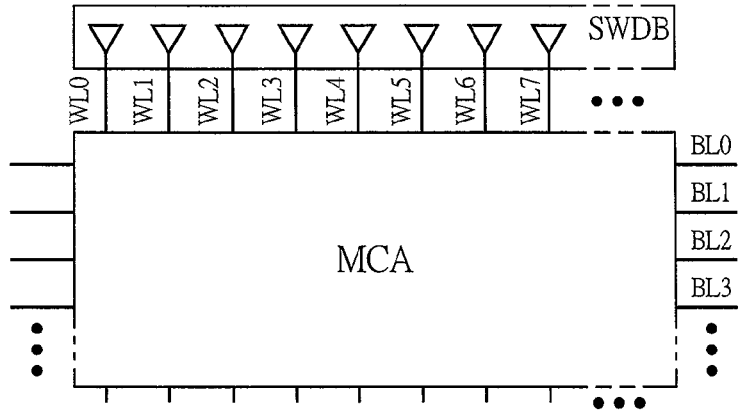
FIG. 17C is a schematic diagram showing still another example of a connecting method of a memory cell array and a sub-word driver block in the phase change memory shown in FIG. 16.

In such a configuration, examples of a connecting method of the memory cell array MCA and the sub-word driver block SWDB are shown in FIG. 17A to FIG. 17A. FIG. 17A to FIG. 17C are schematic diagrams showing examples of a connecting method of a memory cell array and a sub-word driver block in the phase change memory of FIG. 16, and FIG. 17A to FIG. 17C show different connecting methods, respectively.

FIG. 17A shows a configuration where word lines WL0, WL1, WL2, . . . are alternately connected to upper and lower side sub-word driver blocks SWDB-U and SWDB-D. In this figure, even-numbered word lines WL0, WL2, WL4, . . . are connected to the lower side sub-word driver block SWDB-D, and odd-numbered word lines WL1, WL3, WL5, . . . are connected to the upper side sub-word driver block SWDB-U.

In this case, two word lines WL connected to gates G of two memory cell transistors included in one memory cell MC are driven by the upper and lower sub-word driver blocks SWDB-U and SWDB-D regardless of the memory cell arrays MCA of the first and second embodiments to be used. Therefore, such an advantage can be obtained that a difference between a far end and a near end from the sub-word driver block can be reduced in a read operation.

Though being described later in the description of an operation system, when an operation system where different word lines are separately used for a read operation and a write operation is adopted, it is possible to allocate the upper side sub-word driver block SWDB-U to a word driver for the read/write operation and allocate the lower side sub-word driver block SWDB-D to a word driver to a write operation. Therefore, such an advantage can be obtained that wiring of control lines can be facilitated.

FIG. 17B shows a configuration where each two lines of the word lines WL0, WL1, WL2, . . . are alternately connected to the upper and lower sub-word driver blocks SWDB-U and SWDB-D. In this figure, the word lines WL0, WL1, WL4, WL5, . . . are connected to the lower side sub-word driver block SWDB-D, and the word lines WL2, WL3, WL6, WL7, . . . are connected to the upper side sub-word diver block SWDB-U.

When each two word lines are drawn from the memory cell array MCA to the word drivers, it becomes easy to use a phase shift lithography when forming a wiring pattern. In this case, since an optical phase on a mask for patterning the word lines WL to be drawn becomes an opposite phase, such an advantage can be obtained that the breakage and short-circuit at drawn portions can be prevented even in a fine wiring pitch.

When a memory cell array MCA as shown in the first embodiment is used, the gates G of two memory cell transistors in one memory cell MC can be driven by the sub-word driver block SWDB on the same side. Though being described later in the description of an operation system, when an operation system where two transistors are always used in the read/write operation is adopted, since a circuit configuration of the sub-word driver blocks SWDB-U and SWDB-D is simplified as compared with that shown in FIG. 17A described above, such an advantage can be obtained that an area of the sub-word driver block can be reduced.

Further, in FIG. 17B, when a connecting method of word lines is shifted by one to obtain a configuration where, for example, the word lines WL1, WL2, WL5, WL6, . . . are connected to the sub-word driver block SWDB-U and the word lines WL0, WL3, WL4, WL7, WL8, . . . are connected to the sub-word driver block SWDB-D, the gates G of two memory cell transistors in one memory cell MC can be driven by the upper and lower sub-word drivers SWDB-U and SWDB-D, respectively, like the case shown in FIG. 17A. The advantage in this case is similar to that shown in FIG. 17A described above.

Furthermore, when the memory cell array MCA as shown in the second embodiment is used in the configuration shown in FIG. 17B, combinations of word lines WL connected to a memory cell MC are different between adjacent bit-lines BL, and the combination of the word lines WL becomes equal in a bit-line BL and a bit-line BL next to an adjacent bit-line BL. Therefore, the number of bit-lines operated in the memory cell array MCA becomes half in a read operation using two bit-lines simultaneously, and the number of operating cells is reduced and such an advantage can be obtained that concentration of heat causing disturbance is suppressed.

FIG. 17C shows a configuration where all word lines WL are driven by the sub-word driver block SWDB disposed at one end of the memory cell array MCA. In this configuration, a layout pitch of respective word drivers in the sub-word driver block SWD becomes small, but since operation timing is the same even if any word line WL is selected, a timing margin can be reduced, and therefore, this configuration is suitable for high-speed operation.

Figure 18A:
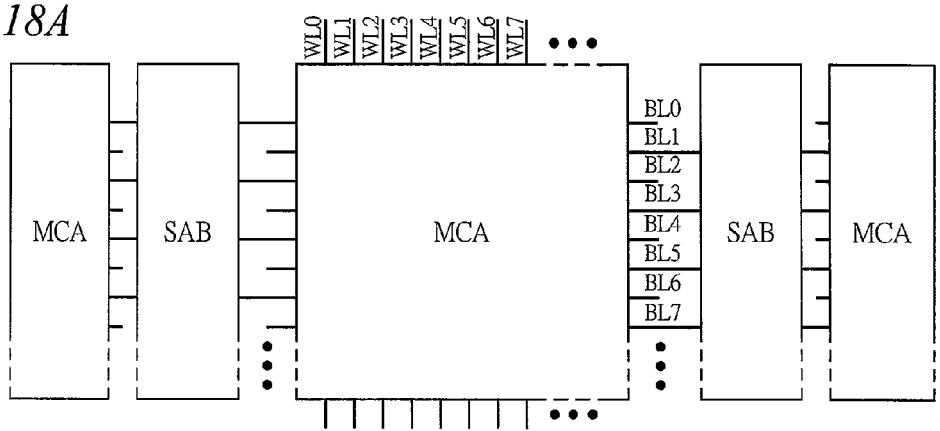
FIG. 18A is a schematic diagram showing one example of a connecting method of a memory cell array and a sense-amplifier block in the phase change memory shown in FIG. 16.
Figure 18B:
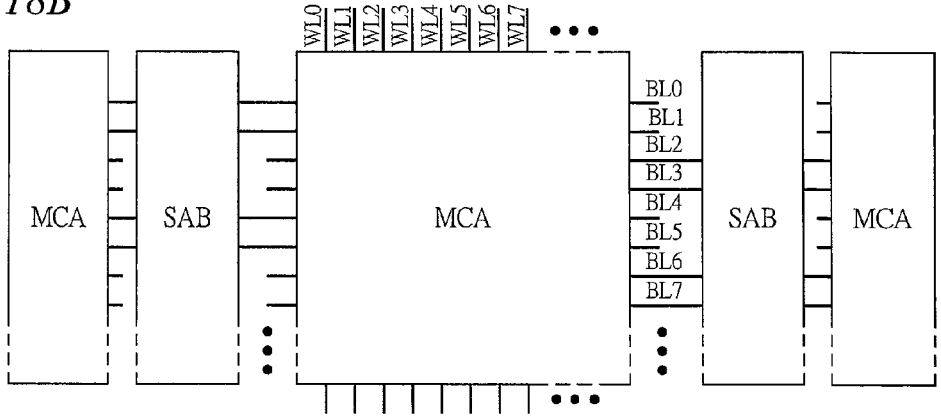
FIG. 18B is a schematic diagram showing another example of a connecting method of a memory cell array and a sense-amplifier block in the phase change memory shown in FIG. 16.
Figure 18C:
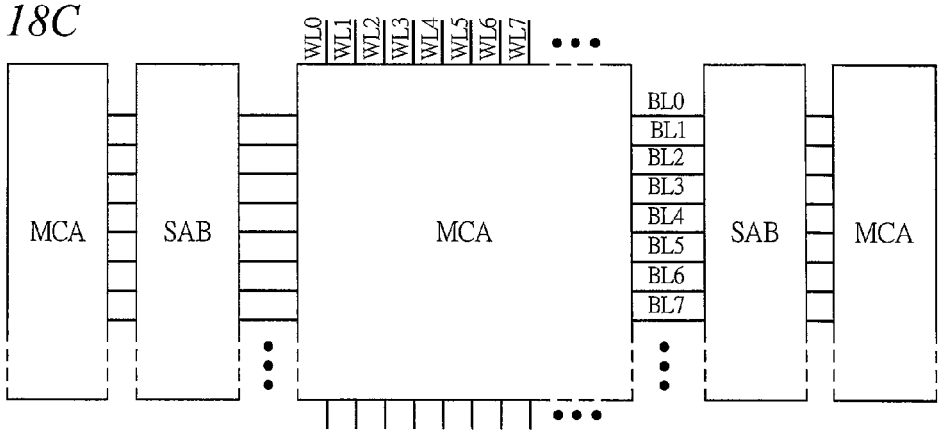
FIG. 18C is a schematic diagram showing still another example of a connecting method of a memory cell array and a sense-amplifier block in the phase change memory shown in FIG. 16.

Next, examples of a connecting method of the memory cell array MCA and the sense amplifier block SAB are shown in FIG. 18A to FIG. 18C. FIG. 18A to FIG. 18C are schematic diagrams showing examples of a connecting method of a memory cell array and a sense amplifier block in a phase change memory, and FIG. 18A to FIG. 18C show different connecting methods, respectively.

FIG. 18A shows a configuration where bit-lines BL0, BL1, BL2, . . . of the memory cell array MCA are alternately drawn to left and right sense amplifier blocks SAB. In this configuration, since the least significant address of the bit-line BL coincides with the sense amplifier block SAB, such an advantage can be obtained that correlation between logical address and physical address is simplified.

Also, when the memory cell array MCA as shown in the first embodiment is used, data is read to the sense amplifier blocks SAB on both sides, which is suitable for outputting many bits. On the other hand, when the memory cell array MCA as shown in the second embodiment is used, since data is read by only a sense amplifier block SAB on one side, only a small amount of data can be outputted but the number of circuits to be operated can be reduced and reduction in power consumption can be realized.

FIG. 18B shows a configuration where each two lines of bit-lines BL0, BL1, BL2, . . . of the memory cell array MCA are alternately drawn to left and right sense amplifier blocks SAB. In this configuration, any of the memory cell arrays MCA shown in the first and second embodiments can be used. Further, by drawing each two lines of the bit-lines from the memory cell array MCA to the sense amplifier blocks SAB, it becomes easy to use a phase shift lithography when forming a wiring pattern. In this case, since an optical phase on a mask for patterning the bit lines BL to be drawn becomes an opposite phase, such an advantage can be obtained that the breakage and short-circuit at drawn portions can be prevented even in a fine wiring pitch.

FIG. 18C shows a configuration where all bit-lines BL0, BL1, BL2, . . . are connected to a sense amplifier block disposed on one end of the memory cell array MCA. In this configuration, since a layout pitch of the sense amplifier SA becomes equal to a pitch of the bit-line when a sense amplifier AS is disposed for each bit-line, it is desirable to apply this configuration to a layout of a memory cell array MCA where a wiring pitch of the bit-line is relatively wide. Also, it is desirable to apply this configuration to a system where a plurality of bit-lines BL are allocated to one sense amplifier SA via selecting means in a sense amplifier block SAB to reduce the number of sense amplifiers SA, thereby reducing a layout pitch of the sense amplifier SA.

Figure 19:
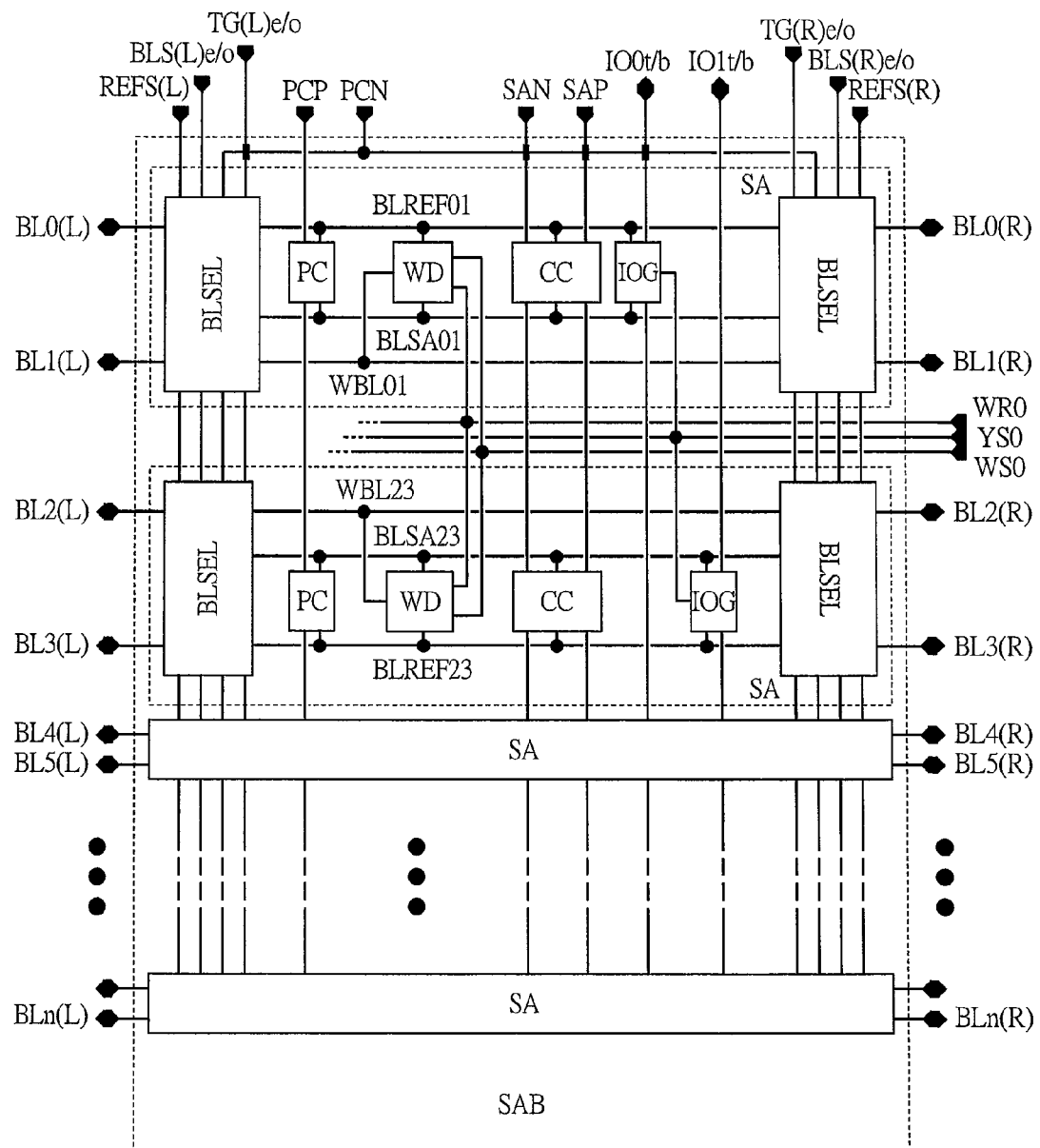
FIG. 19 is a circuit block diagram showing one example of a configuration of the sense-amplifier block in the phase change memory shown in FIG. 16.

Next, a configuration example of the sense amplifier block SAB will be described. FIG. 19 is a circuit block diagram showing one example of a configuration of a sense amplifier block in the phase change memory shown in FIG. 16. Similar to the sense amplifier block SAB in the configuration in FIG. 16, the sense amplifier block SAB shown in FIG. 19 is sandwiched between the memory cell arrays MCA and is shared by the memory cell arrays on both sides. With such a configuration, the number of sense amplifier blocks SAB can be reduced to about half and the reduction of a chip area can be realized.

Also, in this configuration, the sense amplifiers SA are disposed to each two bit-lines BL drawn from the memory cell array MCA disposed on one side of the sense amplifier block SAB. In this case, it is possible to simultaneously read half of the bit-lines drawn from the memory call array MCA to the sense amplifier block SAB on one side.

Such a sense amplifier block SAB is composed of a plurality of sense amplifiers SA. Each sense amplifier SA has bit-line selector circuits BLSEL, a precharge circuit PC, a write driver WD, a cross-coupling amplifier CC, an input/output circuit IOG, and others. The bit-line selector circuits BLSEL are respectively disposed on left and right sides in one sense amplifier SA so that the sense amplifier SA is shared by left and right memory cell arrays MCA. The write driver WD, the cross-coupling amplifier CC, the input/output circuit IOC, the precharge circuit PC, and others are disposed between the two bit-line selector circuits BLSEL. Respective circuit blocks have the configurations as shown in FIG. 20 and FIG. 21.

Figure 20A:
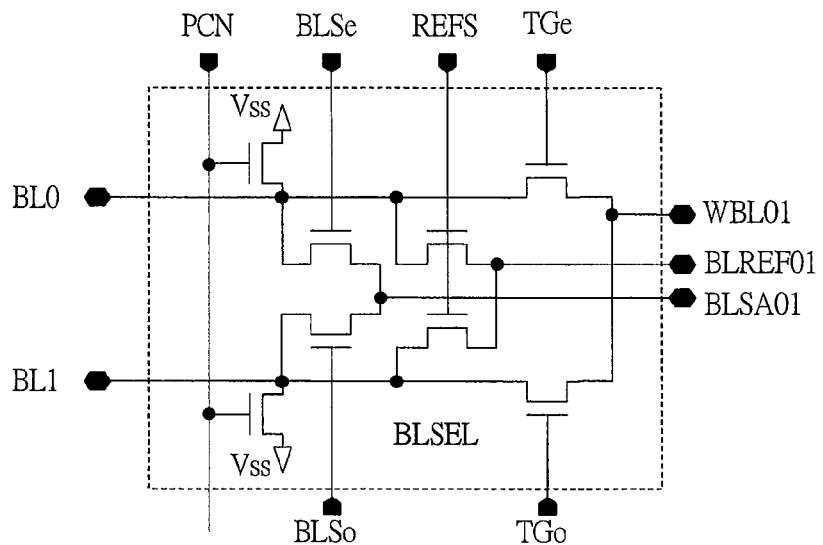
FIG. 20A is a circuit diagram showing one example of a detailed configuration of a bit-line selector circuit in the sense-amplifier block shown in FIG. 19.
Figure 20B:
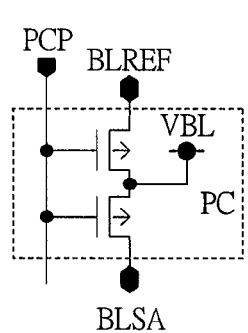
FIG. 20B is a circuit diagram showing one example of a detailed configuration of a precharge circuit in the sense-amplifier block shown in FIG. 19.
Figure 20C:
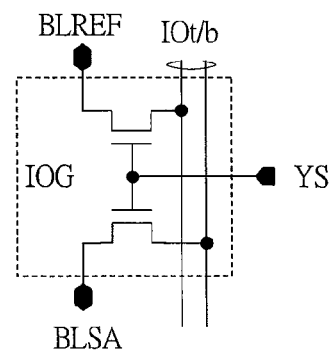
FIG. 20C is a circuit diagram showing one example of a detailed configuration of an input/output circuit in the sense-amplifier block shown in FIG. 19.
Figure 20D:
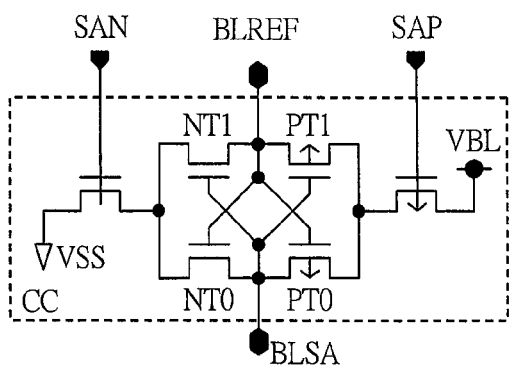
FIG. 20D is a circuit diagram showing one example of a detailed configuration of a cross-coupling amplifier in the sense-amplifier block shown in FIG. 19.

FIG. 20A to FIG. 20D are circuit diagrams showing examples of specific configuration of the respective circuit blocks in the sense amplifier shown in FIG. 19. More specifically, FIG. 20A shows a configuration example of the bit-line selector circuit, FIG. 20B shows a configuration example of the precharge circuit, FIG. 20C shows a configuration example of the input/output circuit, and FIG. 20D shows a configuration example of the cross-coupling amplifier. FIG. 21A to FIG. 21D are circuit diagrams showing examples of specific configurations of a write driver in the sense amplifier block shown in FIG. 19, and FIG. 21A to FIG. 21D show different configuration examples, respectively.

The bit-line selector circuit BLSEL shown in FIG. 20A is a circuit block which selects one bit-line from two bit-lines BL to connect the same to the write driver WD, the cross-coupling amplifier CC and the input/output circuit IOG.

In FIG. 20A, a precharge signal PCN is a control signal for setting the bit-lines BL0 and BL1 of the memory cell array MCA to a predetermined voltage at the time of standby. In this configuration, the bit-lines are set to a ground potential VSS which is a potential equal to that of the source electrode SL of the memory cell MC. By this means, since no voltage is applied to the memory cell transistors and the phase change element PCR at the standby time, such an advantage can be obtained that the flow of the disturbance current can be prevented.

Bit-line select signals BLSe and BLSo (BLSe/o) are control signals for selecting a bit-line to be connected to a read bit-line BLSA in the sense amplifier SA form the bit-lines BL0 and BL1 drawn from the memory cell array MCA. In this configuration, the bit-line select signal BLSe/o is shared by respective sense amplifiers SA in the sense amplifier block SAB. That is, in this configuration, even-numbered or odd-numbered bit-lines BL can be selected from the bit-lines BL drawn from the memory cell array MCA to the sense amplifier block SAB.

Also, this configuration can be applied to a system where a precharge level at the time of read operation is outputted by charge share between a read bit-line BLSA in the sense amplifier SA and the bit-line BL or BL1 (a first bit-line) of the memory cell array MCA (a first memory cell array) on a read side (a select side). By this means, a switch for setting to a read level is not required and such an advantage can be obtained that a chip area can be reduced. The details will be described later with reference to FIG. 22.

A reference select signal REFS is a select signal for inputting and setting a desired reference level to a reference bit-line BLREF serving as a reference potential signal of the sense amplifier SA when access to the memory cell array MCA sharing the sense amplifier block SAB is performed. In this configuration, a bit-line BL of the memory cell array MCA (a second memory cell array) on a non-select side is utilized for setting to the reference level. More specifically, the reference level is set by performing charge share between the reference bit-line BLREF in the sense amplifier SA and two bit-lines BL (a second bit-line and a third bit-line) in the memory cell array MCA on the non-select side. By this means, an intermediate level power source for reference is not required, and such an advantage can be obtained that the reference level can be set to about ½ of the bit-line precharge level at the time of read operation. The details thereof will be described later with reference to FIG. 22.

Transfer gate control signals TGe and TGo (TGe/o) are control signals for connecting a write bit-line WBL in the sense amplifier SA and a bit-line BL0 or BL1 on the memory cell MC side to each other. The transfer gate signals TGe and TGo operate in response to the bit-line select signals BLSe and BLSo, respectively. More specifically, the transfer gate control signals operate so that a write bit-line WBL (a fourth bit-line) is connected to the bit-line BL0 or BL1 (the first bit-line) utilized for the reading.

In this configuration, a transistor (a first switch) to which the transfer gate control signal TGe/o is connected is composed of only an NMOS transistor. Accordingly, in order to secure a sufficient current in the write operation, it is desirable to use voltage swing sufficiently larger than the write bit-line WBL swing voltage to the transfer gate control signal TGe/o. By this means, such an advantage can be obtained that, when the write bit-line WBL and the bit-line BL in the memory cell array MCA are connected to each other, influence of a threshold voltage of the transistor of the transfer gate can be eliminated. Also, when the control signal is composed of complementary signals and the transfer gate is composed of a CMOS transistor switch, such an advantage can be obtained that the same voltage as voltage swing of the write bit-line WBL can be utilized as the voltage swing of the control signal. Further, the configuration where the transfer gate is composed of a PMOS transistor is suitable for the high-potential transmission from the write bit-line WBL to the bit-lines BL0 and BL1 in the memory cell array MCA, and it becomes possible to acquire a large current at the time of write operation.

The precharge circuit PC shown in FIG. 20B is a circuit for precharging the read bit-line BLSA and the reference bit-line BLREF in the sense amplifier SA to a predetermined voltage at a standby time. In this configuration, the read bit-line BLSA and the reference bit-line BLREF are precharged to a bit-line swing voltage VBL at the standby time by two PMOS transistors controlled by bit-line precharge signals PCP. Also, a MOS transistor for short-circuiting the read bit-line BLSA and the reference bit-line BLREF to each other may be added. When such a configuration is adopted, such an advantage can be obtained that an area corresponding to the size of the short-circuiting MOS transistor can be reduced.

The input/output circuit IOG shown in FIG. 20C is a circuit for outputting data retained in respective bit-lines BLSA and BLREF in the sense amplifier SA to an input/output line IOt/b at the time of read operation and writing write data transmitted via the input/output line IOt/b to respective bit-lines BLSA and BLREF in the sense amplifier SA at the time of write operation. This configuration has two NMOS transistors which are disposed between the bit-line BL and the input/output line IOt/b and whose gates are controlled by column select signals YS. The column select signal YS is activated in both read and write operations to connect the read bit-line BLSA and the reference bit-line BLREF to the input/output line IOt/b, thereby controlling the input/output of data.

The cross-coupling amplifier CC shown in FIG. 20D is a sense amplifier of a conventional cross-coupling type and is a circuit for amplifying a fine signal between the read bit-line BLSA and the reference bit-line BLREF up to a bit-line swing voltage VBL through the positive feedback. The cross-coupling amplifier is activated by sense amplifier activation signals SAN and SAP.

Figure 21A:
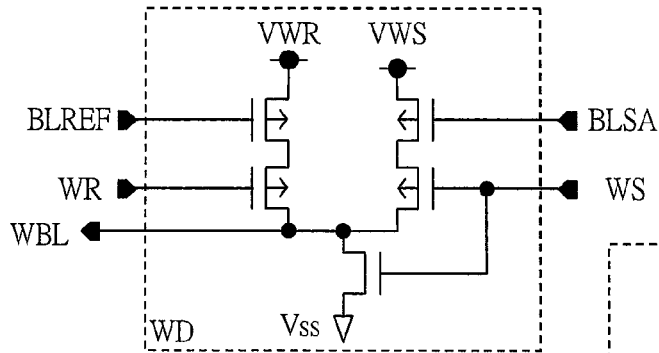
FIG. 21A is a circuit diagram showing one example of a detailed configuration of a write driver in the sense-amplifier block shown in FIG. 19.

The write driver WD shown in FIG. 21A is a circuit for driving the write bit-line WBL at a timing determined by a write enable signal WR or WS according to data retained by the read bit-line BLSA and the reference bit-line BLREF to supply a current to the phase change element PCR via the bit-line BL in the memory cell array MCA.

The configuration thereof includes a drive circuit for reset (a second write driver) provided between a power source terminal VWR generating a write voltage for reset and a write bit-line WBL (a fourth bit-line), a drive circuit for set (a first write driver) provided between a power source terminal VWS generating a write voltage for set and the write bit-line WBL, a switch circuit provided between the write bit-line WBL and the reference potential terminal (a ground potential) VSS, and others.

The drive circuit for reset includes two PMOS transistors connected in series by the power source terminal VWR, and the reference bit-line BLREF in the sense amplifier SA is connected to the gate of the PMOS transistor of the two transistors on the power source terminal VWR side and a write enable signal for reset WR is connected to the gate of the other PMOS transistor. Similarly, the drive circuit for set also includes, for example, two PMOS transistors connected in series, and the read bit-line BLSA in the sense amplifier SA is connected to the gate of the PMOS transistor on the power source terminal VWS side and a write enable signal for set WS is connected to the gate of the other PMOS transistor. The switch circuit is composed of, for example, an NMOS transistor, and a write enable signal for set WS is connected to the gate thereof.

The write enable signal WR determines a write time in a reset operation of the phase change element PCR. Similarly, the write enable signal WR determines a write time in a set operation of the phase change element PCR. Further, after the write operation, the write enable signal WS drives the switch circuit to set the write bit-line WBL to a voltage state (a ground potential VSS in FIG. 21) at a standby time.

In the set operation, a write voltage VWS is applied to the memory cell MC via the write bit-line WBL and the bit-line BL in the memory cell array MCA to supply a desired current. A phase state of the phase change element PCR can be changed by controlling a write current. Accordingly, since the write current into the memory cell MC can be controlled by controlling a drivability of the transistor in the drive circuit for set to which the write enable signal SW is inputted, the same power source can be used for the voltages VWS and VWR in the write driver WD.

Figure 21B:
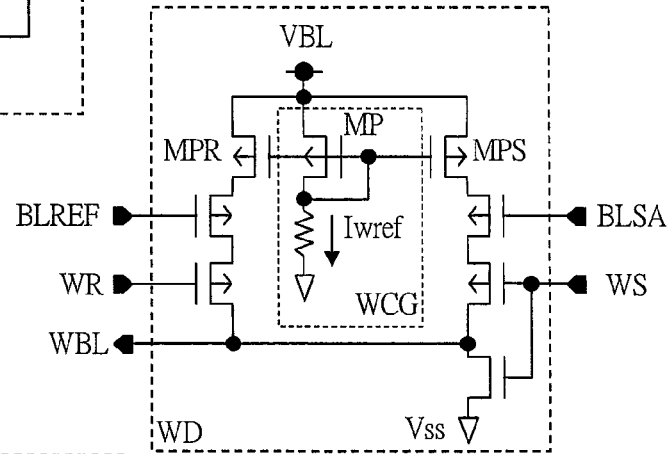
FIG. 21B is a circuit diagram showing another example of a detailed configuration of a write driver in the sense-amplifier block shown in FIG. 19.

The write driver WD shown in FIG. 21B is a write driver using a current mirror system. In this configuration, the power source terminal for reset VWR and the power source terminal for set VWS in the configuration shown in FIG. 21A are configured as a common power source terminal VBL, and PMOS transistors for current limitation MPR and MPS are respectively added to the drive circuit for reset and the drive circuit for set in the configuration shown in FIG. 21A. The PMOS transistor for current limitation MPR is connected in series to two PMOS transistors in the drive circuit for reset described above. Similarly, the PMOS transistor for current limitation MPS is connected in series to two PMOS transistors in the drive circuit for set described above.

The PMOS transistors for current limitation MPR and MPS form current mirror circuits between them and the PMOS transistor MP in a write current generating circuit WCG. A reference current Iwref of a write signal is supplied to the PMOS transistor MP in the write current generating circuit WCG. Since the PMOS transistor MP has the configuration in which through current flows as described above, it is desirable that the PMOS transistor is formed to have a small gate size. Note that one write current generating circuits WCG is disposed for each write driver WD or for each sense amplifier block SAB.

In order to supply a current required for reset, the PMOS transistor MPR has a gate size fixed times the PMOS transistor MP in the write current generating circuit WCG, for example, about 5 to 40 times. Similarly, in order to supply a current required for set, the PMOS transistor MPS has a gate size fixed times the PMOS transistor MP in the write current generating circuit WCG, for example, about 2 to 20 times which is smaller than the above-described PMOS transistor MPR. A relationship among the write enable signals WS and WR, the bit-lines BLSA, BLREF, and the write bit-line WBL is similar to that shown in FIG. 21B described above.

Figure 21C:
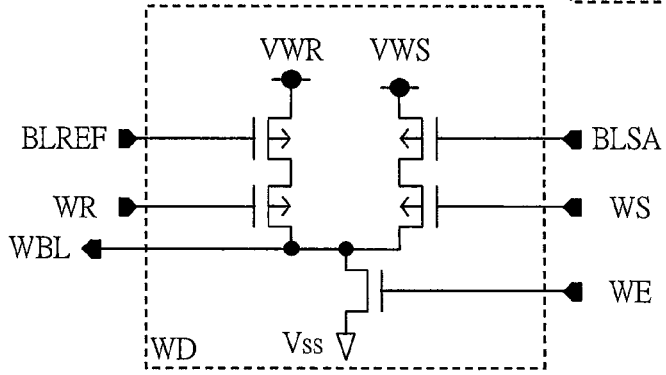
FIG. 21C is a circuit diagram showing still another example of a detailed configuration of a write driver in the sense-amplifier block shown in FIG. 19.

The write driver WD shown in FIG. 21C is a modified configuration example of FIG. 21A, in which the write enable signal WE is added besides the write enable signals WR and WS corresponding to reset and set. The write enable signal WE is connected to the gate of the NMOS transistor in the above-described switch circuit instead of the write enable signal for set WS in FIG. 21A.

The write enable signal WE can be wired in parallel to the column select signal YS or it can be wired in parallel to the word line WL. Especially, when the write enable signal WE is wired in parallel to the word line WL, simultaneous writing to many cells can be performed, which is suitable for a multi-bit write operation. On the other hand, when the write enable signal is wired in parallel to the column select signal YS, the wiring is suitable for a specific bit rewrite operation. Therefore, it is desirable that the wiring is applied to a random access memory. The remaining configuration is similar to that shown in FIG. 21A described above.

Figure 21D:
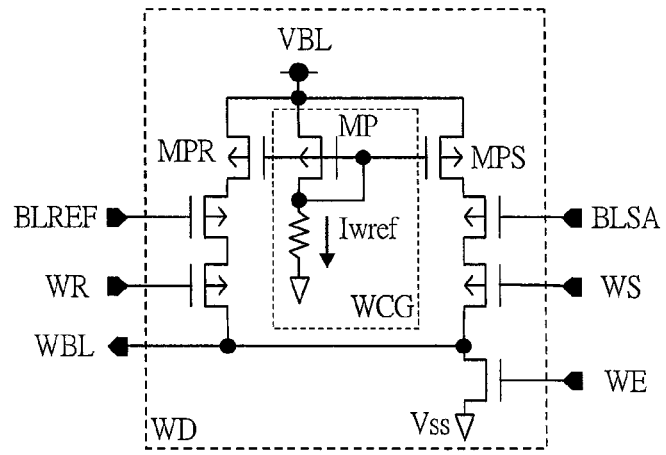
FIG. 21D is a circuit diagram showing still another example of a detailed configuration of a write driver in the sense-amplifier block shown in FIG. 19.

The write driver WD shown in FIG. 21D is a modified configuration example of FIG. 21B, and it has a feature that the write enable signal WE is used besides the write enable signals WR and WS corresponding to reset and set for performing a write operation like the case shown in FIG. 21C described above. The write enable signal WE is similar to that shown in FIG. 21C described above. The remaining configuration is similar to that shown in FIG. 21B.

In the foregoing, the respective circuit blocks in FIG. 19 have been described. However, these circuit systems are not limited to those shown in FIG. 20 and FIG. 21, of course, and any configurations having functions similar to those of the circuit systems can be adopted.

Figure 22:
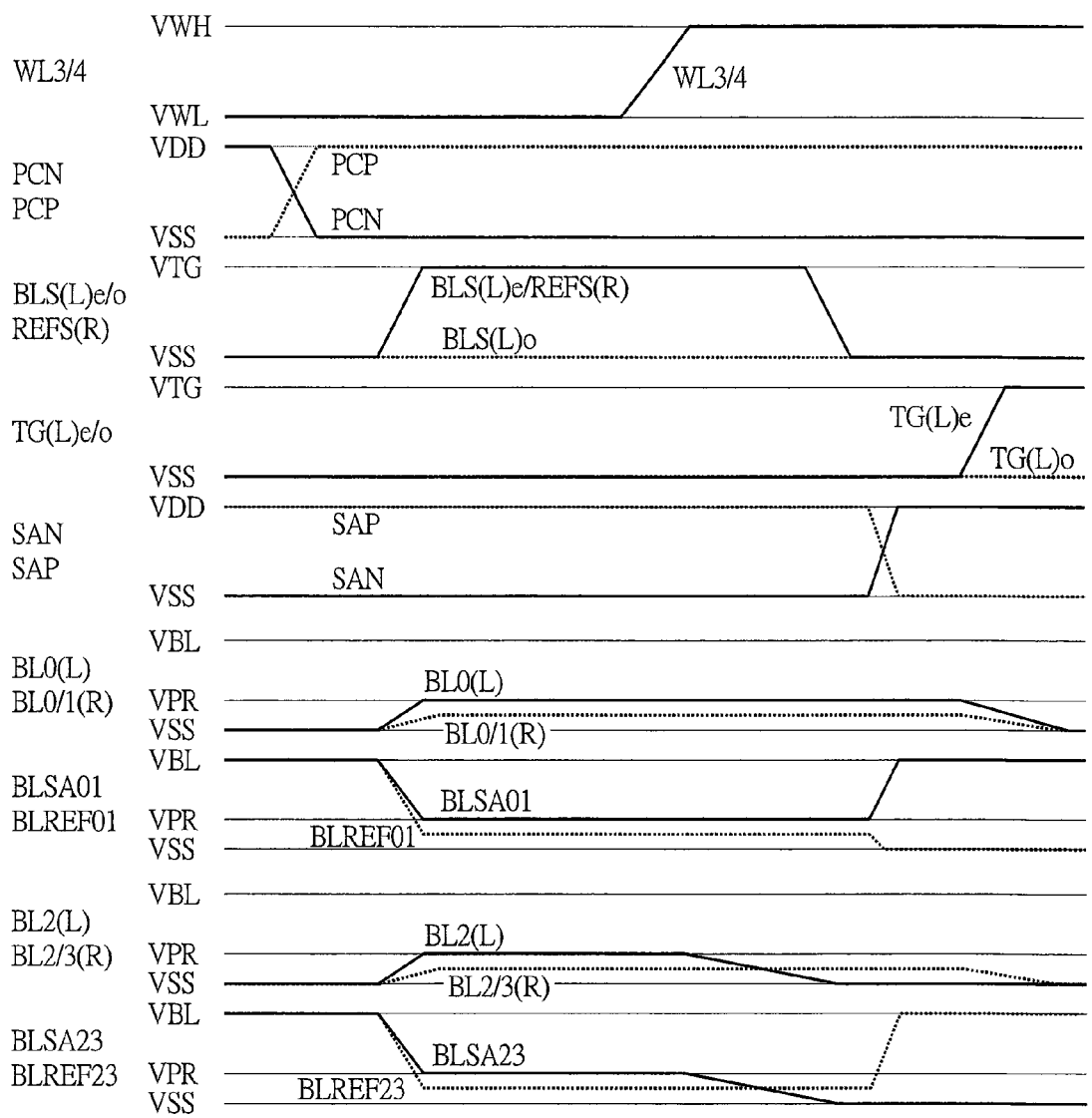
FIG. 22 is a waveform diagram showing one example of an operation when read is performed from a standby state using the sense amplifier block shown in FIG. 19 to FIG. 21

Next, a read operation when the sense amplifier block SAB shown in FIG. 19 to FIG. 21 is used will be described. FIG. 22 is a waveform diagram showing one example of an operation when reading is performed from a standby state by using the sense amplifier block shown in FIG. 19 to FIG. 21.

In FIG. 22, first, a precharge signal PCN which is performing a precharge operation transits from a high potential VDD state to a ground potential VSS, and a precharge signal PCP transits from the ground potential VSS to the high potential VDD so that they are put in non-active states. By this means, read bit-lines BLSA01, BLSA23, . . . and reference bit-lines BLREF01, BLREF23, . . . in the sense amplifier SA, and bit-lines BL0(L), BL0/1(R), BL2(L), BL2/3(R), . . . are put in floating states.

Here, as shown in FIG. 19, the bit-lines BL0(L) and BL2(L) represent bit-lines drawn from the memory cell array MCA disposed on the left side of the sense amplifier block SAB, and bit-lines BL0/1(R) and BL2/3(R) represent bit-lines drawn from the memory cell array MCA disposed on the right side of the sense amplifier block SAB.

The read bit-lines BLS01, BLSA23, . . . and the reference bit-lines BLREF01, BLREF23, . . . in the sense amplifier SA are precharged to a high potential such as the bit-line swing voltage VBL. On the contrary, the bit-lines BL0(L), BL2(L), BL0/1(R), and BL2/3(R) in the memory array are set to the ground potential VSS equal to that of the source electrode SL.

Thereafter, a bit-line select signal BLS(L)e transits from the ground potential VSS to the high potential VDD or a potential VTG for a transfer gate in the bit-line selector circuit BLSEL on the select memory cell array (a memory array performing read operation) MCA side in the sense amplifier block SAB, and it is put in an active state. By this means, an even-numbered bit-line BL, for example, the bit-line BL0(L) of the bit-lines BL drawn from the select memory cell array MCA to the sense amplifier block SAB is connected to the read bit-line BLSA01 in the sense amplifier SA. Thus, the bit-line BL0(1) and the read bit-line BLSA01 are set to a voltage VPR by charge share.

Simultaneously, both two bit-lines in the non-select memory cell array MCA, for example, BL0(R) and BL1(R) are connected to the reference bit-line, for example, BLREF01 according to activation of a REFS(R) signal in the bit-line selector circuit BLSEL on the non-select memory cell array side in the sense amplifier block SAB. Since a bit-line capacitance in the memory cell array MCA is larger than a bit-line capacitance in the sense amplifier SA, voltages of the reference bit-lines BLREF01, BLREF23, . . . can be set to about half of the voltage VPR of the bit-lines BLSA01, BLSA23, . . . in the sense amplifier SA through the operation described above.

After the bit-line BL in the select memory cell array MCA reaches a bit-line level VPR at the time of read operation, the word line WL transits from a standby time voltage VWL to an activation time voltage VWH to be activated according to an input address. In FIG. 22, two word lines WL3/4 are simultaneously driven. However, when a current required for read operation can be supplied by one memory cell transistor, only one word line can be activated.

Then, the bit-line BL and the phase change element PCR are connected to each other by the activation of the word line WL. In FIG. 22, operation waveforms when the phase change element PCR in the memory cell MC are in an amorphous state, namely, a high resistance state are shown in the bit-lines BL0(L) and BLSA01, and operation waveforms in a polycrystalline state, namely, a low resistance state are shown in the bit-lines BL0(L) and BLSA23. As shown in FIG. 22, the bit-line which has read the memory cell MC in the high resistance state hardly changes from the precharge voltage VPR. On the other hand, in the bit-line which has read the memory cell MC in the low resistance state, charges in the bit-line are discharged to the source electrode SL via the memory cell transistor, and the potential of the bit-line changes to the ground potential VSS which is a level of the source electrode SL.

After a predetermined time has elapsed from the activation of the word line WL, a signal is transmitted to the read bit-lines BLSA01 and BLSA23 in the sense amplifier SA, and the bit-line select signal BLSe then transits to the ground potential VSS to be put in a non-select state. Thereafter, the sense amplifier activation signals SAN and SAP respectively transit from the ground potential VSS and the high potential VDD to the high potential VDD and the ground potential VSS to be activated, and the sense amplifier SA operates so as to amplify a fine signal between the read bit-line BLSA and the reference bit-line BLREF in the sense amplifier SA up to the bit-line swing voltage VBL.

Simultaneously with the operation of the sense amplifier SA or after the operation thereof, the transfer gate signal TG(L)e transits from the ground potential VSS to the voltage for transfer gate VTG to be activated, and the write bit-line WBL in the sense amplifier SA and the bit-lines BL0(L), BL1(L), . . . in the select memory cell array MCA are connected. By this means, the bit-line which is reading a high resistance is also set to the potential VSS equal to that of the source electrode SL and application of a voltage to the phase change element PCR in the memory cell MC can be prevented. Accordingly, the disturbance is suppressed.

Preparation of the column access is completed according to the above-described operation. Thereafter, data retained in the sense amplifier SA is outputted to the outside via the input/output IOt/b according to the column select signal YS.

Figure 23:
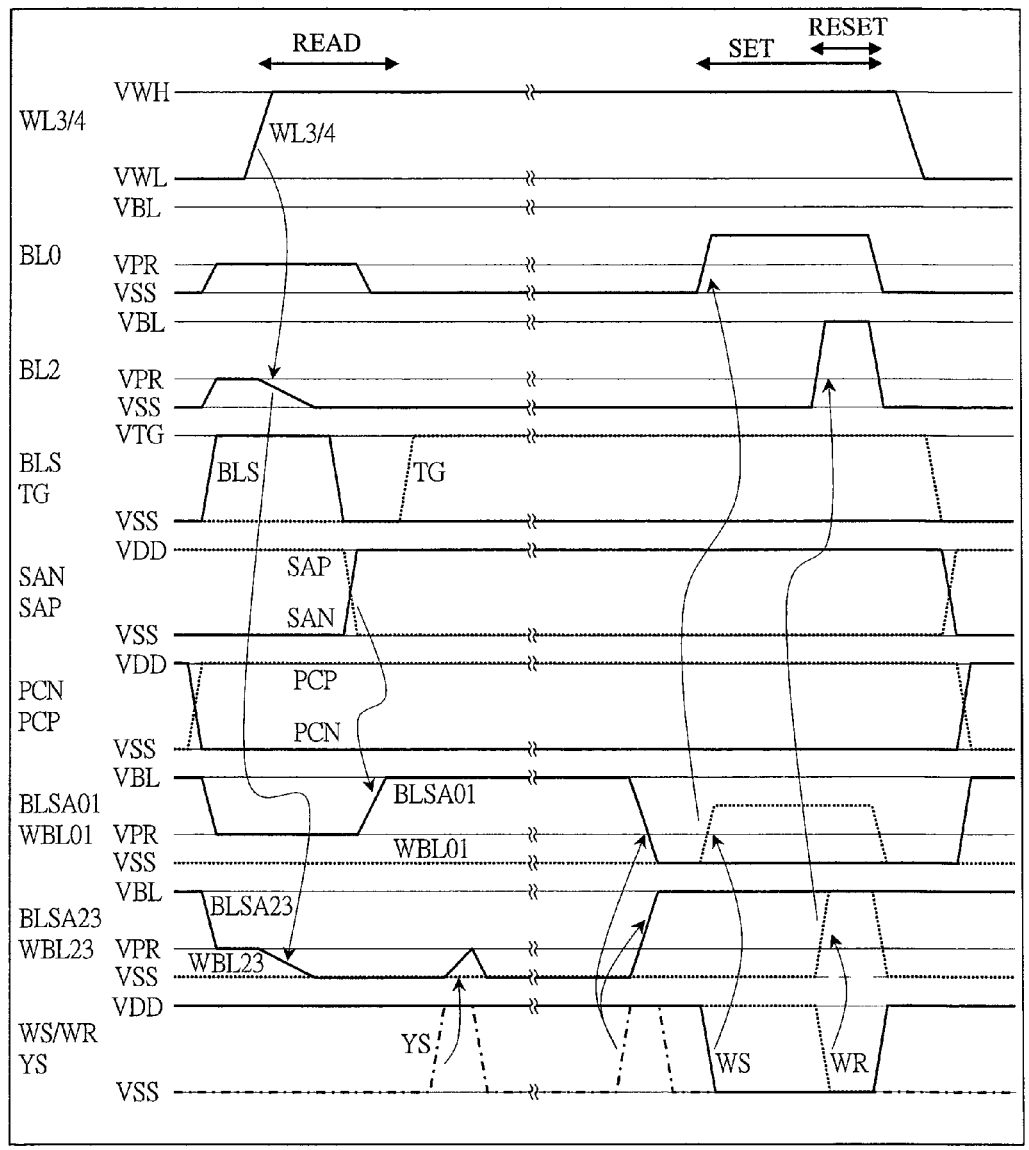
FIG. 23 is a waveform diagram showing one example of read and write operations of a memory array in the phase change memory shown in FIG. 16.

Next, a driving method of the memory array MA including such a read operation will be described. FIG. 23 is a waveform diagram showing one example of read and write operations of a memory array in the phase change memory shown in FIG. 16.

The feature of the operation shown in FIG. 23 lies in that two word lines WL are activated so as to utilize two memory cell transistors in the memory cell MC in both cases of the read operation and the write operation (set and reset operations). Also, a page mode operation and a write operation to a memory cell MC like a general-purpose DRAM (dynamic random access memory) are realized. Further, set and reset are performed simultaneously in order to speed up a column cycle.

When this operation system is applied, circuit configurations shown in FIG. 21A and FIG. 21B are suitable for the write driver WD in the sense amplifier block SAB. However, a circuit configuration such as shown in FIG. 21C or 21D can be also applied. In this case, it is necessary to add a write enable signal for column write WE. The write enable signal for column write WE is a signal which maintains an "L" state during the set/reset operation in FIG. 21C or 21D.

In FIG. 23, an operation from the step of reading data in the memory cell MC to the step of retaining the same in the sense amplifier SA is similar to that shown in FIG. 22 described above, and two word lines WL are put in an activated state so as to utilize two memory cell transistors in the memory cell MC in this read operation. In FIG. 23, for the bit line BL0(L), an operation is assumed where, after a high resistance state ('1') is read to output the data thereof to the outside, a column access operation on the same word line WL is performed according to a page access, and then rewriting to a low resistance state ('0') is performed according to write data from the outside. On the contrary, for the bit-line BL2(L), an operation is assumed where read data is '0' and rewriting to '1' is performed thereafter through the reverse writing.

First, after data is read to the sense amplifier SA, the transfer gate signal TG is activated. Thereafter, for example, when read operation is to be performed, the column select signal YS is activated in order to output data to the outside, and then, the data is outputted.

Next, the case where write operation is performed in a column access operation will be described.

In the write operation, simultaneously with the activation of the column select signal YS, write data is written in a sense amplifier SA selected according to a column select signal YS via the input/output lines IO0t/b and IO1t/b and is retained in the cross-coupling amplifier CC. When the column select signal is brought in a non-select state, a write enable signal for set write WS wired in parallel to the column select signal YS transits from the high potential state VDD to the ground potential VSS to be activated. In this manner, the set operation is started.

In this figure, a memory cell MC on the bit-line BL0(L) performs a set operation. In the write driver WD in the sense amplifier SA, as shown in FIG. 21A and the like, the write enable signal for set WS is put in an activated state ('L') when the bit-line BLSA01 in the sense amplifier is in the 'L' state. By this means, a desired voltage VWS is applied to the bit-line BL0(L) via the write bit-line WBL01 and a current required for set operation is supplied to the phase change element PCR in the memory cell MC. A write current is supplied for a period required for the set, for example, about 15 ns when a high-speed operation is performed or about 1 μs when a reliable write operation is performed.

Subsequent to the set operation, the write enable signal for reset write WR wired in parallel to the column select signal YS transits from the high potential state VDD to the ground potential VSS to be activated. In this manner, the reset operation is started.

In FIG. 23, a reset operation is performed to the memory cell MC on the bit-line BL2. In the write driver WD in the sense amplifier SA, when the reference bit-line BLREF23 in the sense amplifier SA is in an 'L' state and the write enable signal for reset WR becomes a selected state ('L'), a desired voltage VWR is applied to the bit-line BL2(L) via the write bit-line WBL23 and a current required for reset operation is supplied to the phase change element PCR of the memory cell MC. The write current is supplied for a period required for the reset, for example, for about 5 ns to 50 μs.

As a result, the phase change element PCR generates heat and is then melted. Thereafter, the respective write enable signals transit to high potential states VDD and are put into a non-selected state, thereby terminating the write operation. Then, the write current is stopped and the phase change element PCR is cooled and its phase state is changed.

Next, a precharge operation will be described.

After a fixed time has elapsed from the input of a precharge command or the input of a read/write command, the word line WL first transits from a voltage VWH of the select state to a voltage VWL of the non-select state to be put into a non-select state. Thereafter, the transfer gate signal TG transits from the activation voltage VTG to the ground potential VSS to be put into a non-select state, and the bit-line BL in the memory cell array MCA and the write bit-line WBL in the sense amplifier SA are separated from each other.

Thereafter, the sense amplifier SA becomes a non-select state by sense amplifier activation signals SAN and SAP. Subsequently, the bit-lines BL0(L/R), BL1(L/R), . . . in the memory cell array MCA and the read bit-lines BLSA01, BLSA23, . . . and the reference bit-lines BLREF01, BLREF23, . . . in the sense amplifier are respectively precharged by precharge signals PCN/PCP to the ground potential VSS and the bit-line swing voltage VBL which are the desired precharge levels.

As described above, the operation shown in FIG. 23 has an advantage that, since two word lines are used in both the read operation and the write operation, large read/write current drivability can be realized. Since the system of utilizing two word lines in the write operation can realize a continuous write operation in a continuous column operation, it is suitable for page mode, but it may also be applied to a non-page mode operation.

Note that the respective operation voltages shown in the above-described operation desirably have the following values. That is, it is desirable that the word line select voltage VWH is 1.8V, the bit-line swing voltage is 1.2V, the word line non-select voltage VWL is 0V, the ground potential VSS is 0V, the transfer gate voltage VTG is 1.5 to 1.8V, the set write voltage VWS is 1.0V, and the reset write voltage is about 1.2V.

Figure 24:
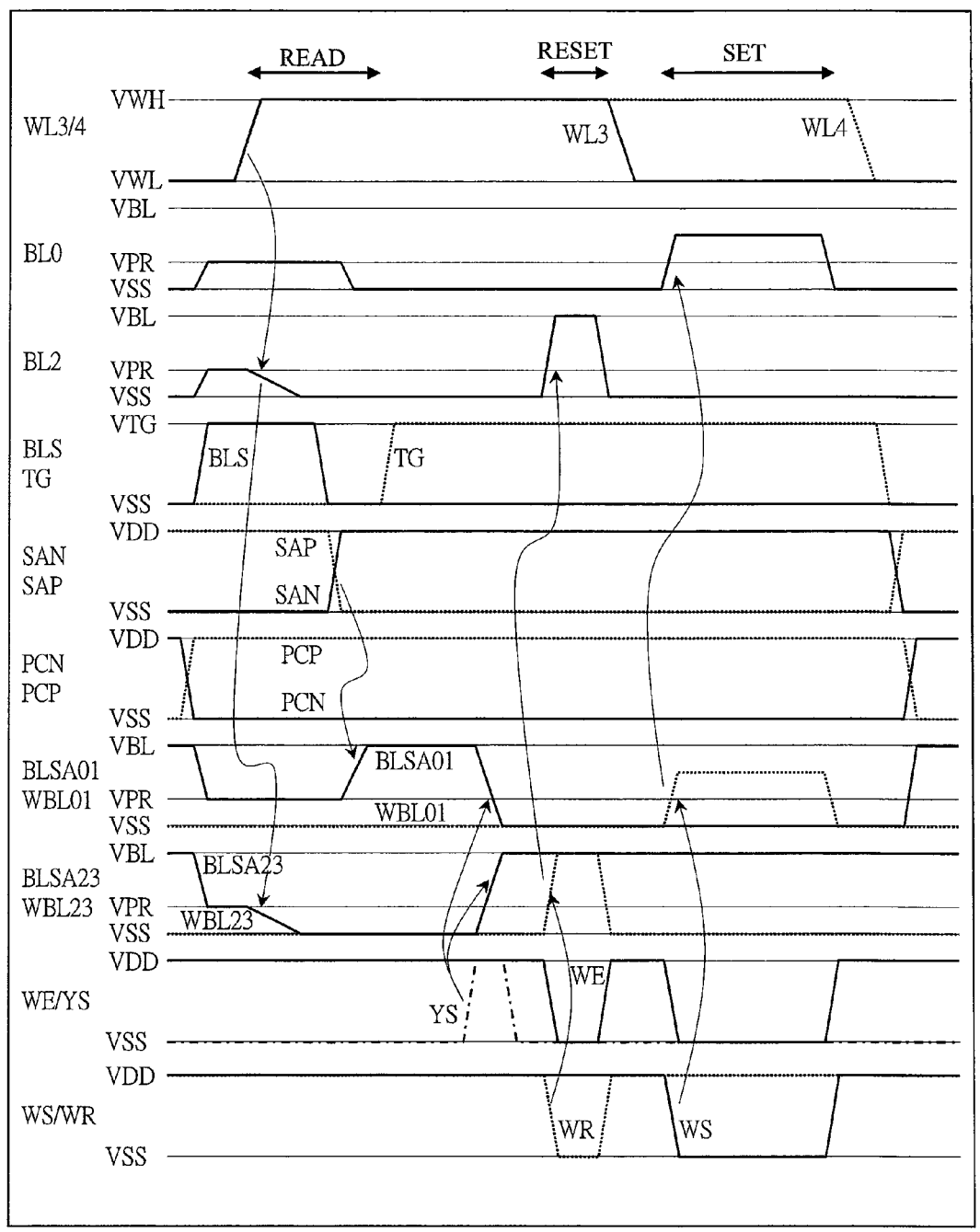
FIG. 24 is a waveform diagram showing another example of read and write operations of a memory array in the phase change memory shown in FIG. 16.

FIG. 24 is a waveform diagram showing another example of read and write operations of a memory array in the phase change memory shown in FIG. 16. The feature of the operation shown in FIG. 24 lies in that two memory cell transistors in the memory cell MC are used in a read and reset (first data) write operation, but only one memory cell transistor in the memory cell is utilized in a set (second data) operation. When this operation system is applied, different from the case shown in FIG. 23, set and reset are individually performed. Therefore, the circuit configurations shown in FIG. 21C and FIG. 21D are desirable as a circuit configuration of the write driver WD in the sense amplifier block SAB.

In FIG. 24, an operation from the step of a command input and performing a read operation using two word lines WL3 and WL4 to the step of amplifying the read data in the sense amplifier SA is similar to that described above. Though not shown in FIG. 24, when data is outputted thereafter to the outside according to a column select signal YS, the output is performed as shown in FIG. 23 described above. A write operation will be described below.

When the column select signal YS is activated, data transmitted from the outside via the input/output lines IO0*t/b* and IO1*t*/B is written to the cross-coupling amplifier CC in the write-selected sense amplifier SA. When the column select signal YS is brought into a non-select state, the write enable signal for reset write WR and the write enable signal WE are activated ('L' state). By this means, a current required for reset is supplied to the memory cell MC via the write bit-line WBL23 and the bit-line BL2(L). After the activation for a predetermined period, the write enable signals WR and WE are brought into a non-select state.

Thereafter, one (here, word line WL3) of two word lines WL3 and WL4 is brought into a non-select state. Then, the write enable signal for set write WS and the write enable signal WE are brought into an activated state, and a current required for set is supplied to the write select memory cell MC via the write bit-line WBL01 and the bit-line BL0(L). After the activation for a predetermined period, the write enable signals WS and WE are brought into a non-select state. When the write operation is completed, the precharge operation is performed as shown in FIG. 23 described above.

In this system, since the two memory cell transistors are used in read/reset write operation, a current drivability can be secured. Also, since the number of memory cell transistors to be used is limited to one in a set write operation, a write current is restricted and the occurrence of re-resetting due to abnormal overheating after the set can be suppressed, and therefore, a stable set operation can be realized.

Figure 25:
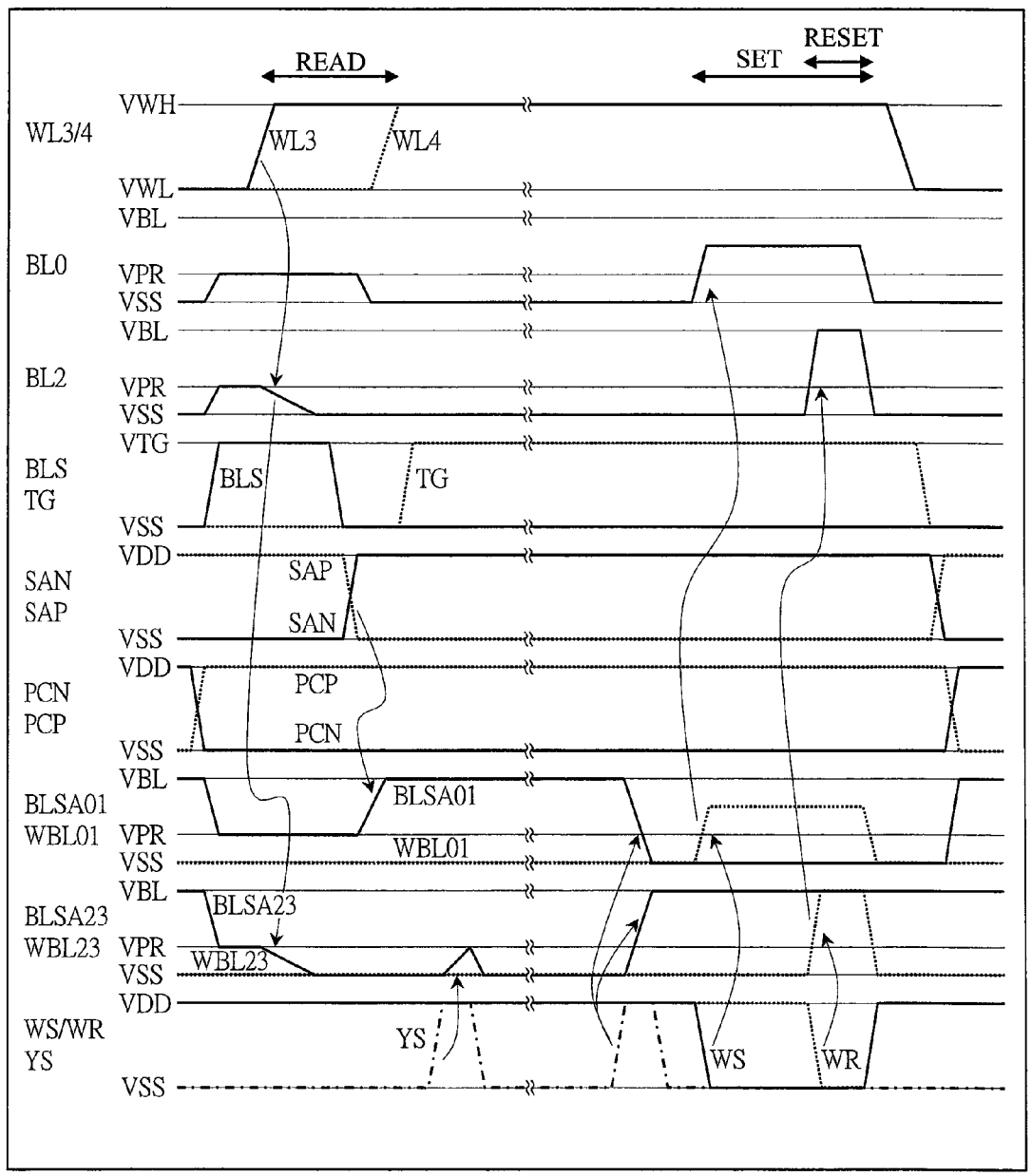
FIG. 25 is a waveform diagram showing still another example of read and write operations of a memory array in the phase change memory shown in FIG. 16.

FIG. 25 is a waveform diagram showing still another example of read and write operations of a memory array in the phase change memory shown in FIG. 16. The feature of the operation shown in FIG. 25 lies in that only one memory cell transistor in a memory cell MC is used in a read operation but two memory cell transistors in the memory cell MC are used in a write operation (set/reset operation). That is, this operation system has a feature that the number of word lines activated in the read operation is limited to one in comparison to the case shown in FIG. 23 described above.

Since the set and the reset are simultaneously performed, the configurations shown in FIG. 21A and FIG. 21B are desirable as a circuit configuration for the write driver WD in the sense amplifier block SAB. However, the circuit configurations of FIGS. 21 C and D can also be applied. In this case, it is necessary to add a write enable signal WE. Also, the write enable signal WE is a signal for maintaining an 'L' state during the set/reset operation.

In FIG. 25, operation system from the step of a command input to the step of activation of the word line is similar to the respective systems described above. Subsequently, different from the above-described system, only one of two word lines (here, the word lines WL3 and WL4) to which the memory cell MC is connected is activated when a word line corresponding to an address is activated. In the figure, only the word line WL3 is activated. Thereafter, when the sense amplifier SA amplifies data, the word line WL4 paired with the word line WL3 is activated to perform a column operation. The remaining operation is similar to that shown in FIG. 23.

This system has an advantage that, since the number of word lines in the read operation is limited to one, a current drivability in the read operation is restricted and the breakage of memory cell data due to read operation can be suppressed. Since two word lines are utilized in the write operation in this system like the system shown in FIG. 23, a continuous write operation in a continuous column operation can be realized and the system is suitable for a page mode, but the system can also be applied to a non-page mode operation.

Figure 26:
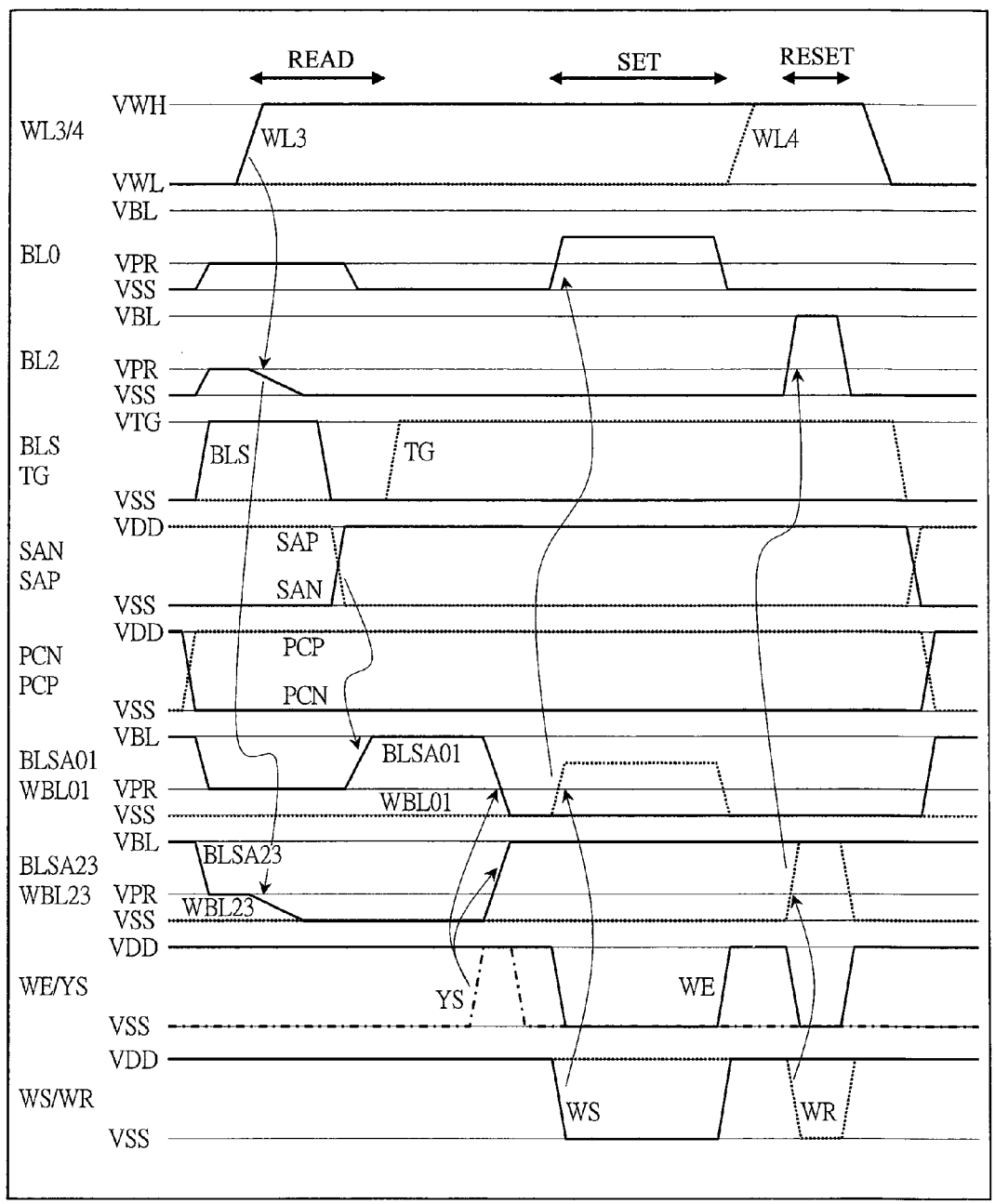
FIG. 26 is a waveform diagram showing still another example of read and write operations of a memory array in the phase change memory shown in FIG. 16.

FIG. 26 is a waveform diagram showing still another example of read and write operations of a memory array in the phase change memory shown in FIG. 16. The feature of the operation shown in FIG. 26 lies in that only one memory cell transistor in the memory cell MC is used in the read and set operation and two memory cell transistors in the memory cell are used to perform writing in the reset operation.

Since the number of word lines to be activated differs in the set and reset operations like the system shown in FIG. 24 described above, it is desirable to apply this operation system to a non-page mode. The circuit configurations shown in FIG. 21C and FIG. 21D are desirable as the circuit configuration for the write driver WD in the sense amplifier block SAB.

In FIG. 26, an operation from the step of a command input and an activation of the word line WL3 to the step of amplifying the read data in the sense amplifier SA is similar to the operation shown in FIG. 25 described above. Thereafter, though not shown in FIG. 26, it is also possible to output the data to the outside according to the column select signal YS. The write operation will be described below.

When the column select signal YS is activated, data transmitted from the outside via the input/output lines IO0*t/b* and IO1*t*/B is written to the cross-coupling amplifier CC in the write-selected sense amplifier SA. When the column select signal YS is brought into a non-select state, the write enable signal for set write WS and the write enable signal WE are activated ('L' state). By this means, a current required for the set is supplied to the memory cell MS via the write bit-line WBL01 and the bit-line BL0(L). After the activation for a predetermined period, the write enable signals WS and WE are brought into a non-select state.

Subsequently, the word line WL4 paired with the word line WL3 is brought into a select state. Thereafter, the write enable signal for reset write WR and the write enable signal WE are brought into an activated state, and a current required for the reset is supplied to the write select memory cell MC via the write bit-line WBL23 and the bit-line BL2(L). After the activation for a predetermined period, the write enable signals WR and WE are brought into a non-select state.

When the write operation is completed, a precharge operation is performed like the case shown in FIG. 23 described above. In this system, since only one memory cell transistor is used in the read and set write operations, a current drivability is restricted and the breakage in the read operation and re-resetting due to abnormal overheating in the set operation can be prevented. Also, since two memory cell transistors are used in the reset write operation, a current drivability is secured and stable reset operation can be realized.

Figure 27:
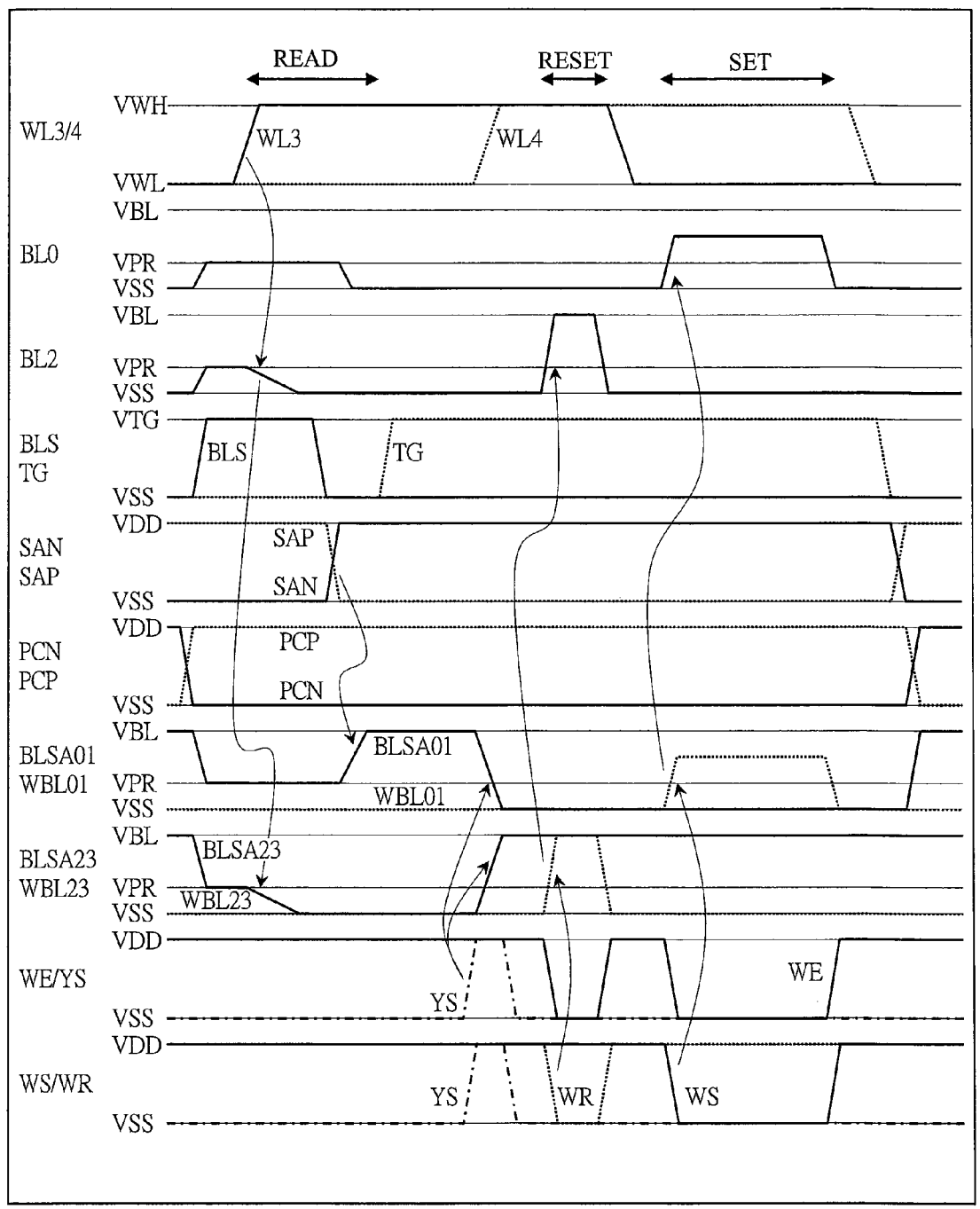
FIG. 27 is a waveform diagram showing still another example of read and write operations of a memory array in the phase change memory shown in FIG. 16.

FIG. 27 is a waveform diagram showing still another example of read and write operations of a memory array in the phase change memory shown in FIG. 16. Similar to the operation in FIG. 26, in the operation shown in FIG. 27, only one memory cell transistor in the memory cell MC is used in the read and set operations, and two memory cell transistors in the memory cell are used to perform writing in the reset operation.

However, the same word line is activated and the same memory cell transistor is used in the read and set operations in FIG. 26, but this operation has a feature that a memory cell transistor for read operation and a memory cell transistor for set operation are separately provided. Note that, similar to the case shown in FIG. 26, the circuit configurations shown in FIG. 21C and FIG. 21D are desirable as the circuit configuration for the write driver WD in the sense amplifier block SAB.

In FIG. 27, an operation from the step of a command input and activation of one word line to the step of retaining the data in the sense amplifier SA is similar to that shown in FIG. 26 described above. Here, data can be outputted to the outside using the column select signal YS as read operation, as shown in FIG. 23 and the like. The write operation will be described below.

In the write operation, when the column select signal YS is activated, data transmitted from the outside via the input/output lines IO0$t$/b and IO1$t$/B is written to the cross-coupling amplifier CC in the write-selected sense amplifier SA. Almost simultaneously with this, the word line WL4 paired with the word line WL3 that is put in an activated state is activated. An operation subsequent thereto is similar to the write operation shown in FIG. 24.

In this system, by performing switching of transistors to be used between the read operation and the set operation, such an advantage can be obtained that it is possible to use memory cell transistors optimal for respective operations, and stable read operation and write operation can be realized in addition to the advantage shown in FIG. 26 described above.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, it is desirable to apply the present invention to a semiconductor device fabricated through the processing technology of 130 nm or less where rewrite current of a phase change element can be reduced. Also, even in a larger process generation, similar effect can be obtained by reducing a contact area to a phase change element. Further, it is needless to say that the present invention can be applied to a generation where miniaturization has been further progressed. Furthermore, the present invention can be applied to a signal memory chip or a logic embedded memory.

Also, the low resistance state of the polycrystalline state is defined as '0' state and the high resistance state of the amorphous state is defined as '1' in the present invention, but the high resistance state of the amorphous state can be defined as '0' and the low resistance state of the polycrystalline state can be defined as '1'.

As described above, effects obtained by representative ones of the inventions disclosed in this application will be described as follows:

By using a memory cell where respective one ends of two memory cell transistors are mutually connected to one end of a memory element, it becomes possible to increase the drivability of the memory cell transistors to one memory element.

Also, by sharing the other ends of two memory cell transistors by adjacent memory cells, it becomes possible to realize an area reduction in addition to improvement of the drivability of the memory cell transistors.

Also, when read operation and write operation to a memory element are performed, both two memory cell transistors or either one memory cell transistor can be driven according to the contents of the operations. Therefore, stable read operation and write operation can be realized.

INDUSTRIAL APPLICABILITY

The present invention provides a technology effectively applied to a semiconductor device having a high density integrated memory circuit, a logic embedded memory including a memory circuit and a logic circuit formed on the same semiconductor substrate, and an analog circuit which are formed of a phase change material.

What is claimed is:
1. A semiconductor device comprising:
a memory cell array comprising a first memory cell;
a first word line connected to the first memory cell;
a second word line connected to the first memory cell and arranged adjacent to the first word line;
a first word driver block; and
a second word driver block,
wherein the first word line is connected to the first word driver block, and
wherein the second word line is connected to the second word driver block.
2. A semiconductor device according to claim 1, wherein the second word driver is arranged in the opposite side of the first word driver from the memory cell array.
3. A semiconductor device according to claim 1, further comprising:
a bit line,
wherein the first memory cell comprises a first memory element which retains data based on electric resistance, a first transistor and a second transistor,
wherein a first node of the first transistor is connected to the first memory element,
wherein a gate of the first transistor is connected to the first word line,
wherein a first node of the second transistor is connected to the first memory element,
wherein a gate of the second transistor is connected to the first word line, and wherein a second node of the first transistor and a second node of the second transistor are independently connected to the bit line, respectively.

4. A semiconductor device comprising:
a memory cell array comprising a first memory cell;
a first word line connected to the first memory cell;
a second word line connected to the first memory cell and arranged adjacent to the first word line; and
a first word driver block,
wherein the first word line and the second word line are independently connected to the first word driver block, respectively.

5. A semiconductor device according to claim 4, further comprising:
a bit line,
wherein the first memory cell comprises a first memory element which retains data based on electric resistance, a first transistor and a second transistor,
wherein a first node of the first transistor is connected to the first memory element,
wherein a gate of the first transistor is connected to the first word line,
wherein a first node of the second transistor is connected to the first memory element,
wherein a gate of the second transistor is connected to the first word line, and
wherein a second node of the first transistor and a second node of the second transistor are independently connected to the bit line, respectively.

6. A semiconductor device according to claim 4, further comprising:
a third word line;
a fourth word line; and
a second word driver block arranged in the opposite side of the first word driver from the memory cell array,
wherein the memory cell array further comprises a second memory cell arranged adjacent to the first memory cell,
wherein the third word line is connected to the second memory cell,
wherein the fourth word line is connected to the second memory cell, and
wherein the third word line and the fourth word line are independently connected to the second word driver block, respectively.

* * * * *